(12) United States Patent
Shimada

(10) Patent No.: US 7,291,443 B2
(45) Date of Patent: Nov. 6, 2007

(54) POLYMERIZABLE COMPOSITION AND IMAGE-RECORDING MATERIAL USING THE SAME

(75) Inventor: Kazuto Shimada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/900,168

(22) Filed: Jul. 28, 2004

(65) Prior Publication Data

US 2005/0026082 A1 Feb. 3, 2005

(30) Foreign Application Priority Data

Jul. 29, 2003 (JP) .......................... P. 2003-202961
Nov. 5, 2003 (JP) .......................... P. 2003-375262

(51) Int. Cl.
*G03C 1/73* (2006.01)
*G03F 7/029* (2006.01)
*G03F 7/033* (2006.01)
*G03F 7/20* (2006.01)
*G03F 7/30* (2006.01)

(52) U.S. Cl. .................. 430/281.1; 430/944; 430/921; 430/271.1; 430/302; 430/306; 430/325; 430/906; 430/910

(58) Field of Classification Search ............. 430/281.1, 430/944, 916, 905, 906, 910, 271.1
See application file for complete search history.

(56) References Cited

U.S. PATENT DOCUMENTS

| | | | |
|---|---|---|---|
| 3,725,356 A | 4/1973 | Lüders et al. | |
| 3,804,631 A | 4/1974 | Faust | |
| 3,839,171 A | 10/1974 | Akamatsu et al. | |
| 3,930,865 A | 1/1976 | Faust et al. | |
| 4,019,972 A | 4/1977 | Faust | |
| 4,239,849 A | 12/1980 | Lipson et al. | |
| 4,476,215 A | 10/1984 | Kausch | |
| 4,499,163 A | 2/1985 | Ishimaru et al. | |
| 4,510,227 A | 4/1985 | Mohr et al. | |
| 4,537,855 A | 8/1985 | Ide | |
| 4,687,727 A | 8/1987 | Toyama et al. | |
| 4,772,538 A | 9/1988 | Walls et al. | |
| 4,950,581 A | 8/1990 | Koike et al. | |
| 4,952,478 A | 8/1990 | Miyagawa et al. | |
| 5,080,999 A | 1/1992 | Imai et al. | |
| 5,200,292 A | 4/1993 | Shinozaki et al. | |
| 5,246,816 A | 9/1993 | Yamashita et al. | |
| 5,340,699 A | 8/1994 | Haley et al. | |
| 5,641,608 A | 6/1997 | Grunwald et al. | |
| 5,705,322 A | 1/1998 | West et al. | |
| 5,879,861 A | 3/1999 | Van Damme et al. | |
| 5,919,601 A | 7/1999 | Nguyen et al. | |
| 5,952,154 A | 9/1999 | Barr et al. | |
| 5,965,319 A | 10/1999 | Kobayashi | |
| 6,013,412 A | 1/2000 | Aoshima | |
| 6,030,750 A | 2/2000 | Vermeersch et al. | |
| 6,165,685 A | 12/2000 | Maerz et al. | |
| 6,309,792 B1 | 10/2001 | Hauck et al. | |
| 6,399,689 B1 | 6/2002 | Scarlette | |
| 6,423,462 B1 | 7/2002 | Kunita | |
| 6,482,571 B1 | 11/2002 | Teng | |
| 6,566,035 B1 | 5/2003 | Aoshima | |
| 6,576,401 B2 | 6/2003 | Teng | |
| 6,692,896 B2 | 2/2004 | Shimada et al. | |
| 6,716,566 B2 | 4/2004 | Aoshima | |
| 6,733,948 B2 | 5/2004 | Nakamura et al. | |
| 6,794,116 B2 | 9/2004 | Oshima | |
| 6,800,417 B2 | 10/2004 | Kikuchi | |
| 6,838,222 B2 | 1/2005 | Aoshima et al. | |
| 6,858,374 B2 | 2/2005 | Yanaka | |
| 6,861,200 B2 | 3/2005 | Oshima | |
| 6,884,568 B2 | 4/2005 | Timpe et al. | |
| 6,916,595 B2 | 7/2005 | Fujimaki et al. | |
| 2001/0036598 A1* | 11/2001 | Shimada et al. | 430/281.1 |
| 2002/0025489 A1* | 2/2002 | Shimada et al. | 430/270.1 |
| 2002/0051934 A1 | 5/2002 | Nakamura et al. | |
| 2002/0055058 A1 | 5/2002 | Sorori et al. | |
| 2002/0136987 A1 | 9/2002 | Oshima | |
| 2002/0160295 A1 | 10/2002 | Aoshima et al. | |
| 2002/0177074 A1* | 11/2002 | Hoshi et al. | 430/281.1 |
| 2002/0182539 A1 | 12/2002 | Fujimaki et al. | |
| 2002/0197564 A1 | 12/2002 | Timpe et al. | |
| 2003/0008239 A1 | 1/2003 | Fujimaki et al. | |
| 2003/0068575 A1 | 4/2003 | Yanaka | |
| 2003/0073032 A1 | 4/2003 | Aoshima | |
| 2003/0082478 A1 | 5/2003 | Itakura et al. | |
| 2003/0146965 A1 | 8/2003 | Fujimaki et al. | |
| 2003/0162127 A1 | 8/2003 | Kikuchi | |
| 2003/0186174 A1 | 10/2003 | Nagase | |
| 2004/0063034 A1 | 4/2004 | Goto | |
| 2004/0068026 A1 | 4/2004 | Kunita et al. | |
| 2004/0072101 A1* | 4/2004 | Sugasaki et al. | 430/281.1 |
| 2004/0131971 A1 | 7/2004 | Sugasaki et al. | |
| 2004/0137369 A1 | 7/2004 | Shimada | |
| 2004/0157153 A1 | 8/2004 | Takamuki | |
| 2004/0170920 A1 | 9/2004 | Gota | |
| 2004/0170922 A1 | 9/2004 | Goto | |

(Continued)

FOREIGN PATENT DOCUMENTS

CA 1338095 2/1996

(Continued)

OTHER PUBLICATIONS

Machine translation of JP 7-114176, provided by JPO.*

(Continued)

*Primary Examiner*—Sin Lee
(74) *Attorney, Agent, or Firm*—Sughrue Mion Pllc.

(57) ABSTRACT

A polymerizable composition contains (A) a dye which is soluble in an organic solvent and in an alkaline aqueous solution and has an absorption in 700 to 1200 nm, (B) a radical polymerization initiator, (C) a compound having an ethylenically unsaturated bond, and (D) a binder polymer.

18 Claims, No Drawings

U.S. PATENT DOCUMENTS

| | | |
|---|---|---|
| 2004/0175648 A1 | 9/2004 | Goto |
| 2004/0202957 A1 | 10/2004 | Murota |
| 2004/0223042 A1 | 11/2004 | Goto |
| 2004/0234893 A9 | 11/2004 | Fujimaki |
| 2004/0244619 A1 | 12/2004 | Goto |
| 2005/0026082 A1 | 2/2005 | Shimada |
| 2005/0037282 A1 | 2/2005 | Sonokawa |

FOREIGN PATENT DOCUMENTS

| | | |
|---|---|---|
| EP | 0 377 321 A2 | 7/1990 |
| EP | 0 684 522 A1 | 11/1995 |
| EP | 0 779 161 A1 | 6/1997 |
| EP | 0 919 870 A1 | 6/1999 |
| EP | 0 950 517 A1 | 10/1999 |
| EP | 0 950 518 A1 | 10/1999 |
| EP | 1 033 624 A1 | 9/2000 |
| EP | 1 096 315 A1 | 5/2001 |
| EP | 1 110 747 A1 | 6/2001 |
| EP | 1 160 095 A2 | 12/2001 |
| EP | 1 176 467 A1 * | 1/2002 |
| EP | 1182032 A | 2/2002 |
| EP | 1182033 A1 | 2/2002 |
| EP | 1 186 407 A1 | 3/2002 |
| EP | 1 216 830 A2 | 6/2002 |
| EP | 1 219 464 A2 | 7/2002 |
| EP | 1 235 107 A1 | 8/2002 |
| EP | 1 241 002 A2 | 9/2002 |
| EP | 1 245 405 A2 | 10/2002 |
| EP | 1 249 343 A2 | 10/2002 |
| EP | 1 249 731 A2 | 10/2002 |
| EP | 1 332 870 A2 | 8/2003 |
| EP | 1 338 921 A2 | 8/2003 |
| EP | 1 341 040 A1 | 9/2003 |
| EP | 1 369 231 A2 | 12/2003 |
| EP | 1 400 851 A2 | 3/2004 |
| EP | 1 449 650 A2 | 8/2004 |
| EP | 1 450 207 A1 | 8/2004 |
| GB | 1 521 372 | 8/1978 |
| JP | 54-92723 A | 7/1979 |
| JP | 54-25957 B2 | 8/1979 |
| JP | 54-34327 B2 | 10/1979 |
| JP | 58-29803 A | 2/1983 |
| JP | 58-12577 B2 | 3/1983 |
| JP | 58-134629 A | 8/1983 |
| JP | 59-44615 A | 3/1984 |
| JP | 59-71048 A | 4/1984 |
| JP | 2-161442 A | 6/1990 |
| JP | 4-31863 A | 2/1992 |
| JP | 4-106548 A | 4/1992 |
| JP | 7 020629 | 11/1994 |
| JP | 7-114176 * | 5/1995 |
| JP | 7-060268 B | 6/1995 |
| JP | 7-271029 | 9/1995 |
| JP | 8-108621 A | 4/1996 |
| JP | 8-137096 A | 5/1996 |
| JP | 8-248639 A | 9/1996 |
| JP | 9-43847 A | 2/1997 |
| JP | 2712564 B2 | 10/1997 |
| JP | 10-195119 A | 7/1998 |
| JP | 11-258801 A | 9/1999 |
| JP | 2000-131837 A | 5/2000 |
| JP | 2000-267265 A | 9/2000 |
| JP | 2001-133969 A | 5/2001 |
| JP | 2002-40652 A | 2/2002 |
| JP | 2002-72462 | 3/2002 |
| WO | WO 00/48836 A1 | 8/2000 |

OTHER PUBLICATIONS

McGinniss, Vincent D., "Radiation Curing" 6. Curing with Ultraviolet, Visible and Infrared Processing Equipment from Kirk-Othmer Encyclopedia of Chemical Technology, copyright 1996, by John Wiley & Sons, Inc., Article Online posting date Dec. 4, 2000.
SR-295, product bulletin, SARTOMER Company, Exton, PA, one page, dated Nov. 1998 from internet through Sartomer web site.
SR-399, Product bulletin, SARTOMER Company, Exton, PA., one page, dated Nov. 1998, from internet through Sartomer web site.
SR-492, product bulletin, SARTOMER Company, Exton, PA on page, dated Nov. 1998 from internet through Sartomer web site.
CD-501, product bulletin, SARTOMER Company, Exton, PA, one page, dated May 1999 from internet through Sartomer web site.
SR-368, product bulletin, SARTOMER Company, Exton, PA 1 pate, dated Nov. 1998, from internet through Sartomer web site.
Product Data, Scripset 550 Styreen Maleic Anhydride Copolymer Solid, Hercules Incorporated, copyright 1999, dated Jun. 2000 from internet.
European Search Report dated Jul. 2, 2002.
European Search Report dated Apr. 16, 2004.
European Search Report dated Jan. 16, 2004.
European Search Report dated Jun. 14, 2005.
Jerry March: "Advanced organic chemistry: reactions, mechanisms, and structure" 1992, Wiley-Interscient, $4^{th}$ Ed., USA, XP 002275533 p. 280, Table 9.4.
Ben-zyl from The American Heritage dictionary of the English Language, Fourth Edition, copyright 2000 by Houghton Mifflin Company found at yourdictionary.com, one page.
Mineo et al, 08062834, English Abstract of Japanese Published Application 08062834 dated Mar. 8, 1996, pg. Patent Abstracts of Japan dated 1996.
Office Action dated Jan. 31, 2005 from U.S. Appl. No. 10/673,332.
Office Action dated Jan. 25, 2005 from U.S. Appl. No. 10/673,332.
Office Action dated Apr. 18, 2005 from U.S. Appl. No. 10/781,922.
Office Action dated Mar. 9, 2005 from U.S. Appl. No. 10/671,776.
Office Action dated Feb. 23, 2005 from U.S. Appl. No. 10/669,696.
Office Action dated Apr. 18, 2005 from U.S. Appl. No. 10/781,645.
Office Action dated Apr. 18, 2005 from U.S. Appl. No. 10/782,852.
Office Action dated Aug. 1, 2005, for U.S. Appl. No. 10/669,696.
Registry No. 2154-56-5, one page, "benzyl".
Patent Abstracts of Japan for Publication No. 59-053836, Published Mar. 28, 1984, Applicant: Fuji Photo Film Co., Ltd.
European Search report dated Nov. 3, 2005 for EPA No. 03022136.0, English.
European Search report dated Nov. 8, 2005 for EPA No. 03022140.2, English.

* cited by examiner

POLYMERIZABLE COMPOSITION AND IMAGE-RECORDING MATERIAL USING THE SAME

BACKGROUND OF THE INVENTION

1. Technical Field of the Invention

The present invention relates to a polymerizable composition and an image-recording material using the polymerizable composition as a recording layer and, more particularly, to an image-recording medium which is writable by an infrared ray laser with high sensitivity and to a lithographic printing plate precursor.

2. Description of the Related Art

Recent years have seen a remarkable development of laser and, with respect to a solid laser and a semiconductor laser, those which have a large output and a small size have been developed. Therefore, these lasers are extremely useful as a recording light source in the direct plate-making based on digital signal, for example, from a computer.

As an image-recording medium using such laser as a recording light source, a thermally polymerizable recording layer has been known which contains a light-heat converting agent, a radical-generating thermal polymerization initiator and a thermally polymerizable resin. (see, for example, JP-A-8-108621).

A negative-working image-forming material having such thermally polymerizable recording layer usually utilizes a recording system wherein a polymerization is caused with a radical generated by light or heat to cure exposed areas which form image areas.

With such negative-working image-forming material, it is possible to improve properties such as reactivity and plate checkability by adding an ionic material or a highly polar compound as a dye or other constituent. However, such highly polar compound has a problem that, when stored under an atmosphere of high temperature, it can cause non-desired mutual action with a binder or a polymerizable compound to be used therewith and, as a result, that unexposed areas suffer reduction in dissolution rate in a developing solution, thus being liable to remain under ordinary developing conditions.

In the field of other image-recording materials than the thermally polymerizable image-recording material, for example, a positive-working image-recording material adapted for an infrared ray laser or a cross-linkable negative-working image-recording material containing an acid generator and an acid-crosslinking agent, a technique of using an alkali water-soluble dye has been proposed to reduce generation of remaining of unexposed areas or generation of dye stain upon alkali development (see, for example, JP-A-2000-267265). In such cases, however, application of the technique to a polymerizable composition has never been examined.

SUMMARY OF THE INVENTION

The invention has been completed with the above-mentioned problems in mind. An object of the invention is to provide a polymerizable composition having excellent developability and development stability, i.e., a polymerizable composition which is rapidly polymerized to cure by exposure and shows an excellent alkali developability in unexposed areas thereof and which, even when stored under a severe atmosphere of, for example, high temperature and high humidity, does not suffer reduction in developability with time, and to provide an image-recording material having a negative-working recording layer using the composition.

As a result of intensive investigations, the inventors have found that a composition which shows both excellent film properties and excellent developability and has excellent development stability with time can be obtained by using in a polymerizable composition an organic solvent and a dye soluble in an alkali aqueous solution known to be used in a positive-working image-recording material, and that the effect can be markedly improved by combined use with a polymer having an acid group, thus having achieved the invention based on the findings.

That is, a polymerizable composition of the invention contains (A) a dye which is soluble in an organic solvent and an alkaline aqueous solution and has an absorption in 700 to 1200 nm, (B) a radical polymerization initiator, (C) a compound having an ethylenically unsaturated bond, and (D) a binder polymer.

The dye (A), which is soluble in an organic solvent and in an alkaline aqueous solution and has an absorption in 700 to 1200 nm, preferably has one or more functional groups selected from the group consisting of an alkali water-dissociative group and a functional group capable of being decomposed with an alkali water. An example of such functional group is an ester group.

In a preferred embodiment, the binder polymer (D) to be used is a polymer containing an alkali-soluble group-having structural unit represented by the following formula (I):

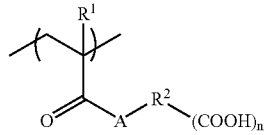

In formula (I), $R^1$ represents a hydrogen atom or a methyl group, $R^2$ represents a linking group constituted by two or more kinds of atoms selected from the group consisting of a carbon atom, a hydrogen atom, an oxygen atom, a nitrogen atom, a sulfur atom and a halogen atom, with the number of the atoms being from 2 to 82, A represents an oxygen atom or $-NR^3-$, $R^3$ represents a hydrogen atom or a monovalent hydrocarbon group having from 1 to 10 carbon atoms, and n represents an integer of from 1 to 5.

Also, an image-forming material of the invention comprises a support having provided thereon a recording layer containing any one of the polymerizable compositions of the invention described above.

Mechanism of the action of the invention is not clear, but may be presumed as follows. Use of the dye (A), which is soluble in an organic solvent and in an alkaline aqueous solution and has an absorption in 700 to 1200 nm, in the polymerizable composition of the invention serves to form a stable layer due to the high polarity of the dye itself and serves to provide a high developability and depress reduction of developability when stored under severe conditions of, for example, high temperature and high humidity since the acid group or its salt introduced into the dye molecule for the purpose of making the dye soluble in an organic solvent and in an alkaline aqueous solution functions to be readily dissolved in an alkali water.

Further, in a preferred embodiment of the invention, use of the binder polymer (D) having a highly developable acid group within the molecule seemingly serve to more depress reduction of developability in a forced ageing test.

Also, the polymerizable composition of the invention has the advantage that, since the dye having an absorption in 700 to 1200 nm is soluble in an alkali developing solution, the recording layer of the image-forming material in non-image areas show such a good solubility, that remaining of the recording layer in the non-image areas in development is depressed and, in addition, that staining possibly generated in the case of using an insoluble dye or pigment in the non-image areas is depressed and, particularly, that the number of initial unsatisfactorily printed sheets upon printing is reduced.

The invention provides a polymerizable composition which can be rapidly polymerized to cure by exposure to light, which shows an excellent alkali developability in unexposed areas, and which does not suffer reduction of developability with time even when stored under a severe atmosphere of, for example, high temperature and high humidity, and provides an image-recording material having a negative-working recording layer using the composition.

DETAILED DESCRIPTION OF THE INVENTION

The polymerizable composition of the invention and the image-recording material using the same are described in detail below.

[Polymerizable Composition]

The polymerizable composition of the invention contains (A) a dye which is soluble in an organic solvent and in an alkaline aqueous solution and has an absorption in 700 to 1200 nm, (B) a radical polymerization initiator, (C) a compound having an ethylenically unsaturated bond, and (D) a binder polymer.

Each of the constituting components is described in detail below.

[(A) Dye Which is Soluble in an Organic Solvent and in an Alkaline Aqueous Solution and Has an Absorption in 700 to 1200 nm (Specific Dye)]

In the invention, the specific dye as component (A) is not particularly limited so long as it has an absorption, preferably an absorption maximum wavelength, in a region of from 700 to 1200 nm and is soluble in an alkaline aqueous solution. Compounds having a dissociative group of 1 to 17 in pKa or its salt (hereinafter the functional group and the salt thereof also being inclusively referred to as alkali water-dissociative groups) are preferred.

Also, other preferred embodiment of the specific dye (A) includes compounds having a functional group capable of being decomposed with an alkaline aqueous solution. A specific preferred embodiment of the functional group capable of being decomposed with an alkaline aqueous solution includes an ester group.

Additionally, the soluble dye is required to be soluble in an organic solvent in view of production adaptability.

In the image-forming material of the invention, an infrared ray-absorbing dye soluble in an organic solvent and an alkali water is used as an infrared ray-absorbent.

The specific dye to be used has a function of converting absorbed infrared rays to heat. Upon the conversion, the radical polymerization initiator (B) to be used hereinafter is decomposed by the generated heat, and the radical in turn causes polymerization reaction of the compound (C) having an ethylenically unsaturated bond, thus only areas irradiated by an infrared laser being cured to become insoluble in an alkali water.

The dye soluble in an organic solvent and in an alkali water is a dye which can effectively absorb infrared rays of 700 to 1200 nm in wavelength. Dyes having an absorption maximum in a region of from 760 to 1200 nm are more preferred.

Since the specific dye (A) in accordance with the invention is a dye soluble in an organic solvent, a uniform and stable coating solution can be obtained in preparing a liquid-state coating solution and, since it causes dissociation or decomposition in an alkali water, rapid and good development processing can be conducted by using an alkaline aqueous solution (hereinafter sometimes referred to as "alkali developing solution").

Thus, when dipped in an alkali developing solution upon development, unnecessary specific dye is discharged into the alkali developing solution. However, since the dye component is discharged into the alkali developing solution in a dissociated form, the unnecessary infrared ray-absorbing dye can be dissolved away easily and completely from the polymerizable composition even when used in a large amount. That is, progress of a highly sensitive polymerization reaction is possible by using a large amount of the infrared ray-absorbing dye and, in addition, the problem of remaining of dye not removed upon development is solved, which serves to prevent generation of staining with the dye in non-image areas in the case of using the composition as a recording layer of an image-recording material. Also, development inhibition due to floated specific dye and generation of staining of non-image areas due to attachment of the dye can be prevented.

Also, the composition is difficultly influenced by development processing conditions upon development because of the improved developability of the composition, thus having such a wide development latitude that reduction of developability due to storage at high temperature can be prevented. As a result, storage stability as a polymerizable composition can be improved.

The specific dye to be used in the polymerizable composition of the invention is described below.

Examples of the dye which is soluble in an organic solvent and in an alkali water and has an absorption in 700 to 1200 nm, i.e., infrared ray-absorbing dye to be used include those which are prepared by introducing an alkali water-dissociative group or a functional group capable of being decomposed with an alkali water (these being hereinafter also referred to inclusively as "alkali water-soluble groups") into commercially available dyes and known infrared ray-absorbing dyes described in literature (for example, *Senryo Binran* (Dye Handbook) compiled by Yuki Gosei Kagaku Kyokai (1970); *THE CYANINE DYES AND RELATED COMPOUNDS* written by Frances M. Harmer; and *Infrared Absorbing Dyes* edited by Masaru Matsuoka (1990)).

Specific examples thereof include those which are prepared by introducing the alkali water-soluble group into azo dyes, metal complex azo dyes, pyrazolone azo dyes, anthraquinone dyes, phthalocyanine dyes, carbonium dyes, quinoneimine dyes, methine dyes or cyanine dyes. Of these, those which absorb infrared light or near infrared light (700 to 1200 nm in wavelength) with high efficiency are preferred.

Of the aforementioned dyes, examples of the dye capable of absorbing infrared light or near infrared light include those which are prepared by introducing the alkali water-soluble group into cyanine dyes described in JP-A-58-125246, JPA-59-84356, JP-A-59-202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squalirium dyes described in JP-A-58-112792, cyanine dyes described in British Patent 434,875, and dihydropyrimidinesqualirium dyes described in U.S. Pat. No. 5,380,635.

Further, as the dye, those which are prepared by introducing the alkali water-soluble group into near infrared-absorbing sensitizers described in U.S. Pat. No. 5,156,938 may also be preferably used.

Also, preferred examples thereof include those which are prepared by introducing an acid group or the like into substituted arylbenzo(thio)pyrylium salts described in U.S. Pat. No. 3,881,924, trimethinethiapyrylium salts described in JP-A-57-14245 (corresponding to U.S. Pat. No. 4,327,169), pyrylium-base compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475 and pyrylium compounds described in JP-B-5-13514 and JP-B-5-19702. Commercially available examples to be preferably used include those which are prepared by introducing the alkali water-soluble group into Epolight III-178, Epolight III-130, Epolight III-125 or Epolight IV-62A (manufactured by Epolin Co.).

Also, those which are prepared by introducing the alkali water-soluble group into near infrared-absorbing dyes represented by formulae (I) and (II) described in U.S. Pat. No. 4,756,993 are preferred.

As is described hereinbefore, the alkali water-soluble group includes an alkali water-dissociative group and a functional group capable of being decomposed with alkali water.

First, the alkali water-dissociative group is described below. Examples of the alkali water-dissociative group include an acid group dissociating at a pKa of 17 or less, a precursor of the acid group and its conjugate base group. Of these, an acid group dissociating at a pKa of from 1 to 17, a precursor of the acid group precursor and its conjugate base group are particularly preferred, and an acid group dissociating at a pKa of from 3 to 13, a precursor of the acid group precursor and its conjugate base group are more preferred.

In case where the pKa value is less than 1, there results a high water retention, which leads to a large change with time and, in some cases, causes reduction of storage stability of the image-forming material. On the other hand, in case where the pKa value exceeds 17, hydrophilic properties are reduced so much that there can result development failure or staining of non-image areas.

Preferred examples of the acid group, the precursor of the acid group or the conjugate base group thereof include a hydroxyl group, a substituted oxy group ($R^4O$—), a mercapto group, a substituted carbonyl group, a carboxyl group or its conjugate base group, a sulfo group, a sulfonato group, a sulfamoyl group or its conjugate base group, a carbamoyl group, a urethane group, a urea group, a thiourea group, an N-alkylsulfaoyl group or its conjugate base group, an N-arylsulfamoyl group or its conjugate base group, an N-acylsulfamoyl group or its conjugate base group, an N-alkylsulfonylsulfamoyl group or its conjugate base group, an N-arylsulfonylsulfamoyl group or its conjugate base group, an N-alkylsulfonylcarbamoyl group or its conjugate base group, an N-arylsulfonylcarbamoyl group or its conjugate base group, a phosphono group, a phenol group or its conjugate base group, a substituted phosphono group, a phosphonato group, a substituted phosphonato group, a cyano group, an alkoxysilyl group, an aryloxysilyl group, and a hydroxysilyl group or its conjugate base group.

The acid group, precursor of the acid group or its conjugate base group may be bound to two or more of the specific dyes through a divalent hydrocarbon linking group.

Infrared-absorbing dyes having an alkali water-dissociative group from which hydrogen has already been dissociated and amphoteric ion type infrared-absorbing dyes also have a high developability with an alkaline aqueous solution and can be used as well.

Of the above-described groups, preferred examples of the alkali water-dissociative group include a carboxyl group or its conjugate base group, a sulfonato group or its conjugate base group, a phenol group, a sulfonamido group, a β-carbonyl ester group and a β-carbonyl ketone group. Also, other carboxylate groups, particularly a methyl carboxylate group, may be used.

Where the dye having an absorption in 700 to 1200 nm is an ionic compound, the alkali water-dissociative group may be bound to a unit of cation moiety or anion moiety. Usually, however, the structure containing a skeleton having an absorption in 700 to 1200 nm has a highly hydrophobic property, the alkali water-dissociative group is preferably bound to a unit containing a skeleton having an absorption in 700 to 1200 nm in view of obtaining more advantages on developability.

Also, a specific preferred embodiment of the functional group capable of being decomposed with the alkaline aqueous solution includes an ester group.

Of the ester groups, a methyl ester group, an aryl ester group, a benzyl ester group and an allyl ester group are particularly preferred in view of solubility in the alkaline aqueous solution. Further, in view of synthesis and alkali solubility, a methyl ester group is most preferred.

These ester groups may be substituted, for example, by a halogen atom, a hydroxyl group, a cyano group, a nitro group, an amido group, an amino group, an alkyl group, an alkenyl group, an alkynyl group, an aryl group, a sulfo group, a carbonyl group, a carboxyl group, an ester group, an alkoxy group or a thioalkoxy group.

As the specific dye to be used in the invention, infrared-absorbing dyes having the alkali water-dissociative group of pKa 1 to 17 and soluble in an organic solvent and in an alkali water are preferred, and dyes having the alkali water-dissociative group of pKa 3 to 13 or its conjugate base group, being soluble in an organic solvent and in an alkali water, and having an absorption in 700 to 1200 nm are more preferred.

Specific examples of the specific dye to be preferably used in the invention include the following compounds [illustrative compounds: A-1) to A-102)], which, however, should not be construed as limiting the invention.

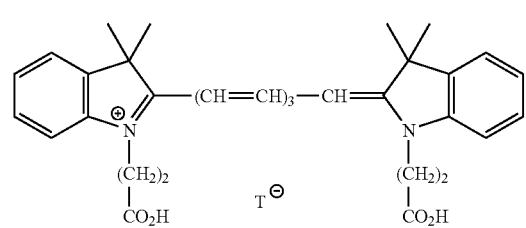
A-1)
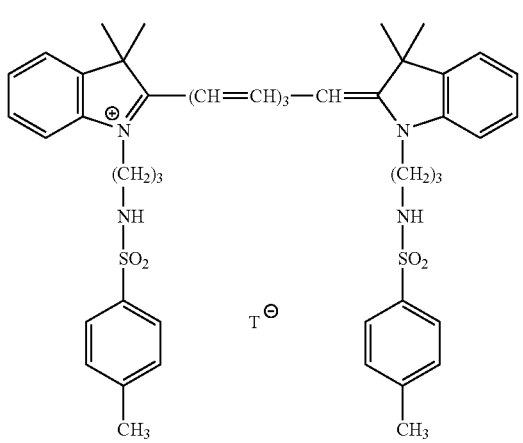
A-2)
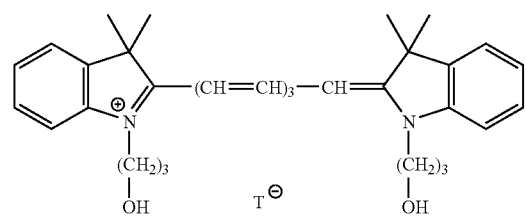
A-3)
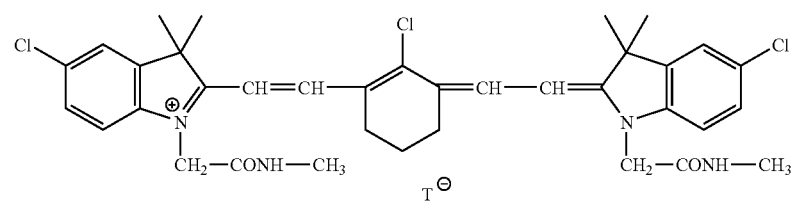
A-4)
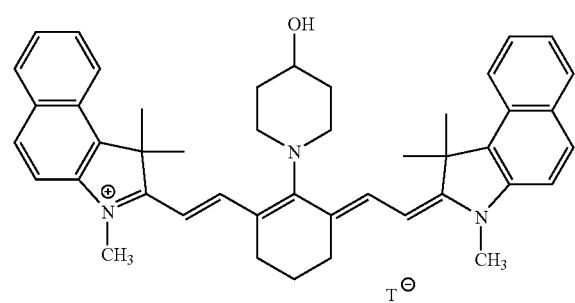
A-5)
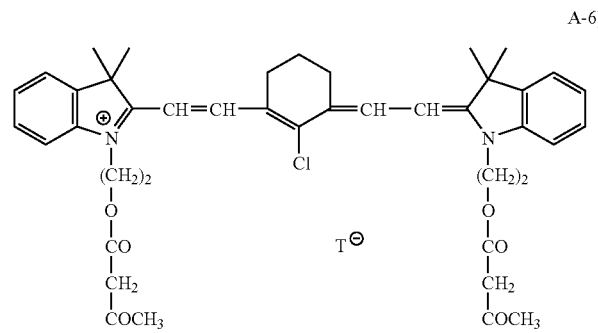
A-6)
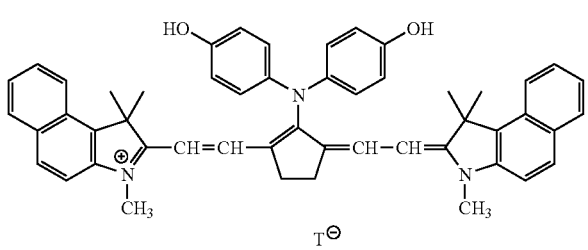
A-7)

-continued
A-8)
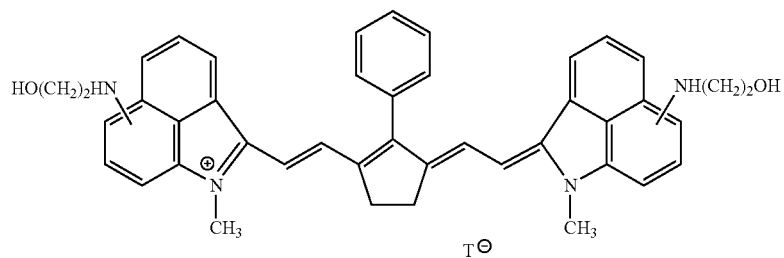
A-9)
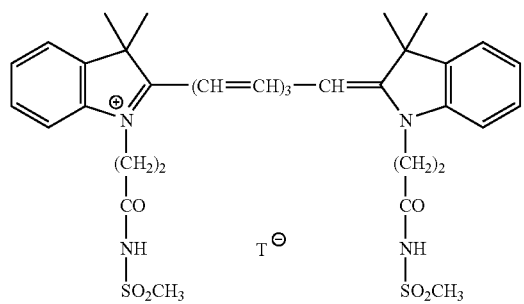
A-10)
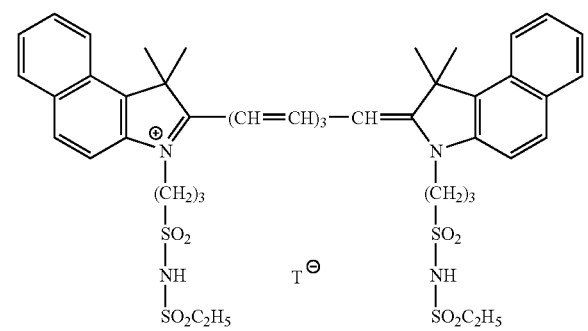
A-11)
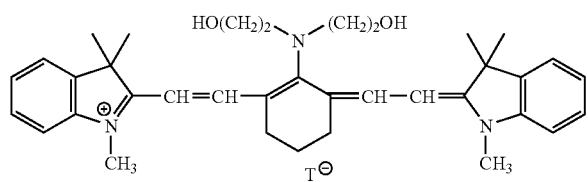
A-12)
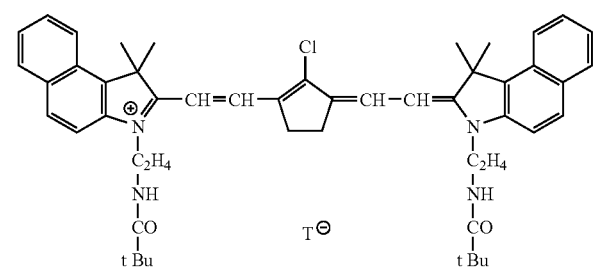
A-13)
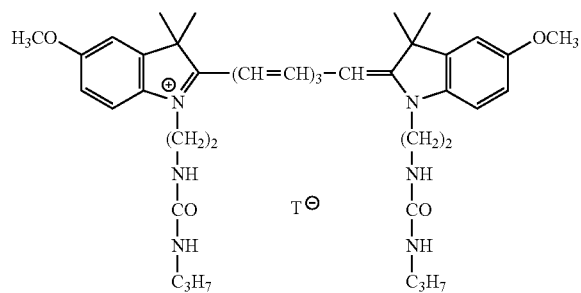
A-14)
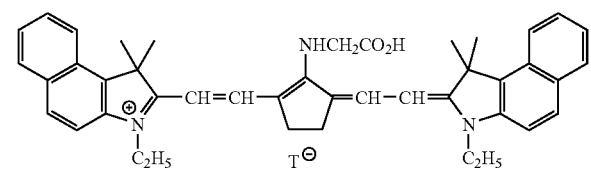
A-15)
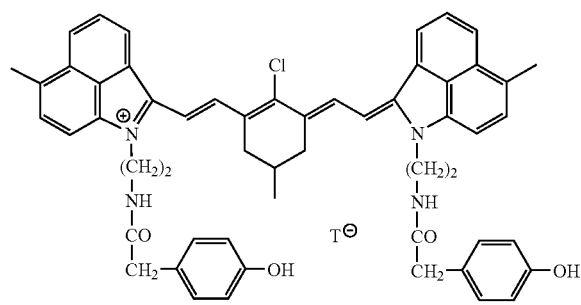
A-16)
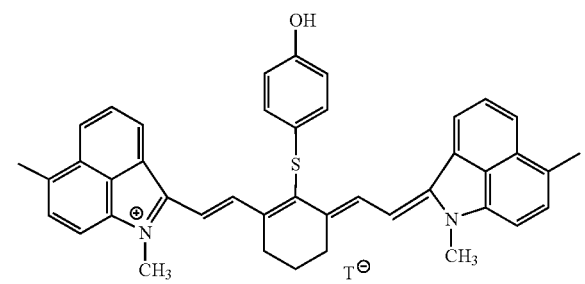

-continued
A-17)
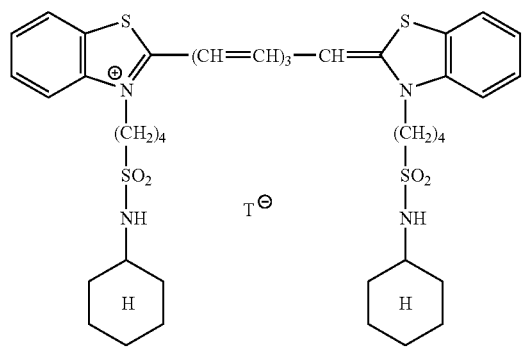
A-18)
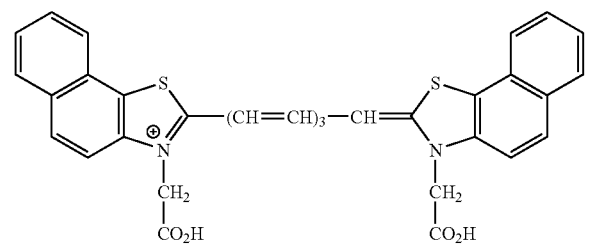
A-19)
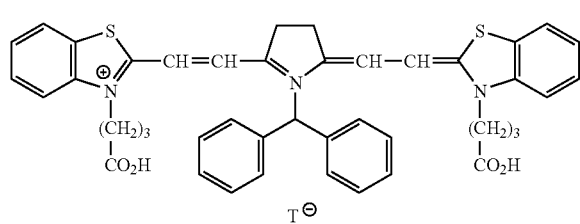
A-20)
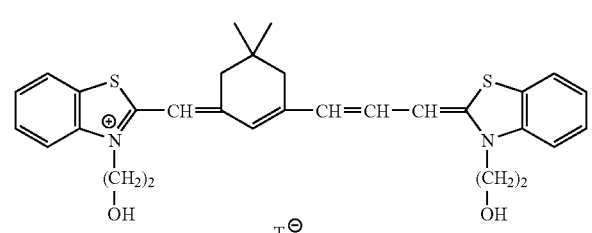
A-21)
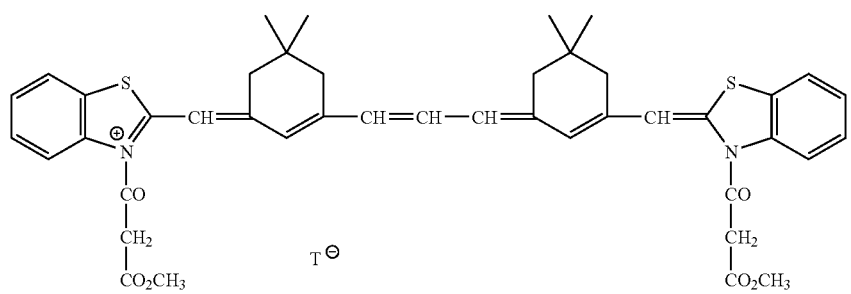
A-22)
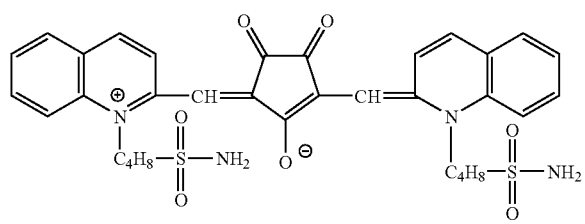
A-23)
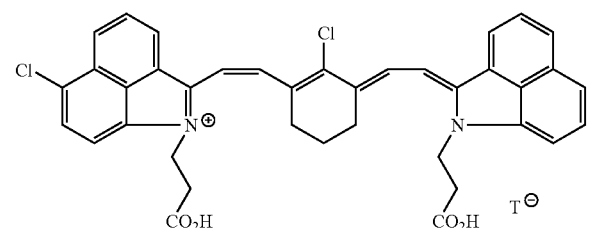
A-24)
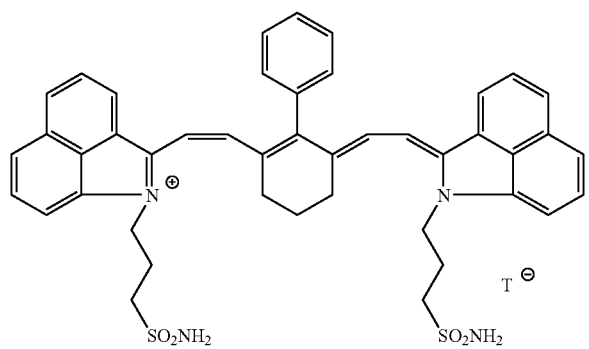
A-25)
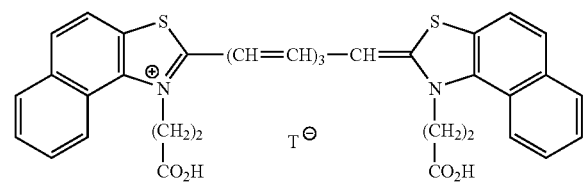

-continued
A-26)
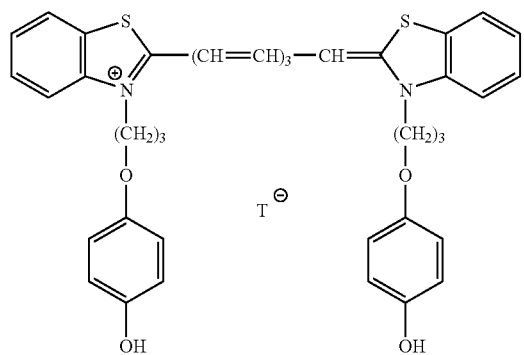
A-27)
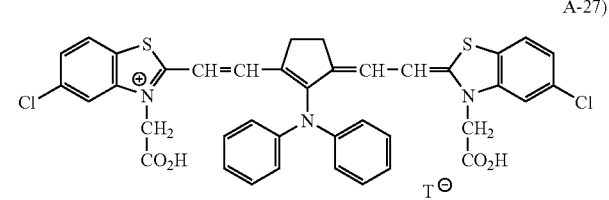
A-28)
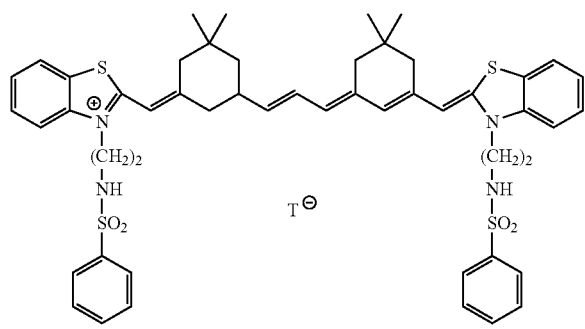
A-29)
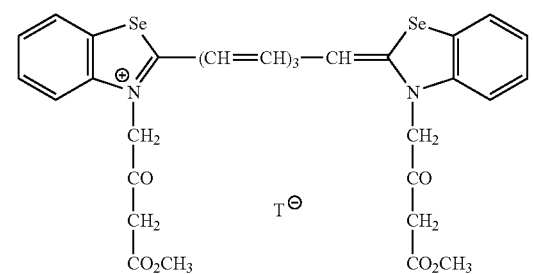
A-30)
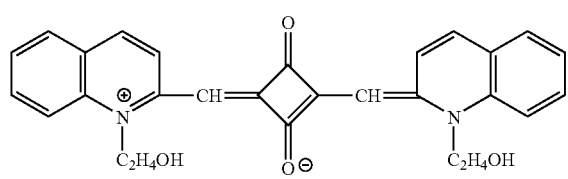
A-31)
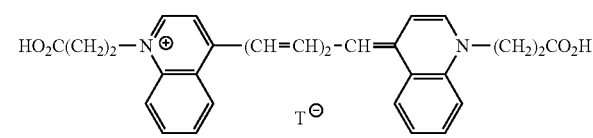
A-32)
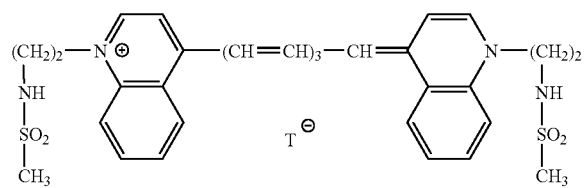
A-33)
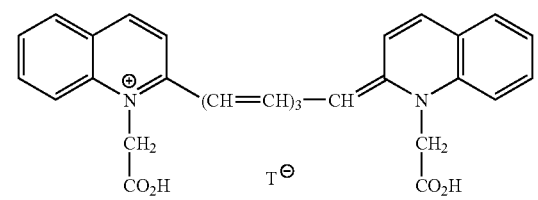
A-34)
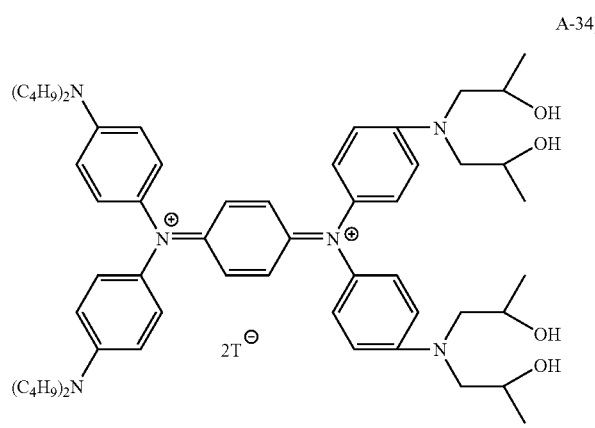
A-35)
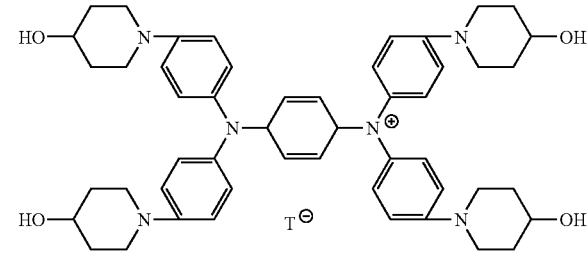

-continued
A-36)
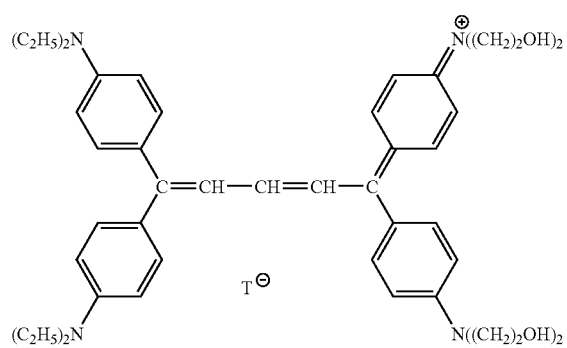
A-37)
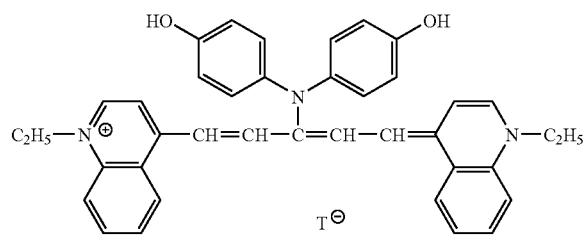
A-38)
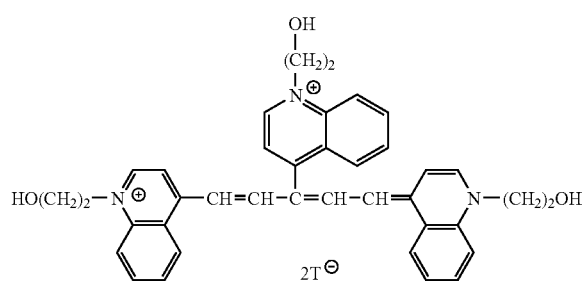
A-39)
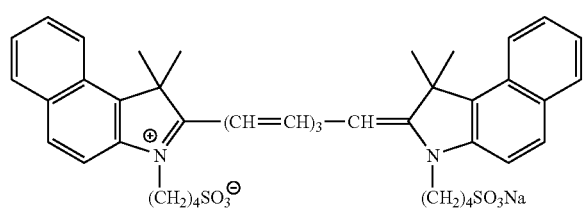
A-40)
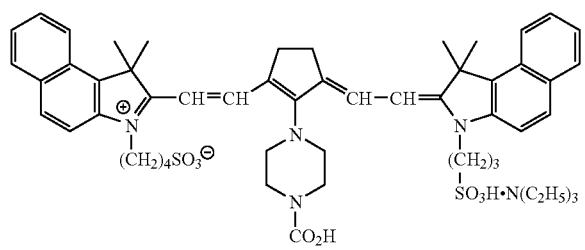
A-41
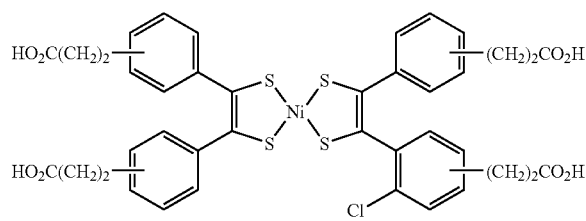
A-42)
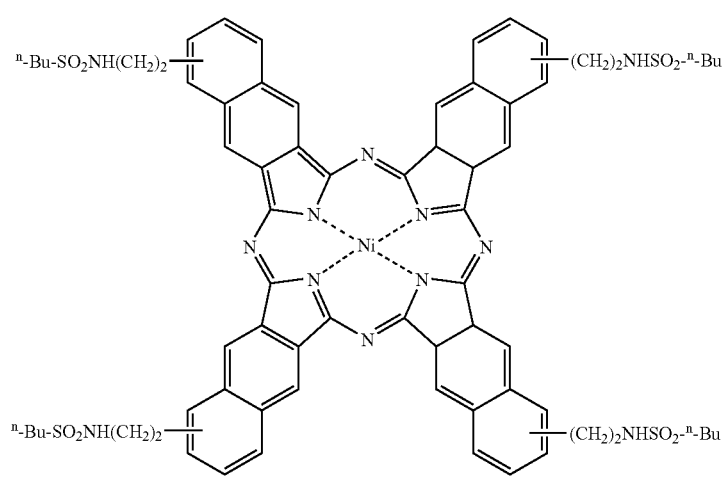

-continued
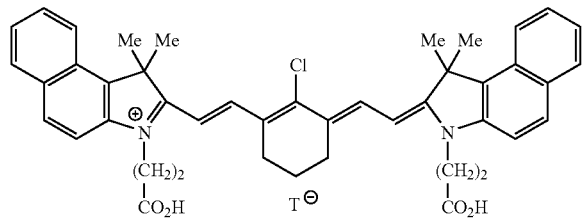
A-43)
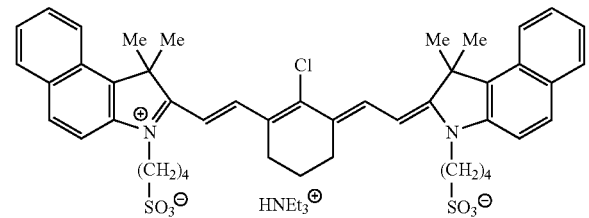
A-44)
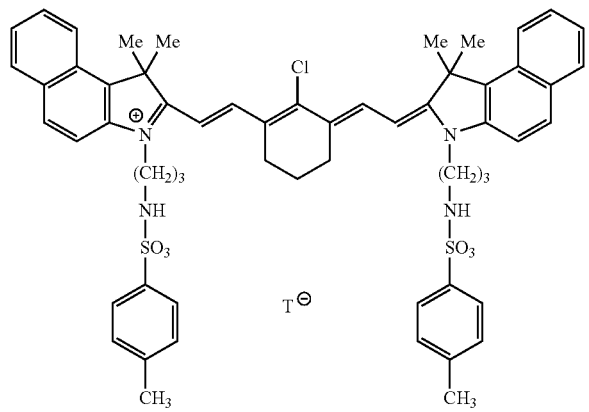
A-45)
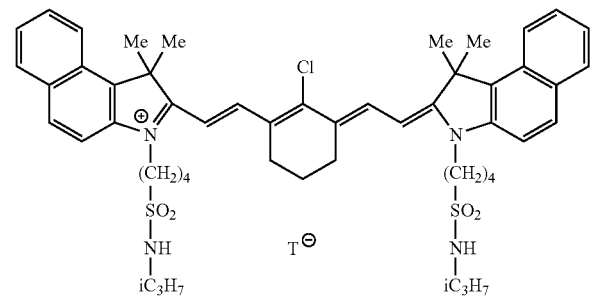
A-46)
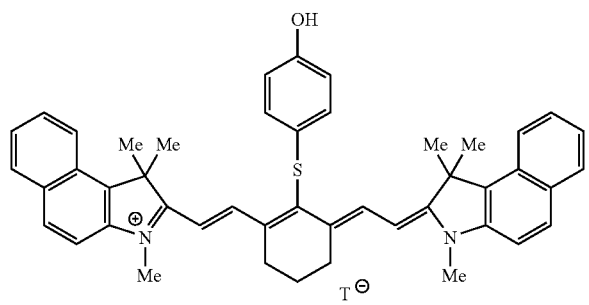
A-47)
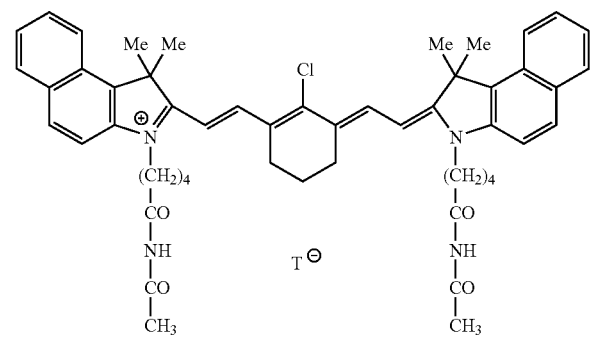
A-48)
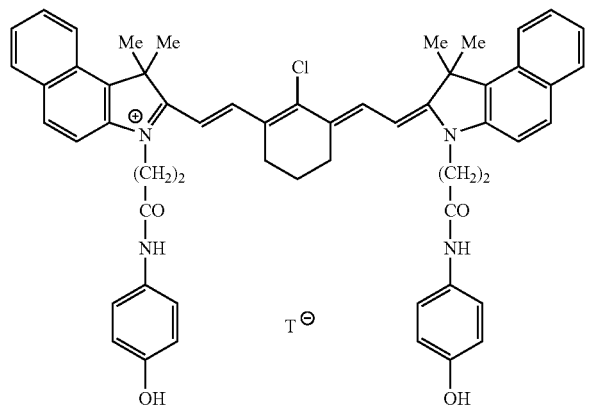
A-49)
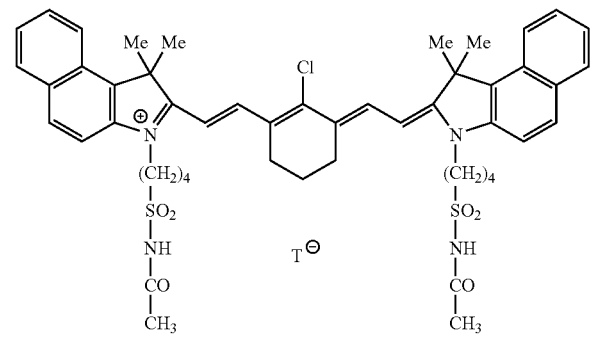
A-50)

-continued
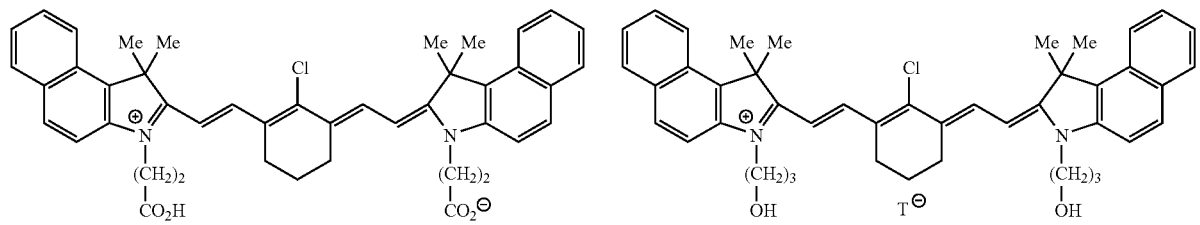
A-51)  A-52)
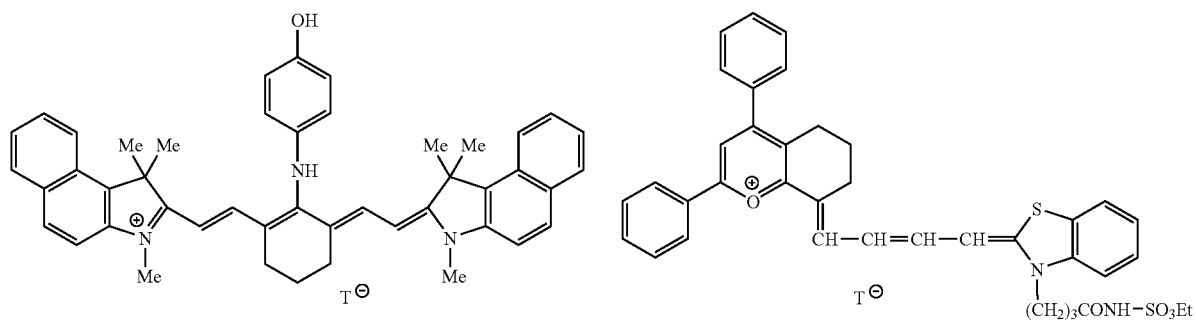
A-53)  A-54)
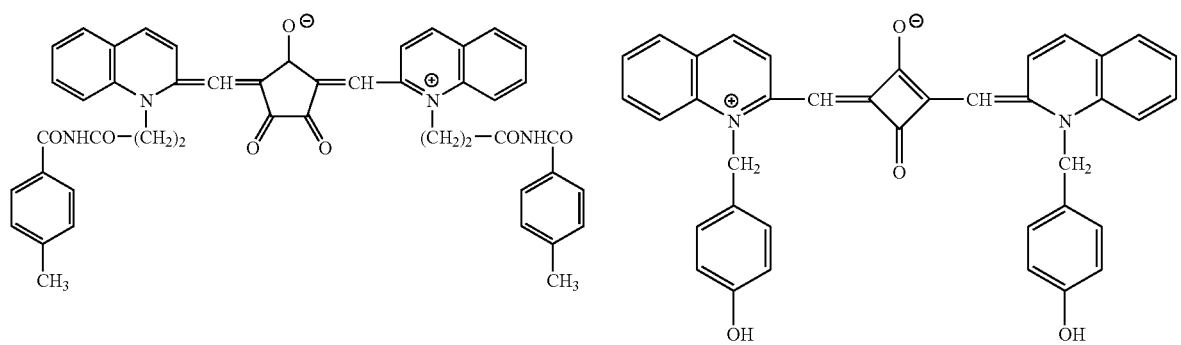
A-55)  A-56)
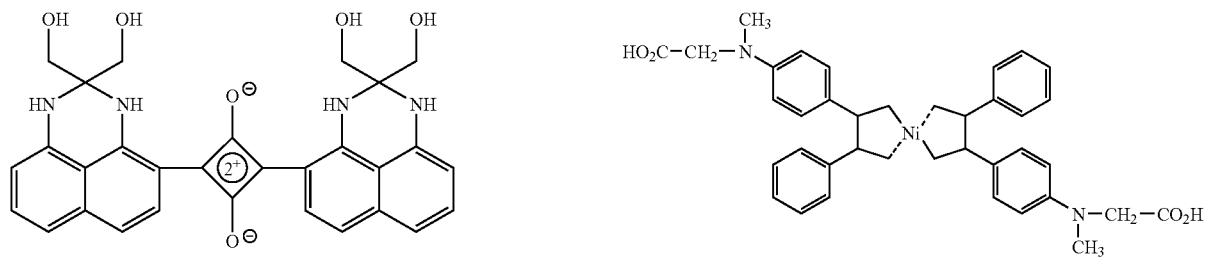
A-57)  A-58)
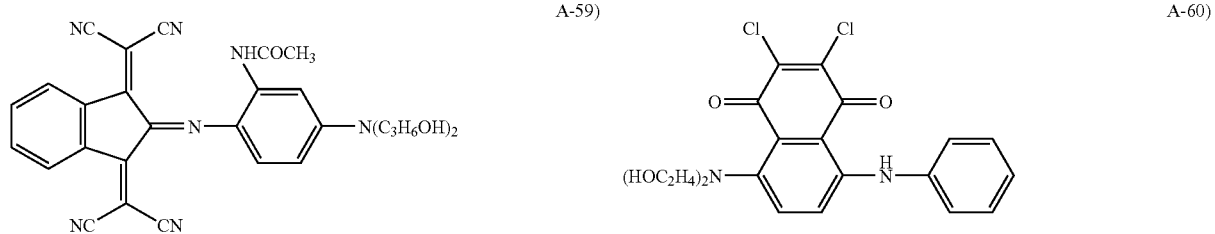
A-59)  A-60)

-continued
A-61)
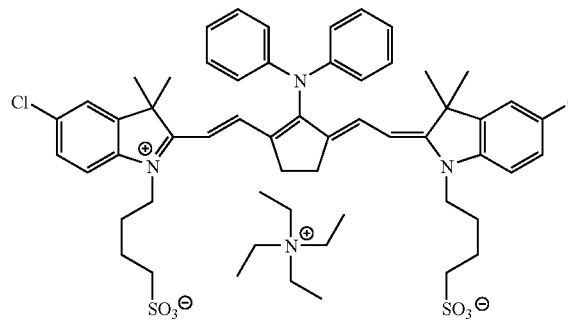
A-62)
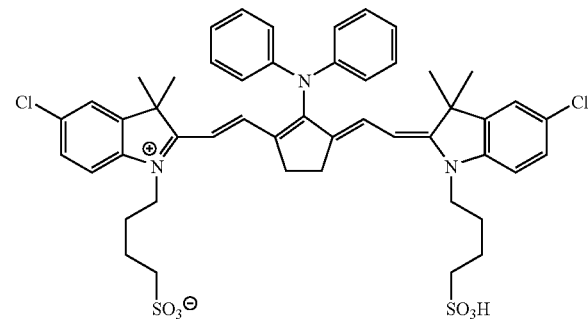
A-63)
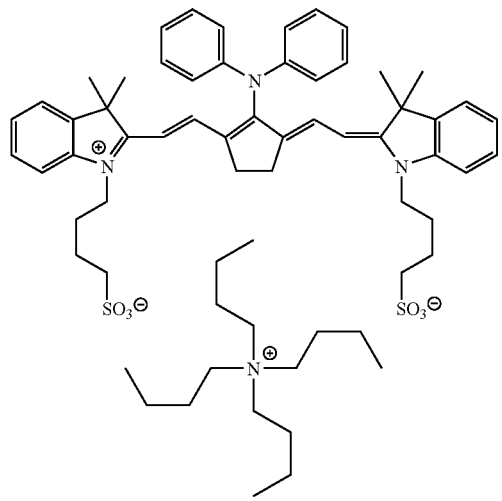
A-64)
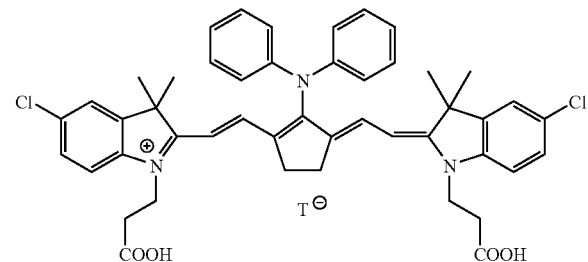
A-65)
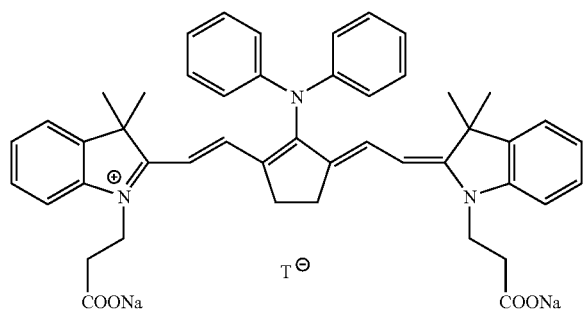
A-66)
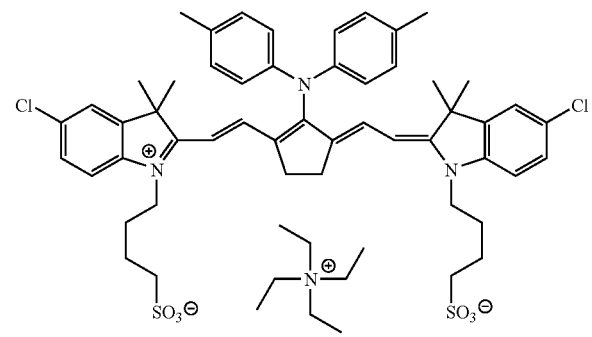
A-67)
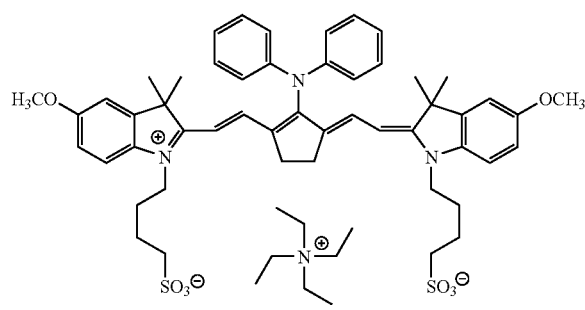
A-68)
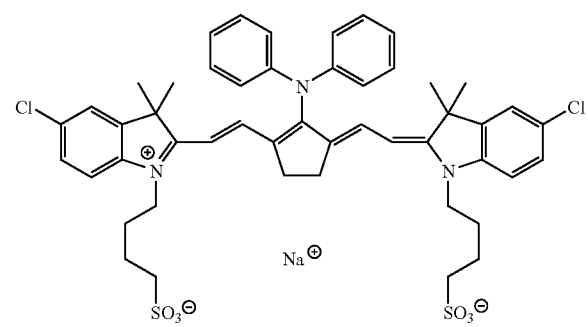

-continued
A-69)
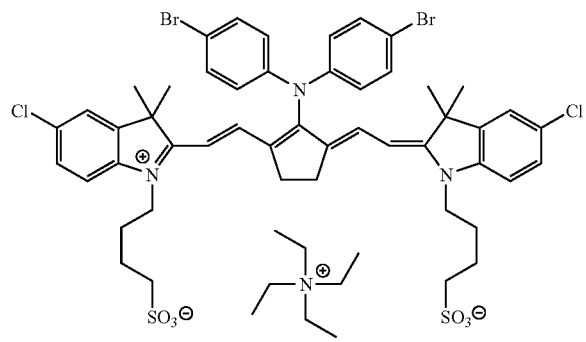
A-70)
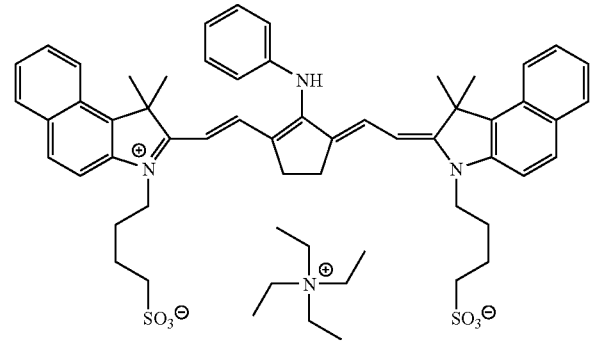
A-71)
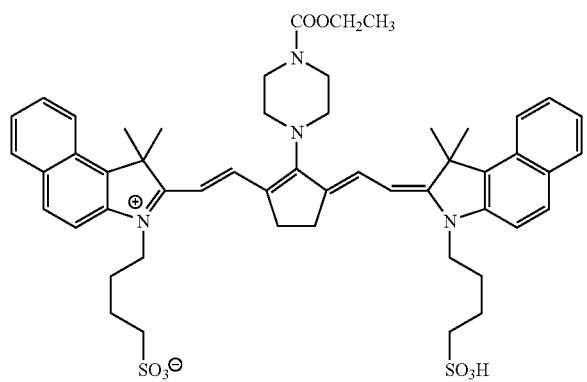
A-72)
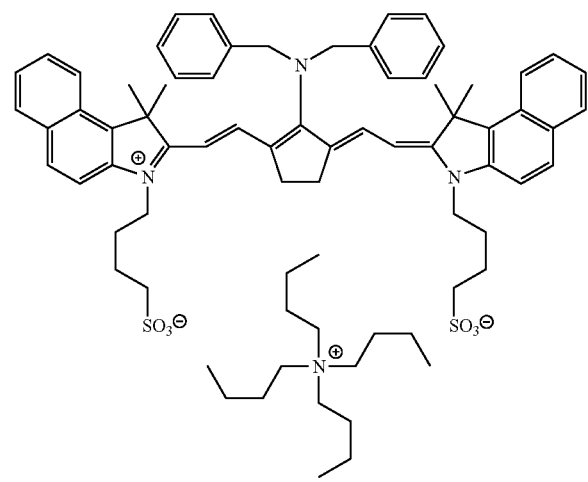
A-73)
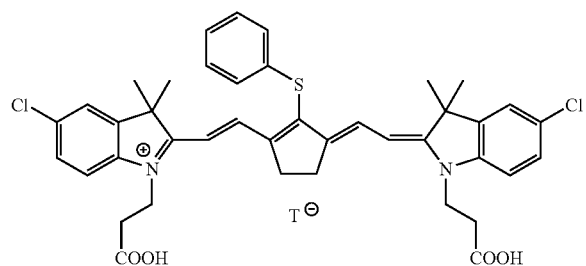
A-74)
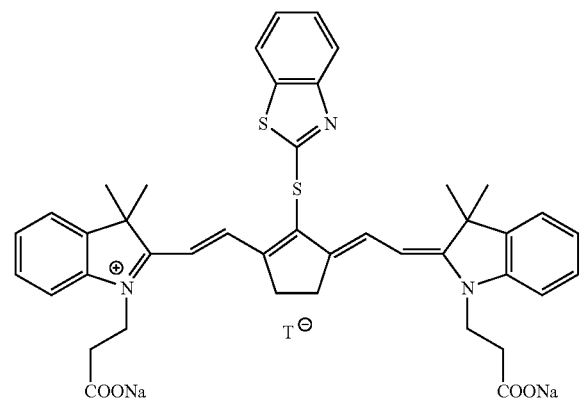
A-75)
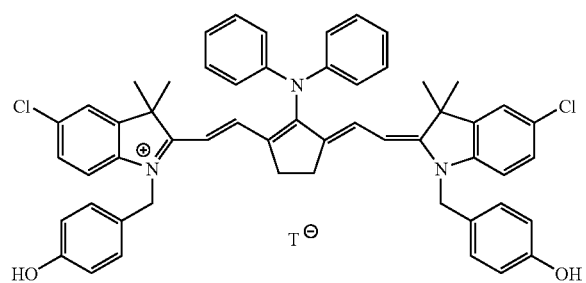
A-76)
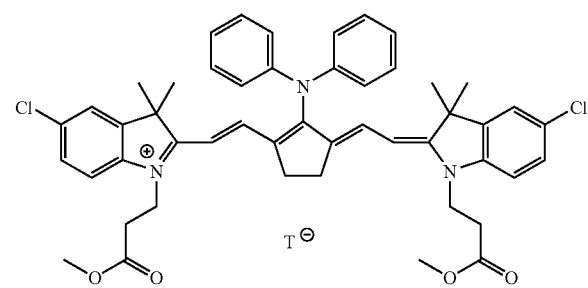

-continued
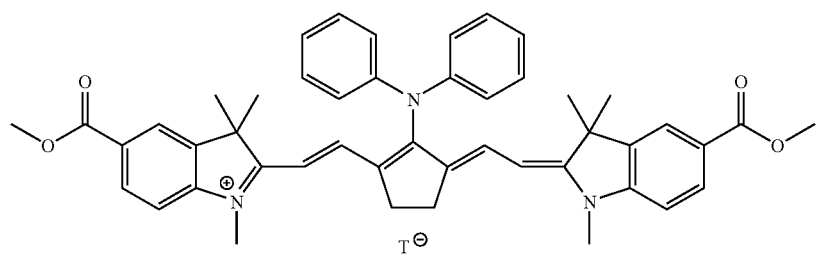
A-77)
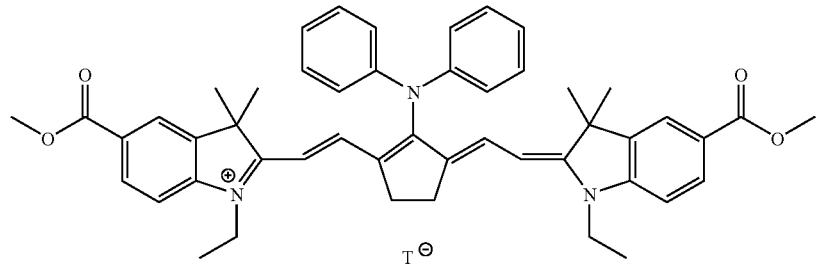
A-78)
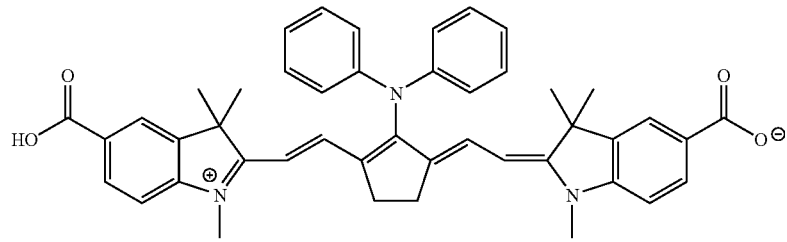
A-79)
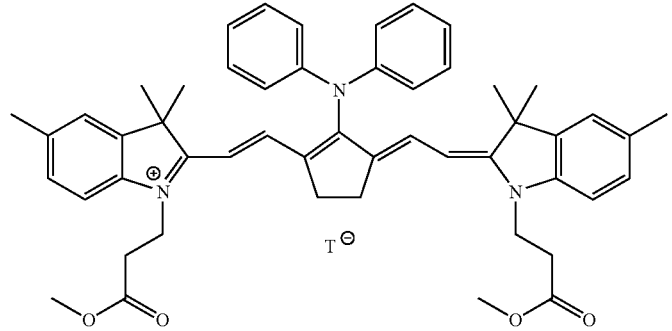
A-80)
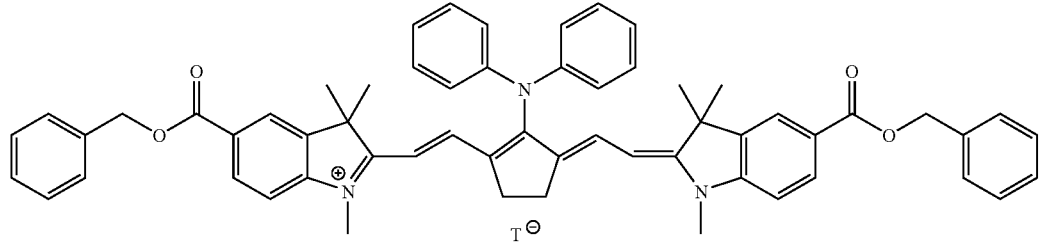
A-81)
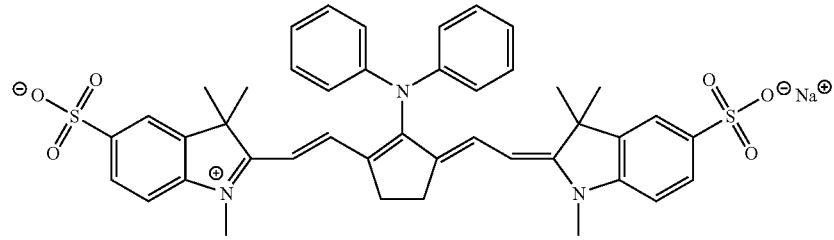
A-82)

-continued
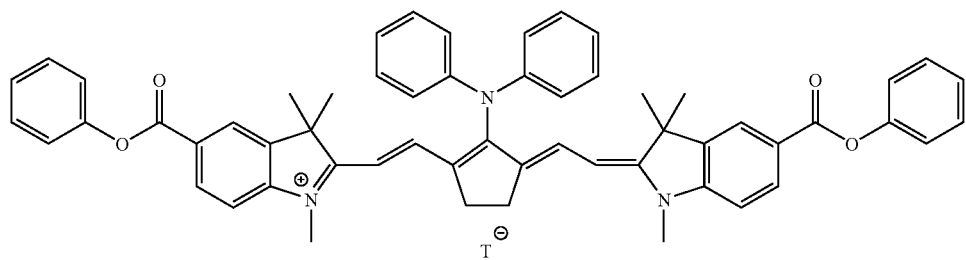
A-83)
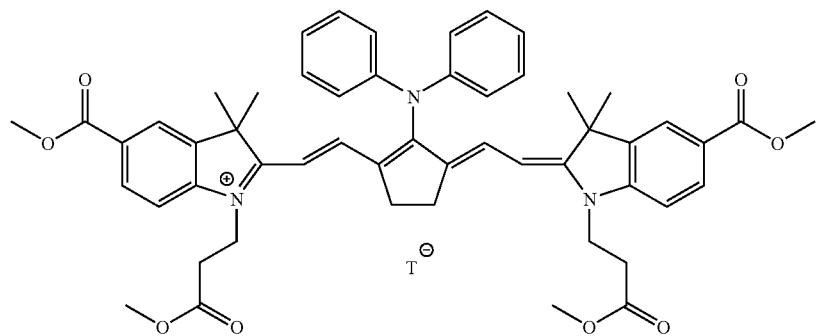
A-84)
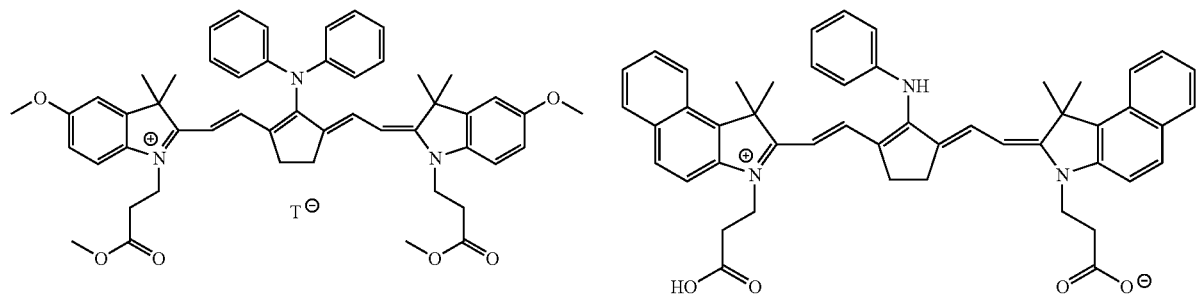
A-85)
A-86)
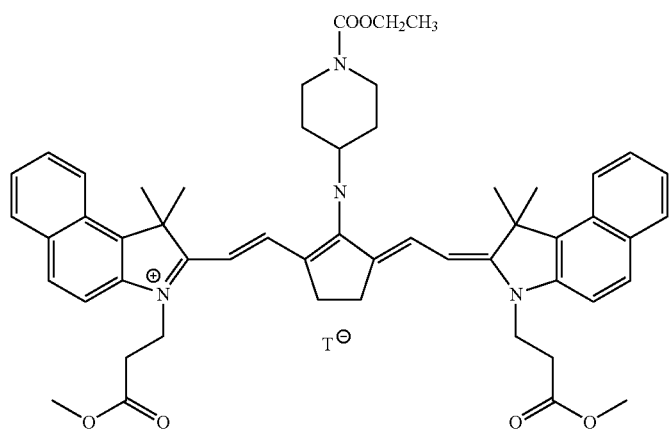
A-87)
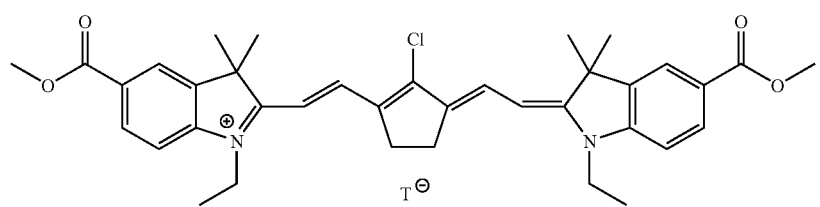
A-88)

-continued
A-89)
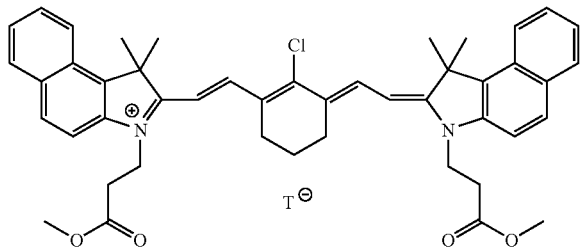
A-90)
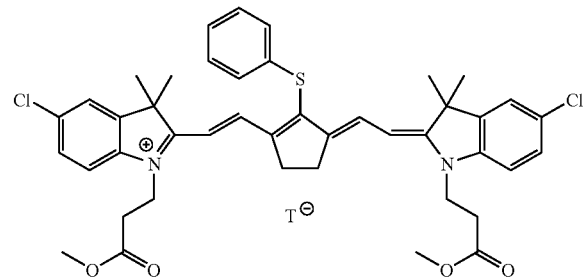
A-91)
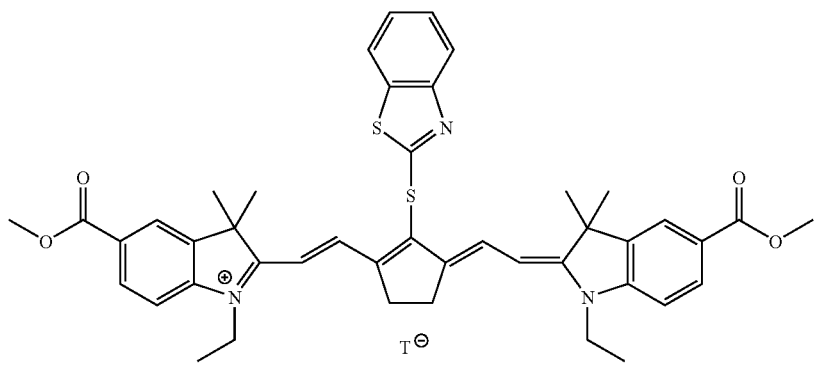
A-92)
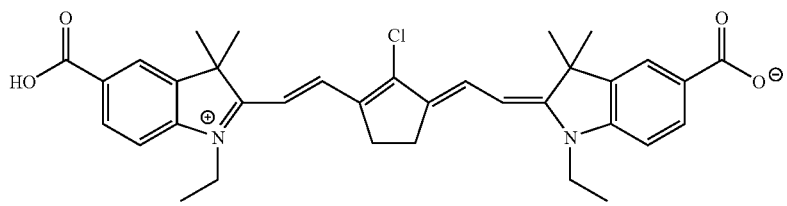
A-93)
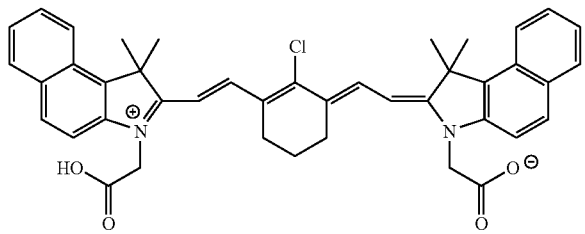
A-94)
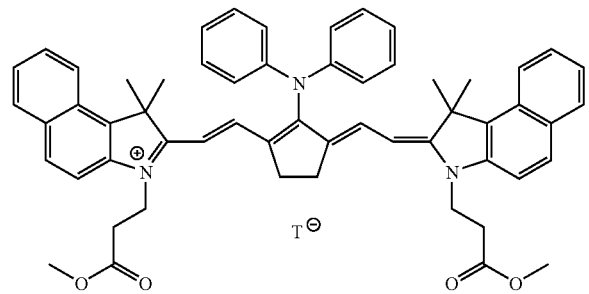
A-95)
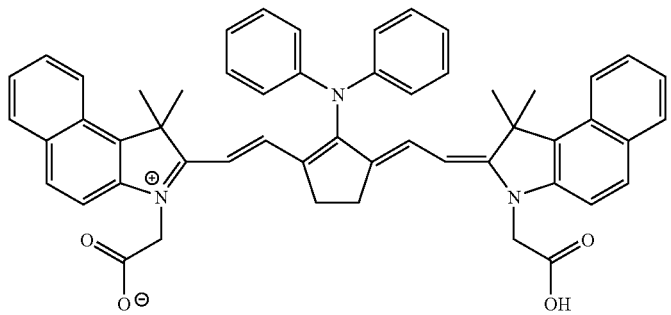

-continued
A-96)
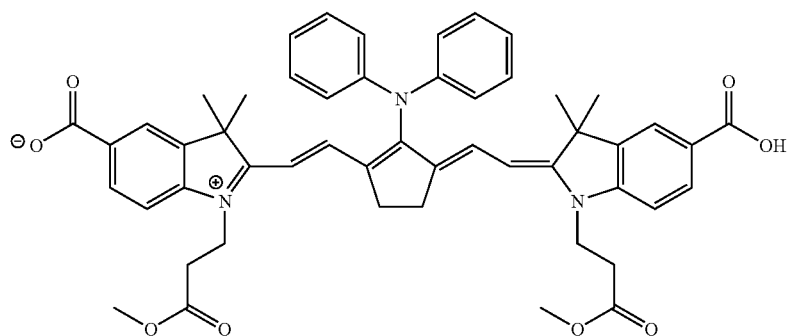
A-97)
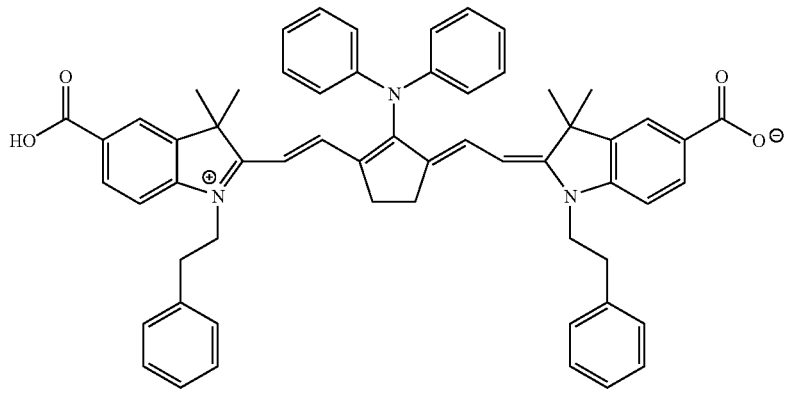
A-98)
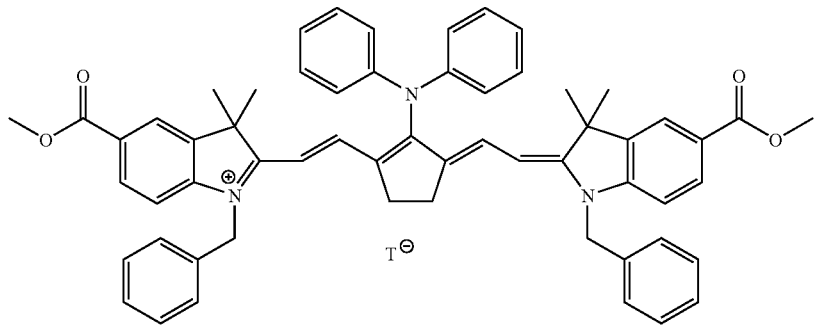
A-99)
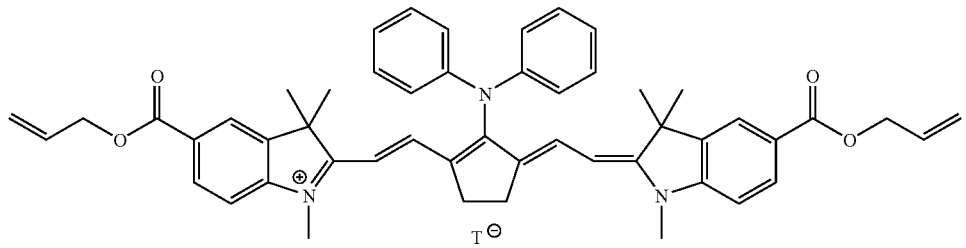
A-100) A-101)
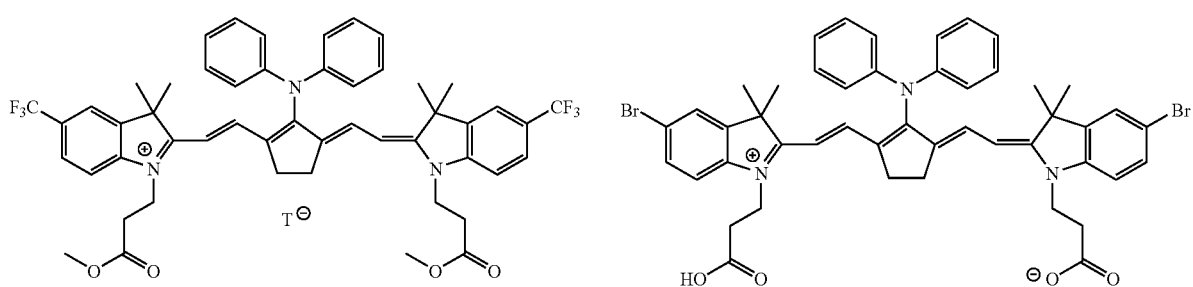

-continued

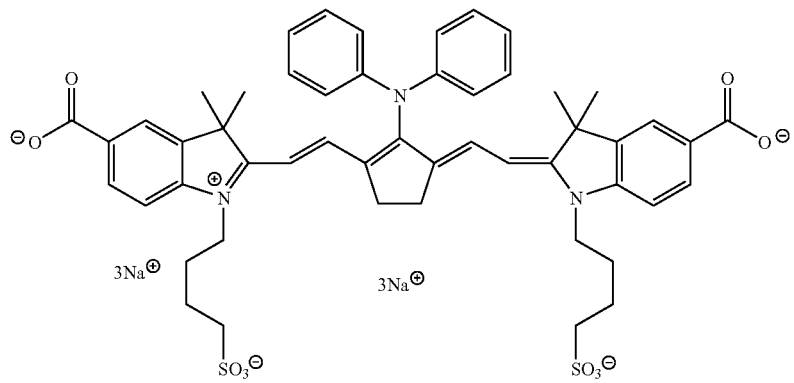

A-102)

In the structural formulae A-1 to A-38, A-43 to A53, (excluding A-22, A-30, A-44 and A-51), A-64, A-65, A-73 to A-78, A-80, A-81, A-83 to A-85, A-87 to A-91, A-94, and A-98 to A-100, T⁻ represents a monovalent counter anion.

As the counter anion in the case where the specific dye of the invention has a monovalent counter ion, a halogen anion (F⁻, Cl⁻, Br⁻ or I⁻), a Lewis acid anion (BF$_4^-$, PF$_6^-$, SbCl$_6^-$ or ClO$_4^-$), an alkylsulfonic acid anion, and an arylsulfonic acid anion are preferred.

Examples of the alkyl group in the structure of the alkylsulfonic acid anion include a straight, branched or cyclic alkyl group having 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, a s-butyl group, a t-butyl group, an isopentyl group, a neopentyl group, a 1-methyl-butyl group, an isohexyl group, a 2-ethylhexyl group, a 2-methylhexyl group, a cyclohexyl group, a cyclopentyl group and a 2-norbornyl group. Of these, a straight alkyl group having 1 to 12 carbon atoms, a branched alkyl group having 3 to 12 carbon atoms and a cyclic alkyl group having 5 to 10 carbon atoms are preferred.

Examples of the arylsulfonic acid anion include anions having one benzene ring, anions wherein two or three benzene rings are condensed, and anions wherein a benzene ring and an unsaturated 5-membered ring are condensed to each other. Specific examples thereof include anions having a phenyl group, naphthyl group, anthryl group, phenanthryl group, indenyl group, acenaphthenyl group or fluorenyl group. Of these, anions having a phenyl group or a naphthyl group are preferred.

The alkyl group and the aryl group may have a substituent. Preferred examples thereof include a halogen atom, an alkyl group, an aryl group, a hydroxyl group, an alkoxy group, a cyano group, a sulfonamido group, an amino group, an amido group, an alkenyl group, a carboxyl group and an ester group.

Additionally, of the monovalent counter anions, a sulfonic acid anion and a Lewis acid anion are particularly preferred, and BF$_4^-$ and PF$_6^-$ are more preferred, in view of ease of synthesis and stability.

In view of sensitivity and film properties, the addition amount of the specific dye (A) in the polymerizable composition of the invention is preferably from 0.01 to 40% by weight, more preferably from 0.1 to 20% by weight, most preferably from 1 to 15% by weight, based on the weight of the total solid components.

Additionally, the polymerizable composition of the invention using the specific dye having an alkali water-soluble group is free from the fear of remaining of unnecessary dyes upon development and re-deposition of insoluble dyes onto non-image areas, which occur when ordinary dyes are added in a large amount, even when the specific dye is added in an amount exceeding 40% by weight based on the weight of the total solid components. Therefore, the composition of the invention has the advantage that it has a great latitude in the addition amount of the dye depending upon the purpose of the addition such as enhancement of sensitivity.

The specific dye is indispensable in the polymerizable composition but, in the case of, for example, using in a film such as a recording layer of an image-recording material, the dye is not necessarily contained in the same layer containing other components, and the same advantages may be obtained by providing a separate layer different from a layer containing other components to form a plural-layer structure, and adding the dye to the different layer.

In the invention, the soluble specific dye must be soluble in an organic solvent in view of production adaptability as has been described hereinbefore. This means that it suffices for the dye to be soluble in a coating solvent used for the polymerizable composition containing the dye, and does not necessarily mean that the dye must be soluble in all of specific organic solvents. The organic solvent to be used as the coating solvent is not particularly limited, and known ones may be used with no particular limitation. Examples thereof include alcoholic solvents such as methanol, ethanol, propanol, 2-propanol, 1-butanol, 1-methoxy-2-propanol, diethylene glycol, 1-hexanol, 3-methyl-1-pentanol, cyclohexanol, ethylene glycol, 1,4-butanediol, cyclopentanol, 2-ethoxyethanol and tetrahydrofurfuryl alcohol; halogen-containing solvents such as dichloromethane, chloroform, 1,2-dichloroethane, chlorobenzene and fluorobenzene; aromatic hydrocarbon solvents such as toluene, benzene, mesitylene, xylene and t-butylbenzene; hydrocarbon solvents such as pentane, hexane, heptane, octane and decane; ether solvents such as tetrahydrofuran, diisopropyl ether, 2-methyltetrahydrofuran, tetrahydropyran, anisole, cyclopentene oxide, 1,3-dioxane and 1,4-dioxane; ketone solvents such as acetone, 2-butanone, cyclohexanone, cyclopentanone, 3-methyl-2-butanone, acetophenone and 3-pentanone; ester solvents such as ethyl acetate, butyl acetate, ethylene glycol monoacetate, γ-butyrolactone, methyl methacrylate and ethyl acrylate; amine solvents such as triethylamine and pyridine; amide solvents such as dimethylacetamide and dimethylformamide; and other solvents such as dimethylsulfoixide and acetonitrile. Any liquid that contains carbon atoms may be used. Also, the above-mentioned solvents may be used as a mixture thereof. Preferred examples of the organic solvent to be used in the polymerizable composition of the invention include alcoholic solvents or organic solvents having polarity such as ketone solvents, ester solvents and dimethylacetamide.

Additionally, conventionally known infrared-absorbing agents may be added to the polymerizable composition of the invention in addition to the specific dye (A), if necessary, within a range of not spoiling the advantages of the invention.

[Radical Polymerization Initiator (B)]

The radical polymerization initiator (B) means a compound which generates a radical by the energy of light, heat or both of them and initiates and accelerates polymerization of a compound having an ethylenically unsaturated compound (C) to be described hereinafter. As the radical-generating agent of the invention, a proper one may be selected to use from among known thermal polymerization initiators, compounds having a bond with a small bond dissociation energy, and photo polymerization initiators.

Examples of such radical-generating agent include organic halide compounds, carbonyl compounds, organic peroxides, azo polymerization initiators, azide compounds, metallocene compounds, hexaaryl biimidazole compounds, organic boric acid compounds, disulfonic acid compounds, oxime ester compounds and onium salt compounds.

Specific examples of the organic halide compounds include those described in, for example, Wakabayashi et al., *Bull Chem. Soc. Japan,* 42, 2924 (1969), U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, and M. P. Hutt, *Journal of Heterocyclic Chemistry,* 1 (No. 3), (1970). In particular, oxazole compounds substituted by a trihalomethyl group and s-triazine compounds are illustrated.

More preferred examples of the halide compounds include s-triazine derivatives wherein at least one of mono-, di- and tri-halosubstituted methyl group is bound to s-triazine ring, specifically, 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4m6-bis(trichloromethyl)-s-triazine, 2-(p-i-propoxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichoromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine and 2-methoxy-4,6-bis(tribromomethyl)-s-triazine.

Examples of the carbonyl compounds include benzophenone derivatives such as benzophenone, Michler's ketone, 2-methylbenzophenone, 3-methylbenzophenone, 4-methylbenzophenone, 2-chlorobenzophenone, 4-bromobenzophenone and 2-carboxybenzophenone; acetophenone derivatives such as 2,2-dimethoxy-2-phenylacetophenone, 2,2-diethoxyacetophenone, 1-hydroxycyclohexylphenylketone, α-hydroxy-2-methylpneylpropanone, 1-hydroxy-1-methylethyl-(p-isopropylphenyl)ketone, 1-hydroxy-1-(p-dodecylophenyl)ketone, 2-methyl-(4'-(methylthio)phenyhl)-2-morpholino-1-propanone and 1,1,1-trichloromethyl-(p-butylphenyl)ketone; tioxanthone derivatives such as thioxanthone, 2-ethylthioxanthone, 2-isopropylthioxanthone, 2-chlorpthioxanthone, 2,4-dimethylthioxanthone, 2,4-diethylthioxanthone and 2,4-diisopropylthioxanthone; and benzoate derivatives such as ethyl p-dimethylaminobenzoate and ethyl p-diethylaminobenzoate.

Examples of the azo compounds to be used include azo compounds described in JP-A-8-108621.

Examples of the organic peroxy compounds include trimethylcyclohexanone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane 2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic acid peroxide, benzoyl peroxide, 2,4-dichlorobenzoyl peroxide, diisopropyl peroxy dicarbonate, di-2-ethylhexyl peroxy dicarbonate, di-2-ethoxyethyl peroxy dicarbonate, dimethoxyidopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxylaurate, 3,3',4,4'-tetra-(t-butyl peroxycarbonyl)benzophenone, 3,3',4,4'-tetra-(t-hexyl peroxycarbonyl)benzophenone, 3,3',4,4'-tetra-(-isopropylcumyl peroxycarbonyl)benzophenone, carbonyldi(t-butyl peroxy dihydrogen diphthalate) and carbonyldi(t-hexyl peroxy dihydrogen diphthalate).

Examples of the metallocene compounds include various titanocene compounds described in JP-A-59-152396, JP-A-61-151197, JP-A-63-41484, JP-A-2-249, JP-A-2-4705 and JP-A-5-83568, such as di-cyclopentadienyl-Ti-bis-phenyl, di-cyclopentadienyl-Ti-bis-2,6-difluorophen-1-yl, di-cyclopentadienyl-Ti-bis-2,4-difluorophen-1-yl, di-cyclopentadienyl-Ti-bis-2,4,6-trifluorophen-1-yl, di-cyclopentadienyl-Ti-bis-2,3,5,6-tetrafluorophen-1-yl, di-cyclpnentadienyl-Ti-bis-2,3,4,5,6-pentafluorophen-1-yl, di-methylcyclopentadienyl-Ti-bis-2,6-difluorophen-1-yl,dimethylcyclopentadienyl-Ti-bis-2,4,6-trifluorophen-1-yl, di-methylcycloOpentadienyl-Ti-bis-2,3,5,6-tetrafluorophen-1-yl and di-methylcyclopentadienyl-Ti-bis-2,3,4,5,6-pentafluorophen-1-yl, and iron-arene complexes described in JP-A-1-304453 and JP-A-1-152109.

Examples of the hexaarylbiimidazole compounds include various compounds described in, for example, JP-B-6-29285, U.S. Pat. Nos. 3,479,185, 4,311,783 and 4,622,286, specifically, 2,2'-bis(o-chlorophenyl)4,4',5,5'-tetraphenylbiimidazole, 2,2'-bis(o-bromophenyl)-4,4',5,5'-tetraphenylbiimidazole, 2,2'-bis(o, p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Specific examples of the organic boric acid salt compounds include organic boric acid salts described in JP-A-62-143044, JP-A-62-150242, JP-A-9-188685, JP-A-9-188686, JP-A-9-188710, JP-A-2000-131837, JP-A-2002-107916, Japanese Patent 2764769 and Japanese Patent Application No. 2000-310808., and Kunz, Martin, *Rad Tech*, 98. Proceeding Apr. 19-22, 1998, Chicago; organic boron sulfonium complexes or organic oxosulfonium complexes described in JP-A-6-157623, J-A-6-175564 and JP-A-6-175561, organic boron iodonium complexes described in JP-A-6-175554 and JP-A-6-175553; organic boron phosphonium complexes described in JP-A-9-188710 and organic boron-coordinated transition metal complexes described in JP-A-6-348011, JP-A-7-128785, JP-A-7-140589, JP-A-7-306527 and JP-A-7-292014.

Examples of the disulfone compounds include those compounds which are described in JP-A-61-166544 and Japanese Patent Application No. 2001-132318.

Examples of the oxime ester compounds include those compounds which are described in *J. C. S. Perkin II* (1979), pp.1653-1660, *J. C. S. Perkin II* (1979) pp.1566-162, *Journal of Photopolymer Science and Technology* (1995), pp.202-232, JP-A-2000-66385 and JP-A-2000-80068, and specific examples are the following compounds.

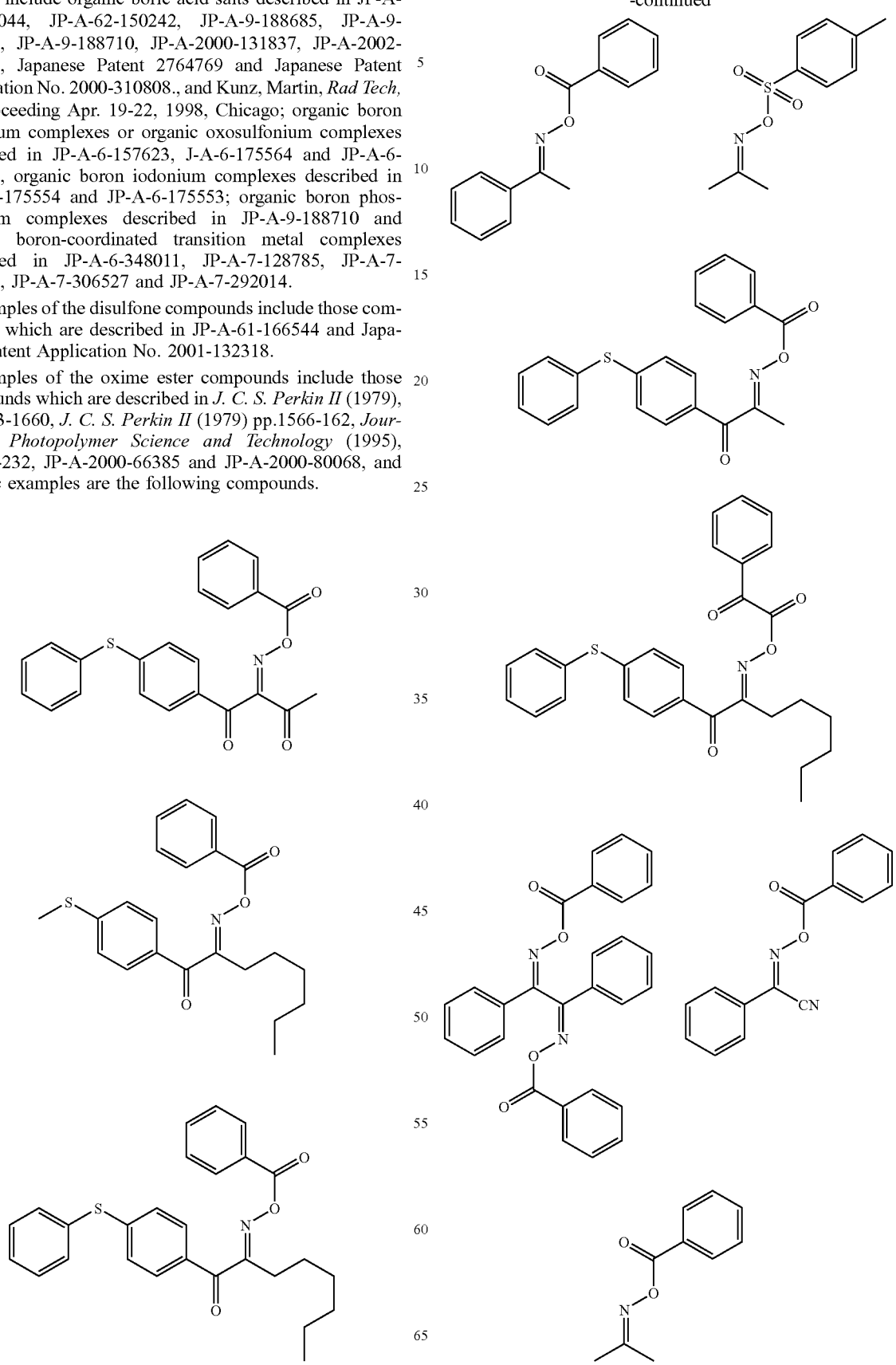

-continued

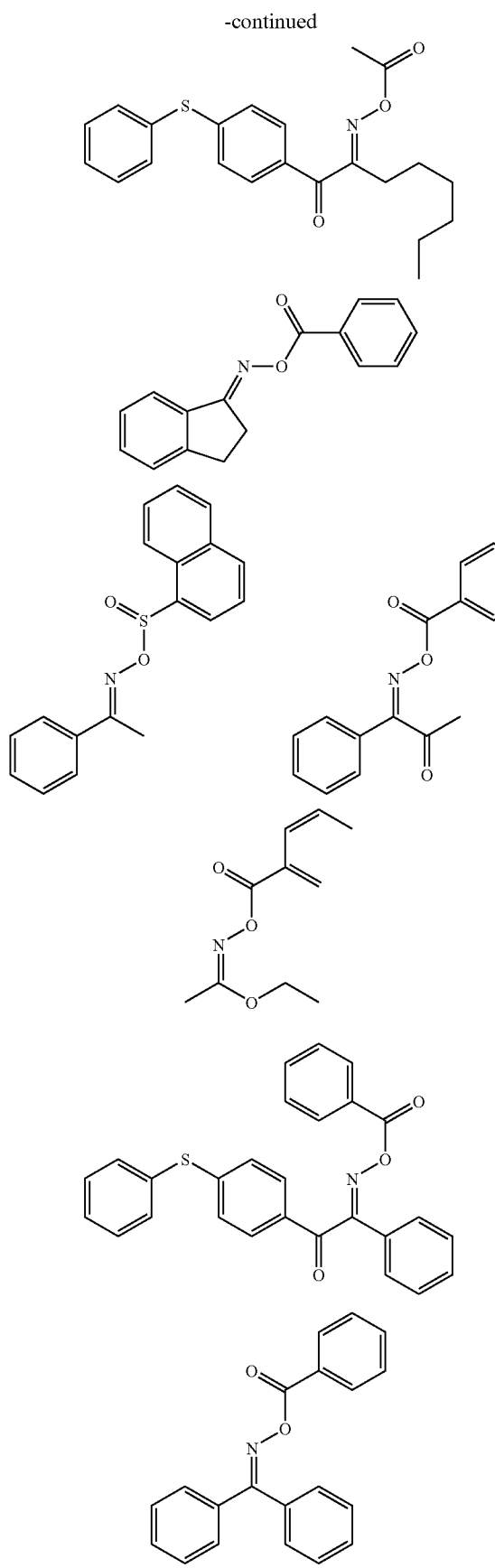

-continued

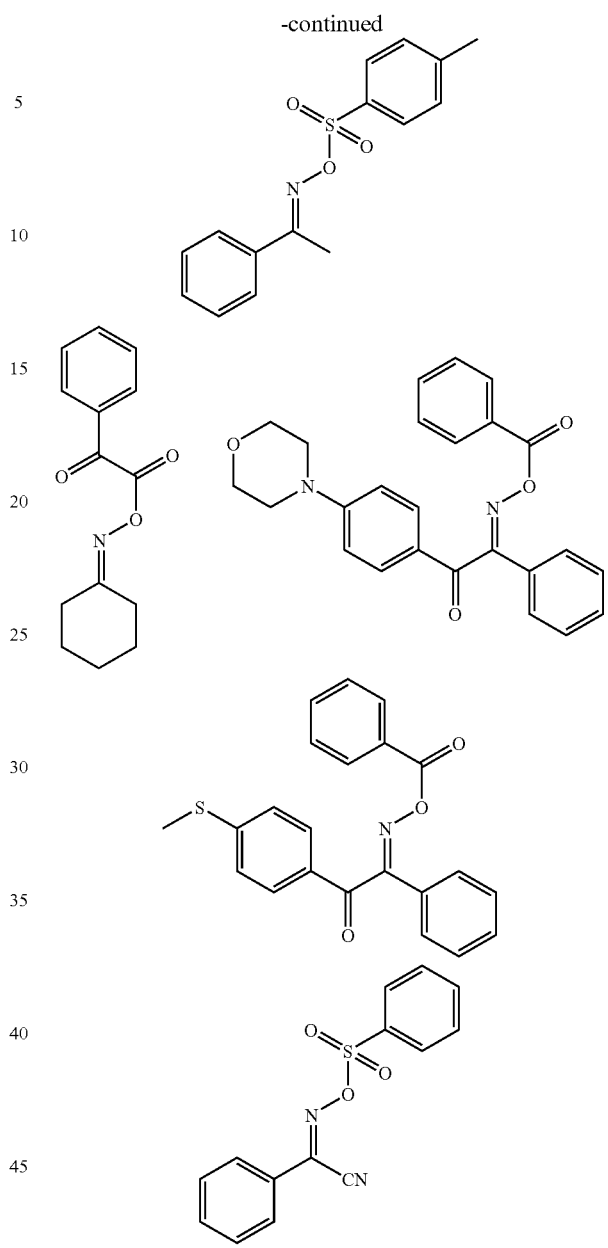

Examples of the onium salt compounds include onium salts such as diazonium salts described in S. I. Schlesinger, *Photgra. Sci. Eng.,* 18, 387 (1974) and T. S. Bal et al., *Polymer,* 21, 423 (1980); ammonium salts described in U.S. Pat. No. 4,069,055 and JP-A-4-365049; phosphonium salts described in U.S. Pat. Nos. 4,069,055 and 4,069,056; iodonium salts described in European Patent No. 104,143, U.S. Pat. Nos. 5,041,358 and 4,491,628, JP-A-2-150848 and JP-A-2-296514; sulfonium salts described in European Patent Nos. 370,693, 390,214, 233,567, 297,443 and 297, 442, U.S. Pat. Nos. 4,933,377, 4,933,373, 4,491,628, 5,041, 358, 4,760,013, 4,734,444 and 2,833,827, German Patent Nos. 2,904,626, 3,604,580 and 3,604,581; selenonium salts described in J. V. Crivello et al., *Macromolecules,* 10(6), 1307 (1977) and J. V. Crivello et al., *J. Polymer Sci., Polymer Chem. Ed.,* 17, 1047 (1979); and arsonium salts described in C. S. Wen et al., *Teh, Proc. Conf. Rad. Curing*

ASIA, p. 478 Tokyo, October (1988). In particular, in view of reactivity and stability, diazonium salts, iodonium salts and sulfonium salts are illustrated. In the invention, these onium salts function as an ionic radical polymerization initiator.

It is the onium salt that is preferably used in the invention as the radical polymerization initiator (B) In view of sensitivity and stability, onium salts represented by the following formulae (RI-I) to (RI-III) are more preferred.

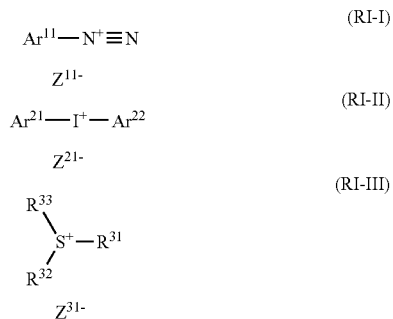

In formula (RI-I), $Ar^{11}$ represents an aryl group having 20 or less carbon atoms, which may have 1 to 6 substituents. Preferred examples of the substituent are an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms.

$Z^{11}$ represents a monovalent anion and is a halide ion, a perchlorate ion, a hexafluorophosphate ion, a tetrafluoroborate ion, a sulfonate ion, a sulfinate ion, a thiosulfonate ion or a sulfate ion. In view of stability, a perchlorate ion, a hexafluorophosphate ion, a tetrafluoroborate ion, a sulfonate ion and a sulfinate ion are preferred.

In formula (RI-II), $Ar^{21}$ and $Ar^{22}$ each independently represents an aryl group having 20 or less carbon atoms, which may have 1 to 6 substituents. Preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms.

$Z^{21}$ represents a monovalent anion and is a halide ion, -a perchlorate ion, a hexafluorophosphate ion, a tetrafluoroborate ion, a sulfonate ion, a sulfinate ion, a thiosulfonate ion or a sulfate ion. In view of stability and reactivity, a perchlorate ion, a hexafluorophosphate ion, a tetrafluoroborate ion, a sulfonate ion, a sulfinate ion and a carboxylate ion are preferred.

In formula (RI-III), $R^{31}$, $R^{32}$ and $R^{33}$ each independently represents an aryl group having 20 or less carbon atoms, which may have 1 to 6 substituents, or represents an alkyl group, an alkenyl group or an alkynyl group. In view of reactivity and stability, an aryl group is preferred. Preferred examples of the substituent include an alkyl group having from 1 to 12 carbon atoms, an alkenyl group having from 1 to 12 carbon atoms, an alkynyl group having from 1 to 12 carbon atoms, an aryl group having from 1 to 12 carbon atoms, an alkoxy group having from 1 to 12 carbon atoms, an aryloxy group having from 1 to 12 carbon atoms, a halogen atom, an alkylamino group having from 1 to 12 carbon atoms, a dialkylamino group having from 1 to 12 carbon atoms, an alkylamido or arylamido group having from 1 to 12 carbon atoms, a carbonyl group, a carboxyl group, a cyano group, a sulfonyl group, a thioalkyl group having from 1 to 12 carbon atoms, and a thioaryl group having from 1 to 12 carbon atoms.

$Z^{31}$ represents a monovalent anion and is a halide ion, a perchlorate ion, a hexafluorophosphate ion, a tetrafluoroborate ion, a sulfonate ion, a sulfinate ion, a thiosulfonate ion or a sulfate ion. In view of stability and reactivity, a perchlorate ion, a hexafluorophosphate ion, a tetrafluoroborate ion, a sulfonate ion, a sulfinate ion and a carboxylate ion are preferred. In particular, carboxylate ions described in Japanese Patent Application No. 2001-177150 and a halide ion are preferred, and carboxylate ions described in Japanese Patent Application Nos. 2001-177150 and 2000-266797 are more preferred.

Onium salts particularly preferably used in the invention have a structure of formula (RI-III) wherein all of $R^{31}$, $R^{32}$ and $R^{33}$ respectively represent aryl groups, more preferably two or more of the aryl groups are substituted by an electron attractive group, most preferably all of $R^{31}$, $R^{32}$ and $R^{33}$ respectively present aryl groups substituted by a halogen atom.

Specific examples of the radical polymerization initiator (B) to be preferably used in the polymerizable composition of the invention are illustrated below which, however, are not to be construed as limiting the invention.

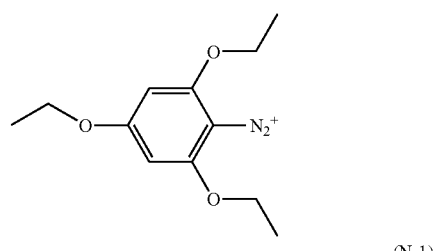

(N-1)

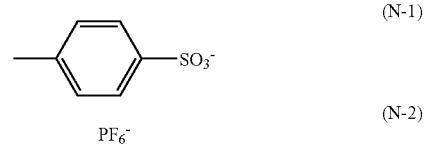

(N-2)

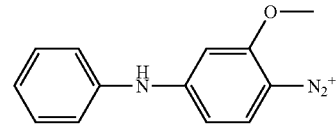

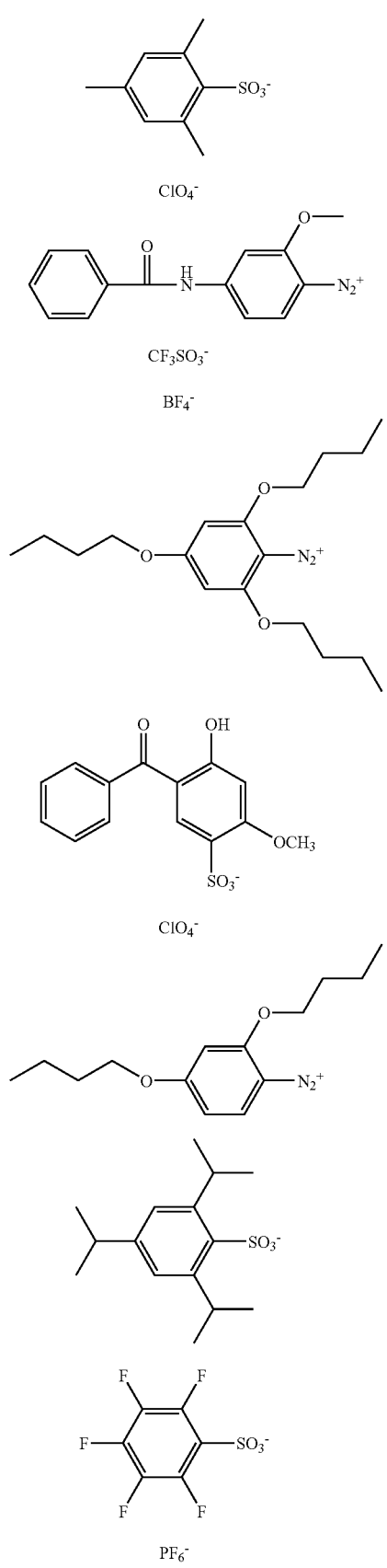
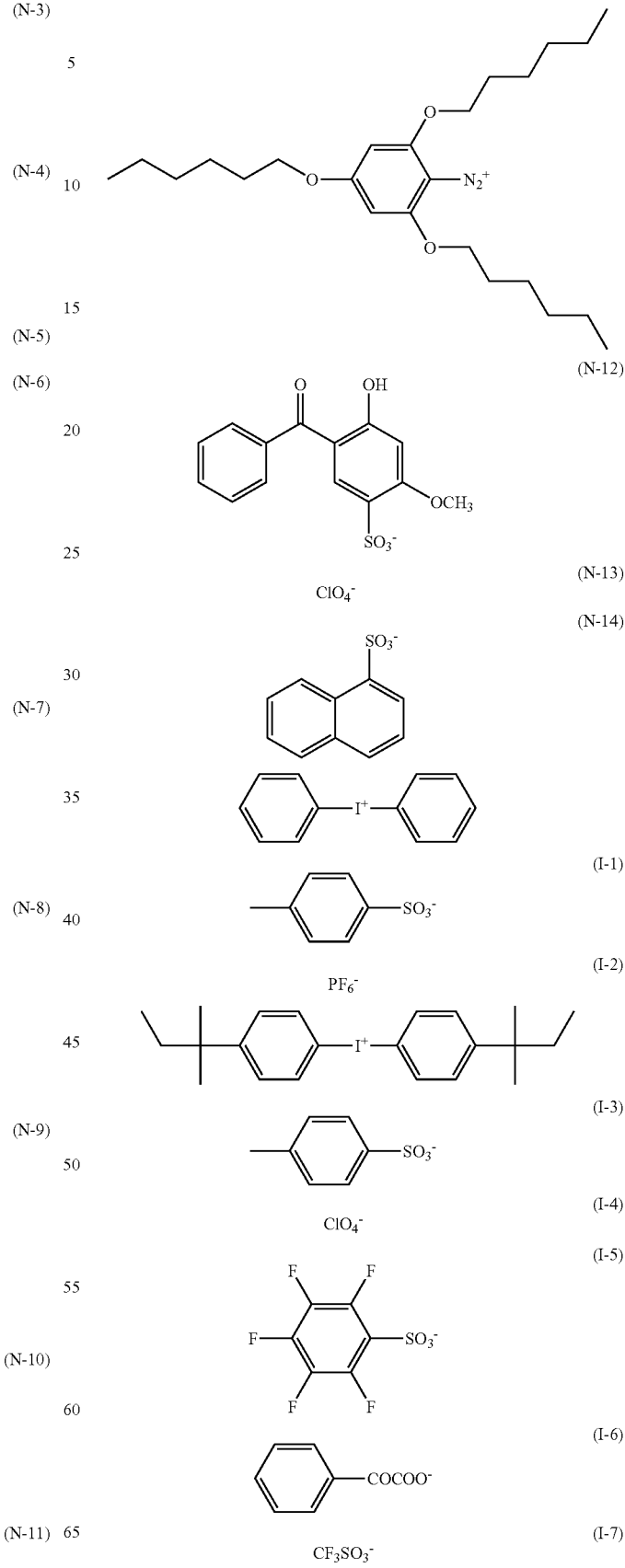

-continued
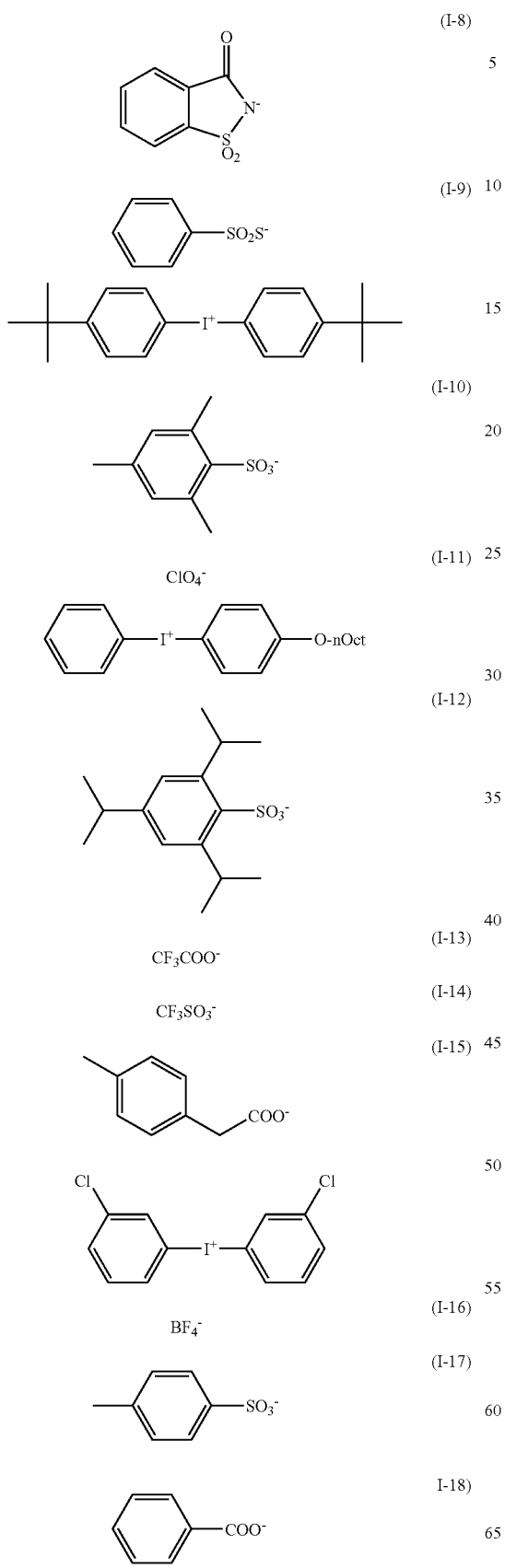
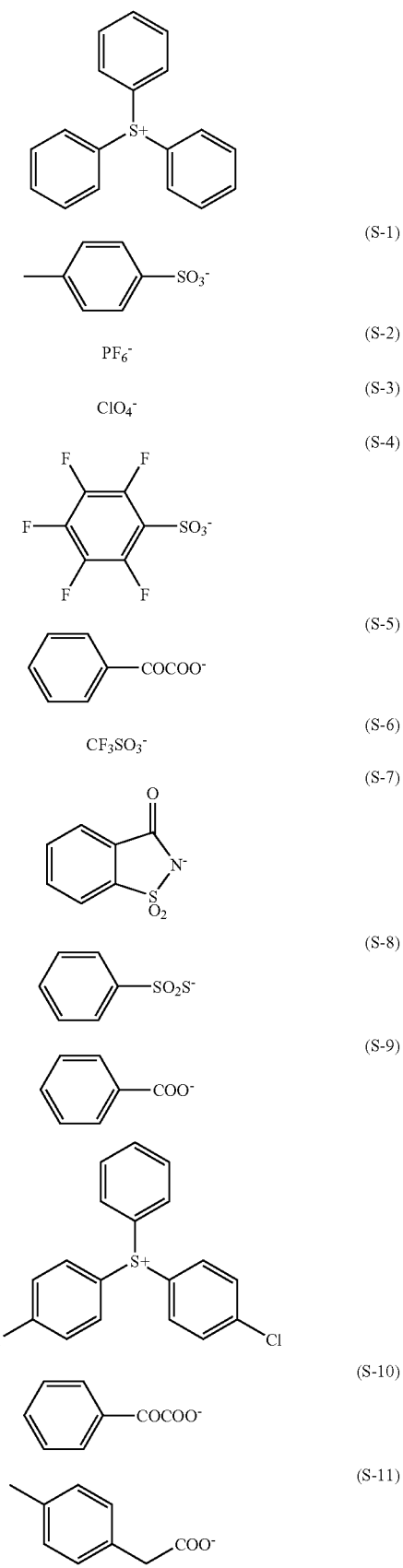

-continued

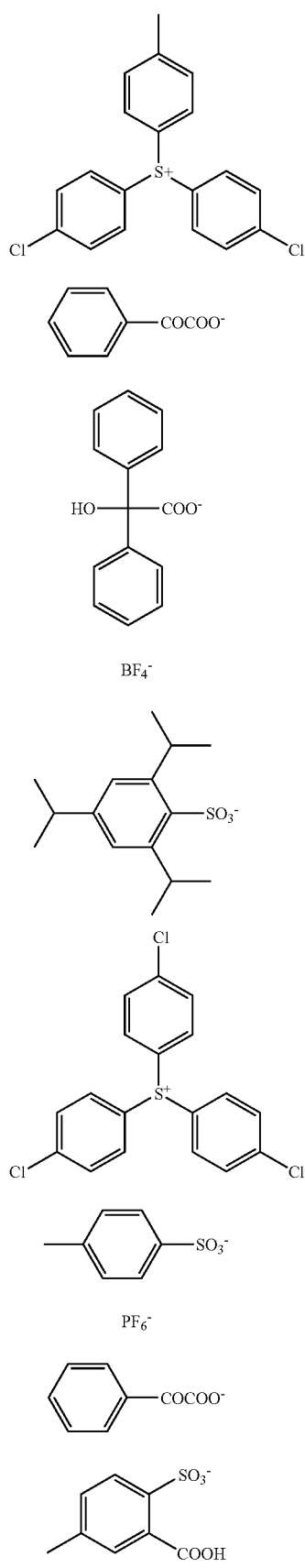

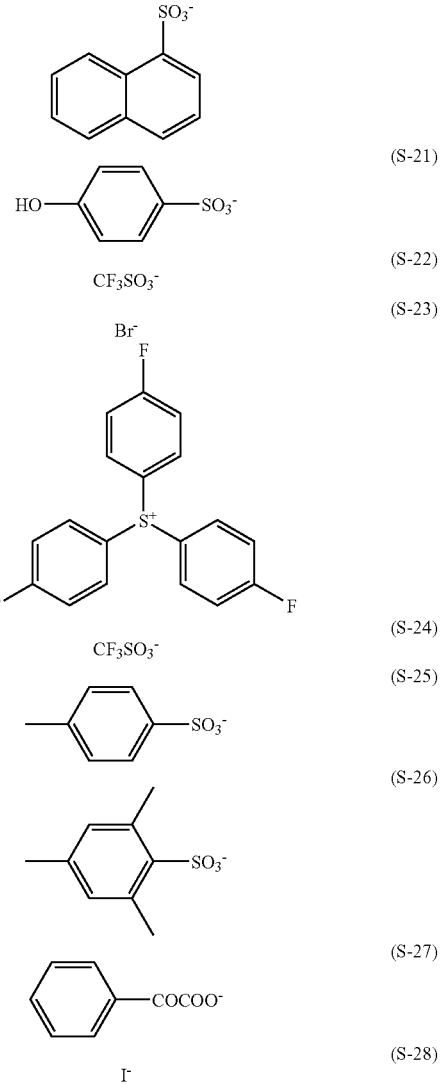

The radical polymerization initiator (B) to be used in the invention has a maximum absorption wavelength of preferably 400 nm or less, more preferably 360 nm or less. To select the radical polymerization initiator having the absorption wavelength in a UV ray region enables one to handle the polymerizable composition under a white light lamp.

In view of sensitivity and the effect of preventing the film in unexposed areas from remaining, the addition amount of the radical polymerization initiator (B) is preferably from 0.1 to 50% by weight, more preferably from 0.5 to 30% by weight, particularly preferably from 1 to 20% by weight, based on the weight of the total solid components in the polymerizable composition.

These radical polymerization initiators (B) may be used independently or in combination of two or more thereof.

[(C) Compound Having an Ethylenically Unsaturated Bond]

The compound (C) having an ethylenically unsaturated bond to be used in the invention (hereinafter sometimes referred to as "polymerizable compound") is preferably an addition polymerizable compound having at least one ethylenically unsaturated double bond, and is preferably selected from among compounds having at least one, preferably two or more, terminal ethylenically unsaturated bonds. Such compounds are widely known in the field of this industry, and may be used in the invention with no particular limitations. These include those compounds which are in a chemical form of monomers, prepolymers, i.e., dimmer, trimer or oligomer, and in a mixture form thereof and in a copolymer form thereof.

Examples of the monomers and copolymers thereof include unsaturated carboxylic acids (for example, acrylic acid, methacrylic acid, itaconic acid, crotonic acid, isocrotonic acid and maleic acid), and esters or amides thereof. Preferably, an ester between an unsaturated carboxylic acid and an aliphatic polyhydric alcohol, and an amide between an unsaturated carboxylic acid and an aliphatic polyamine compound are used. Also, an addition reaction product between an unsaturated carboxylic acid ester or amide having a nucleophilic substituent such as a hydroxyl group, an amino group or a mercapto group and a monofunctional or polyfunctional isocyanate or epoxy compound, and a dehydration condensation reaction product with a monofunctional or polyfunctional carboxylic acid are preferably used.

Also, addition reaction product between an unsaturated carboxylate or amide having an electrophilic substituent such as an isocyanato group or an epoxy group and a monofunctional or polyfunctional alcohol, amine or thiol, and a substitution reaction product between an unsaturated carboxylate or amide having an eliminatable substituent such as a halogen atom or a tosyloxy group and a monofunctional or polyfunctional alcohol, amine or thiol are also preferred. As other examples, compounds wherein the above-mentioned unsaturated carboxylic acids are replaced by unsaturated phosphonic acid, styrene or vinyl ether may also possibly be used.

Specific examples of the monomer of ester between an aliphatic polyhydric alcohol compound and an unsaturated carboxylic acid include: acrylates such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethyleneglycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer;

methacrylates such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylethane and bis-[p-(methacryloxyethoxy)phenyl]dimethylmethane;

itaconates such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonates such as ethylene glycol dicrotonate, tetramethylene glycol dicrotonate, pentaerythritol dicrotonate and sorbitol tetracrotonate; isocrotonates such as ethylene glycol diisocrotonate, pentaerythritol diisocrotonate and sorbitol tetraisocrotonate;

and maleates such as ethylene glycol dimaleate, triethylene glycol dimaleate, pentaerythritol dimaleate and sorbitol tetramaleate.

Examples of other esters to be preferably used include aliphatic alcohol-based esters described in JP-B-46-27926, JP-B-51-47334 and JP-A-57-196231, aromatic skeleton-having esters described in JP-A-59-5240, JP-A-59-5241 and JP-A-2-226149, and amino group-having esters described in JP-A-1-165613.

Further, the aforementioned ester monomers may be used as a mixture thereof.

Also, specific examples of the amide monomer between an aliphatic polyamine compound and an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide and xylylenebismethacrylamide.

Examples of other preferred amide-based monomer include those which have a cyclohexylene structure as described in JP-B-54-21726.

Also, urethane-based addition polymerizable compounds produced by addition reaction between isocyanate and hydroxyl group are preferred. Specific examples thereof include vinylurethane compounds which have two or more polymerizable vinyl groups per molecule and which are prepared by adding a hydroxyl group-containing vinyl monomer represented by the following formula (g) to a polyisocyanate compound having two or more isocyanato groups per molecule, as described in JP-B-48-41798.

(g)

In formula (g), R and R' each independently represents a H atom or $CH_3$.

Also, urethane acrylates as described in JP-A-51-37193, JP-B-2-32293 and JP-B-2-16765, and urethane compounds having an ethylene oxide-based skeleton as described in JP-B-58-49860, JP-B-56-17654, JP-B-62-39417 and JP-B-62-39418 are preferred as well.

Further, use of addition polymerizable compounds having an amino structure or a sulfide stgructure within the molecule as described in JP-A-63-277653, JP-A-63-260909 and JP-A-1-105238 can provide a polymerizable composition extremely excellent in curing reaction rate.

Other examples include polyfunctional acrylates or methacrylates such as polyester acrylates as described in JP-A-48-64183, JP-B-49-43191 and JP-B-52-30490 and epoxyacrylates obtained by reacting an epoxy resin with (meth)acrylic acid. Also, there may be illustrated specific unsaturated compounds described in JP-B-46-43946, JP-B-1-40337 and JP-B-1-40336, and vinylphosphonic acid-based compounds described in JP-A-2-25493. In some cases, a perfluoroalkyl group-containing structure described in JP-A-61-22048 may preferably be used. Further, those described as phoro-curable monomers and oligomers in Nihon Secchaku Kyokaisi vol. 20, No.7, pp.300-308 may also be used.

Details on the use of the polymerizable compound as the compound (C) having an ethylenically unsaturated bond, such as type of structure of the compound, independent use or combined use, and addition amount thereof, may freely be decided depending upon designed performance of the final light-sensitive material. For example, they are selected from the following stand points. In the point of light-sensitive speed, a structure having a more content of the unsaturated group per molecule is preferred and, in many cases, compounds having two or more functional groups are preferred. In order to enhance strength of an image area, i.e., cured film, compounds having three or more functional groups are preferred and, further, it is also effective to adjust both sensitivity and strength by using in combination compounds having a different number of functional groups and a different polymerizable group (e.g., an acrylate, a methacrylate, a styrene-based compound or a vinyl ether-based compound). In some cases, compounds having a large molecular weight or compounds having a high hydrophobicity are not preferred with respect to developing speed or precipitation in a developing solution, though they are excellent in light-sensitive speed and film strength.

As to the compounding ratio of the compound (C) having an ethylenically unsaturated bond, a higher ratio is advantageous in view of sensitivity. However, an excessive ratio can cause unfavorable phase separation and problems in production steps due to viscous properties of the composition (for example, transfer of a component of the light-sensitive material, and production failure due to viscous properties) or, in the case of producing a lithographic printing plate precursor which is one example of the image-forming material, there can arise a problem such as precipitation from the developing solution. In view of these points, in the case of using for a recording layer of the image-recording material, too, the compounding ratio or content of the component (C) in the polymerizable composition of the invention is preferably from 20 to 70% by weight, more preferably from 25 to 50% by weight, based on the total solid components in the polymerizable composition.

Also, the compounds (C) having an ethylenically unsaturated bond may be used independently or in combination of two or more thereof.

In the case of using for the image-recording material, compatibility with other components in the recording layer (for example, a binder polymer, an initiator or a colorant) and dispersibility are also important factors in selecting and using the compound (C) having an ethylenically unsaturated bond. For example, in some cases, compatibility is improved by using a compound having a low purity or using two or more compounds in combination.

[(D) Binder Polymer]

The polymerizable composition of the invention is required to contain a binder polymer. As the binder polymer, a linear organic high molecular polymer is preferred to incorporate. As such "linear organic high molecular polymer", any linear organic high molecular polymer may be used. Preferably, those linear organic high molecular polymers are selected which are enough soluble or swellable in water or weakly alkaline water to make development with water or weakly alkaline water possible. The linear organic high molecular polymer is selected to use not only in view of a film-forming agent in the composition but in view of adaptability for water, weakly alkaline water or organic solvent developer. For example, use of a water-soluble organic high molecular polymer permits development with water. Examples of such linear organic high molecular polymer include addition polymers having a carboxylic acid group on the side chain, for example, those described in JP-A-59-44615, JP-B-54-34327, JP-B-58-12577, JP-B-54-25957, JP-A-54-92723, JP-A-59-53836 and JP-A-59-71048, and those described in Japanese Patent Application No. 2002-287920 formerly proposed by the applicant of the invention, i.e., methacrylic acid copolymers, acrylic acid copolymers, itaconic acid copolymers, crotonic acid copolymers, maleic acid copolymers, partially esterified maleic acid copolymers, 2-methacryloyloxyethyl succinate copolymers and 2-methacryloyloxyethyl hexahydrophthalate copolymers. Also, acidic cellulose derivatives having a carboxylic acid group on the side chain are illustrated. In addition, products obtained by adding a cyclic acid anhydride to an addition polymer having a hydroxyl group are useful.

In view of depressing damage by a developing solution, it is preferred to use, as the binder polymer (D), polymers such as 2-methacryloyloxyethyl succinate copolymer and 2-methacryloyloxyethyl hexahydrophthalatea copolymer, having a repeating unit represented by the following formula (I) described in Japanese Patent Application Nos. 2002-287920 and 2003-339717:

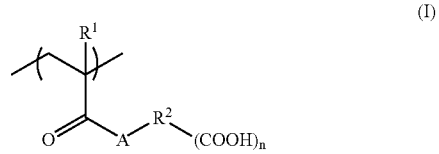

In formula (I), $R^1$ represents a hydrogen atom or a methyl group, $R^2$ represents a linking group constituted by 2 or more atoms selected from the group consisting of a carbon atom, a hydrogen atom, an oxygen atom, a nitrogen atom, a sulfur atom and a halogen atom, with the number of atoms being from 2 to 82, A represents an oxygen atom or —$NR^3$—, $R^3$ represents a hydrogen atom or a monovalent hydrocarbon group having from 1 to 10 carbon atoms, and n represents an integer of from 1 to 5.

In formula (I), the linking group represented by $R^2$ preferably has an alkylene structure or a structure wherein alkylene structures are linked to each other via an ester bond.

The repeating unit represented by formula (I) is described in detail below.

$R^1$ in formula (I) represents a hydrogen atom or a methyl group, particularly preferably a methyl group.

The linking group represented by $R^2$ in formula (I) is constituted by two or more atoms selected from the group consisting of a carbon atom, a hydrogen atom, an oxygen atom, a nitrogen atom, a sulfur atom and a halogen atom, with the number of atoms being from 2 to 82, preferably from 2 to 50, more preferably from 2 to 30. Where the linking group has a substituent, the number of atoms is a number of atoms including the substituent.

More particularly, the number of atoms constituting the main skeleton of the linking group represented by R2 is preferably from 1 to 30, more preferably from 3 to 25, still more preferably from 4 to 20, most preferably from 5 to 10. Additionally, "the main skeleton of the linking group" in the compound means an atom or atoms used only for linking A in formula (I) to the terminal COOH and, in the case where a plurality of linking routes exist, an atom or atoms constituting a linking route where the number of atoms are minimal.

Specific examples thereof include alkylene, substituted alkylene, arylene and substituted arylene. The linking group may have a structure wherein a plurality of these divalent groups are linked to each other via an amido bond or an ester bond.

Examples of the linking group having a chain structure include ethylene and propylene. A structure wherein these alkylenes are linked to each other via an ester bond is also illustrated as preferred one.

Of these, an (n+1)-valent hydrocarbon group having an aliphatic cyclic structure containing from 3 to 30 carbon atoms is preferred as the linking group represented by $R^2$ in formula (I). Specific examples include (n+1)-valent hydrocarbon group formed by removing (n+1) hydrogen atoms on an arbitrary carbon atom or atoms constituting an aliphatic cyclic structure such as cyclopropane, cyclopentane, cyclohexane, cycloheptane, cyclooctane, cyclodecane, dicyclohexyl, tercyclohexyl or norbornane which may be substituted by one or more arbitrary substituents. $R^2$ preferably contains from 3 to 30 carbon atoms including the substituent.

Any of one or more carbon atoms of the compound constituting the aliphatic cyclic structure may be replaced by a hetero atom selected from among nitrogen atom, oxygen atom or sulfur atom. In view of printing durability, R is preferably a (n+1)-valent hydrocarbon group having an aliphatic cyclic structure containing two or more rings and optionally having a substituent having from 5 to 30 carbon atoms, such as condensed polycyclic aliphatic hydrocarbon, bridged alicyclic hydrocarbon, spiro aliphatic hydrocarbon or aliphatic hydrocarbon ring assembly (wherein a plurality of rings are connected to each other through a bond or a linking group). In this case, too, the number of carbon atoms are the number of carbon atoms including the carbon atoms the substituent have.

The number of atoms with the linking group represented by $R^2$ is preferably from 5 to 10 atoms, and the linking group preferably has an ester bond or the cyclic structure as described above.

Examples of the substituent to be introduced into the linking group represented by $R^2$ include monovalent nonmetallic atoms excluding hydrogen, such as a halogen atom (—F, —Br, —Cl, —I), a hydroxyl group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group and the conjugate base group thereof, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—$SO_3H$) and the conjugate base group thereof, an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and the conjugate base group thereof, an N-alkylsulfonylsulfamoyl group (—$SO_2NHSO_2$(alkyl)) and the conjugate base group thereof, an N-arylsulfonylsulfamoyl group (—$SO_2NHSO_2$(aryl)) and the conjugate base group thereof, an N-alkylsulfonylcarbamoyl group (—$CONHSO_2$(alkyl)) and the conjugate base group thereof, an N-arylsulfonylcarbamoyl group (—$CONHSO_2$(aryl)) and the conjugate base group thereof, an alkoxysilyl group (—$Si(O\text{-alkyl})_3$), an aryloxysilyl group (—$Si(O\text{-aryl})_3$), a hydroxysilyl group (—$Si(OH)_3$) and the conjugate base group thereof, a phosphono group (—$PO_3H_2$) and the conjugate base group thereof, a dialkylphosphono group (—$PO_3$(alkyl)$_2$), a diarylphosphono group (—$PO_3$(aryl)$_2$), an alkylarylphosphono group (—$PO_3$(alkyl)(aryl)), a monoalkylphosphono group (—$PO_3H$(alkyl)) and the conjugate base group thereof, a monoarylphosphono group (—$PO_3H$(aryl)) and the conjugate base group thereof, a phosphonoxy group (—$OP_3H_2$) and the conjugate base group thereof, a dialkylphosphonoxy group (—$OPO_3$(alkyl)$_2$), a diarylphosphonoxy group (—$OPO_3$(aryl)$_2$), an alkylarylphosphonoxy group (—$OPO_3$(alkyl)(aryl)), a monoalkylphosphonoxy group (—$OPO_3H$(alkyl)) and the conjugate base group thereof, a monoarylphosphonoxy group (—$OPO_3H$(aryl)) and the conjugate base group thereof, a cyano group, a nitro group, a dialkylboryl group (—$B$(alkyl)$_2$), a diarylboryl group (—$B$(aryl)$_2$), an alkylarylboryl group (—$B$(alkyl)(aryl)), a dihydroxyboryl group (—$B(OH)_2$) and the conjugate base group thereof, an alkylhydroxyboryl group (—$B$(alkyl)(OH)) and the conjugate base group thereof, an arylhydroxyboryl group (—$B$(aryl)(OH)) and the conjugate base group thereof, an aryl group, an alkenyl group and an alkynyl group.

Substituents having a hydrogen atom capable of forming a hydrogen bond or substituents having an acidity of a smaller acid dissociation constant (pKa) than that of carboxylic acid are not preferred because they tend to deteriorate printing durability, though depending upon design of the recording layer. On the other hand, a halogen atom or a hydrophobic substituent such as a hydrocarbon group (an alkyl group, an aryl group, an alkenyl group or an alkynyl group), an alkoxy group or an aryloxy group is preferred because they tend to improve printing durability. In particular, in case where the cyclic structure is a 6-membered or smaller monocyclic aliphatic hydrocarbon such as cyclopentane or cyclohexane, it is preferred for the structure to have such hydrophobic substituent. If possible, the substituents may be connected to each other or to the hydrocarbon group to which they are connected, and the substituents may be further substituted.

$R^3$ in the case where A in formula (I) represents $NR^3$- represents a hydrogen atom or a monovalent hydrocarbon group having from 1 to 10 carbon atoms. Examples of the monovalent hydrocarbon group having from 1 to 10 carbon atoms, represented by $R^3$, include an alkyl group, an aryl group, an alkenyl group and an alkynyl group.

Specific examples of the alkyl group include straight, branched and cyclic alkyl groups having from 1 to 10 carbon atoms, such as a methyl group, an ethyl group, a propyl group, a butyl group, a pentyl group, a hexyl group, a heptyl group, an octyl group, a nonyl group, a decyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclopentyl group, a cyclohexyl group, a 1-adamantyl group and a 2-norbornyl group.

Specific examples of the aryl group include aryl groups having from 1 to 10 carbon atoms, such as a phenyl group, a naphthyl group and an indenyl group; and heteroaryl groups having from 1 to 10 carbon atoms and having one hetero atom selected from the group consisting of nitrogen atom, oxygen atom and sulfur atom, such as a furyl group, a thienyl group, a pyrrolyl group, a pyridyl group and a quinolyl group.

Specific examples of the alkenyl group include straight, branched and cyclic alkenyl groups, such as a vinyl group, a 1-propenyl group, a 1-butenyl group, a 1-methyl-1-propenyl group, a 1-cyclopentenyl group and a 1-cyclohexenyl group.

Specific examples of the alkynyl group include alkynyl groups having from 1 to 10 carbon atoms, such as an ethynyl group, a 1-propynyl group, a 1-butynyl group and a 1-octynyl group. Examples of the substituent which $R^3$ may have are the same as those illustrated as substituents to be introduced into $R^2$, provided that the number of carbon atoms of $R^3$ is from 1 to 10 including carbon atoms of the substituent.

A in formula (I) is preferably oxygen atom or —NH— due to ease of synthesis.

n in formula (I) represents an integer of from 1 to 5 and, in view of printing durability, n represents preferably 1.

Preferred specific examples of the repeating unit represented by formula (I), which constitutes a particularly preferred binder polymer, are illustrated below. However, they are not to be construed as limitative of the invention.

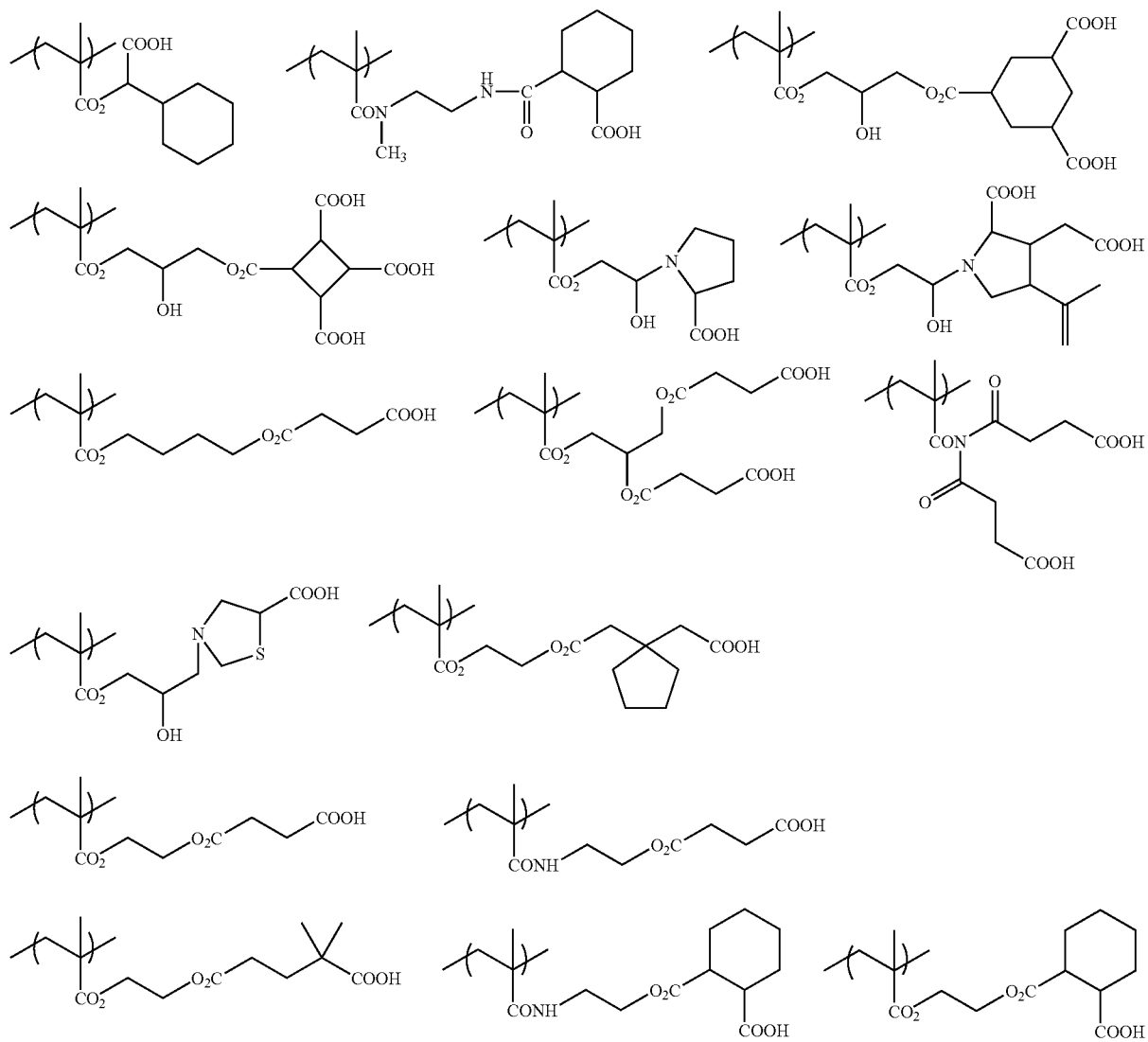

-continued
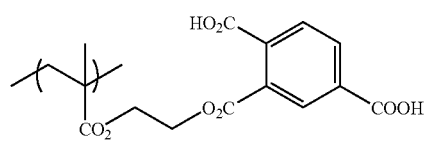
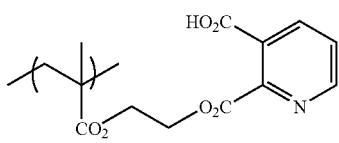
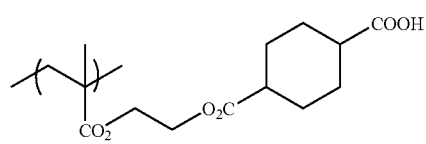
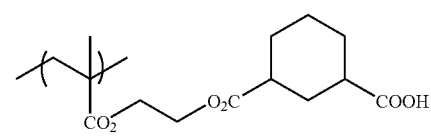
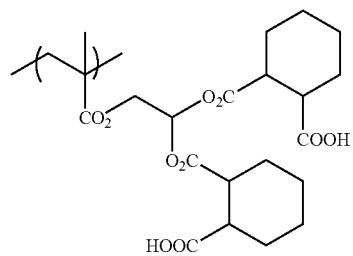
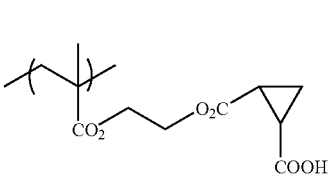
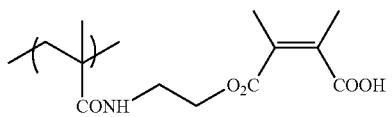
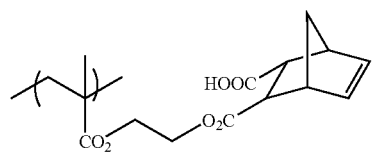
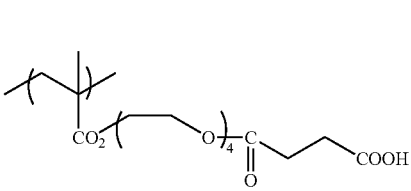
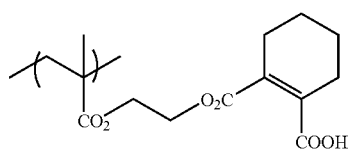
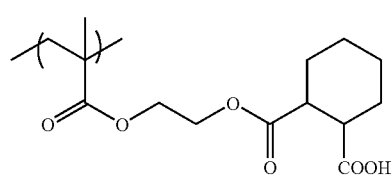
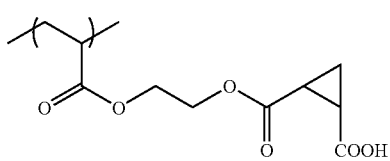
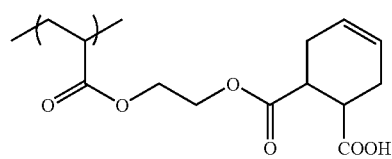
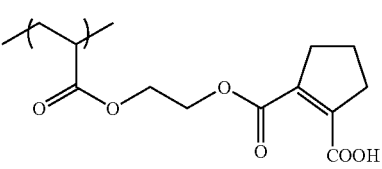
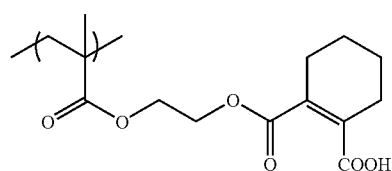
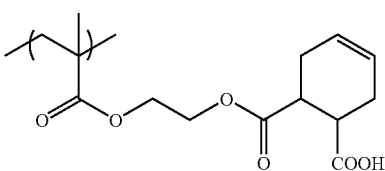
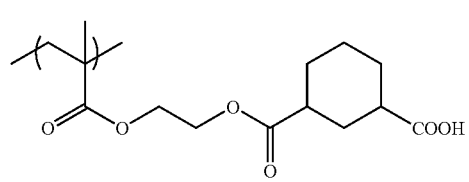
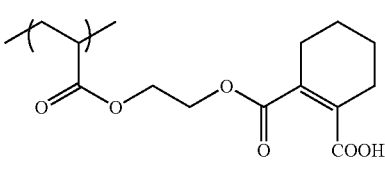
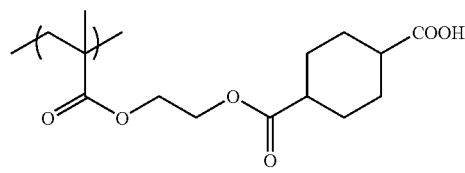
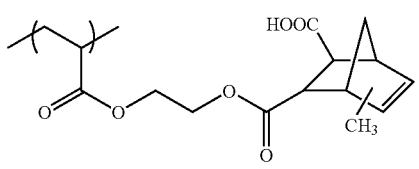

-continued
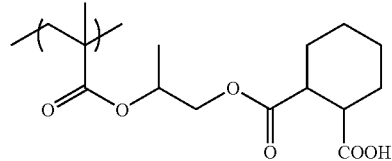 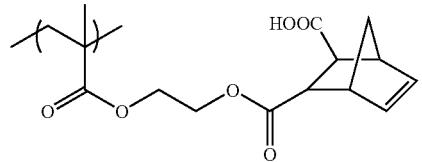
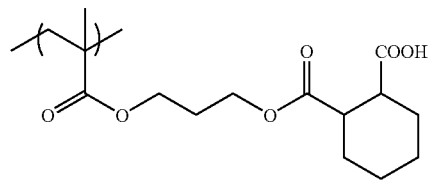 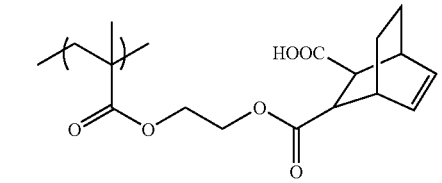
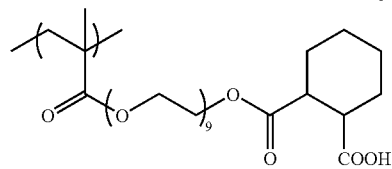 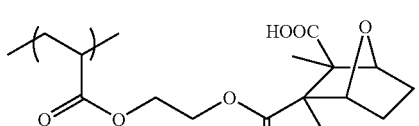
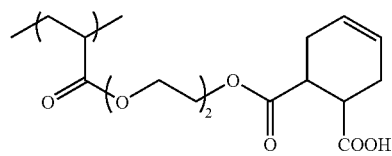 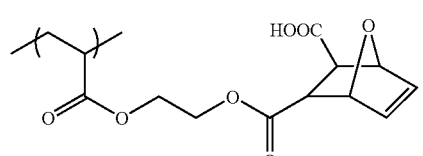
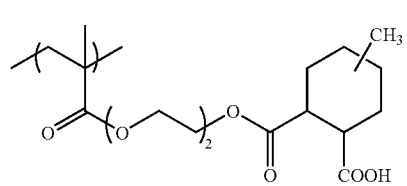 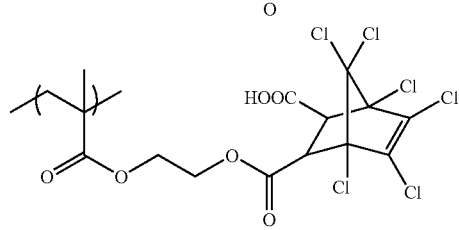
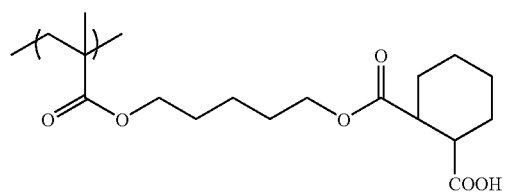 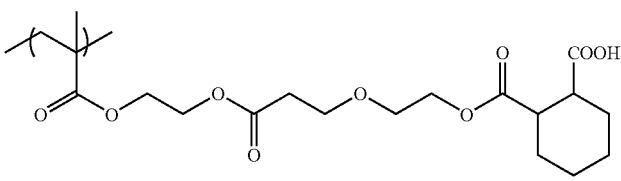
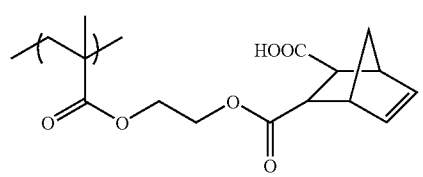 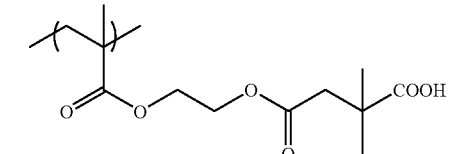
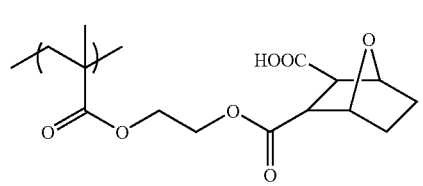 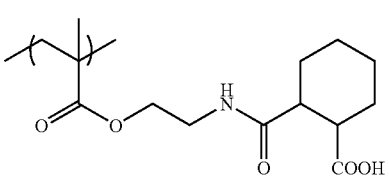
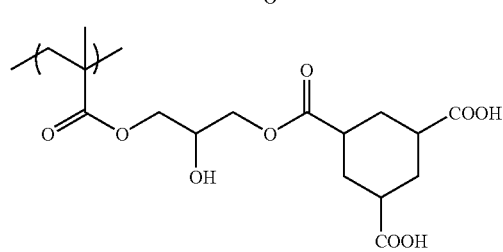 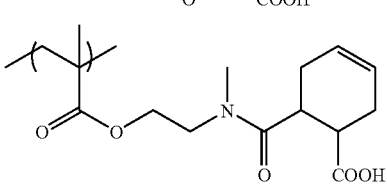

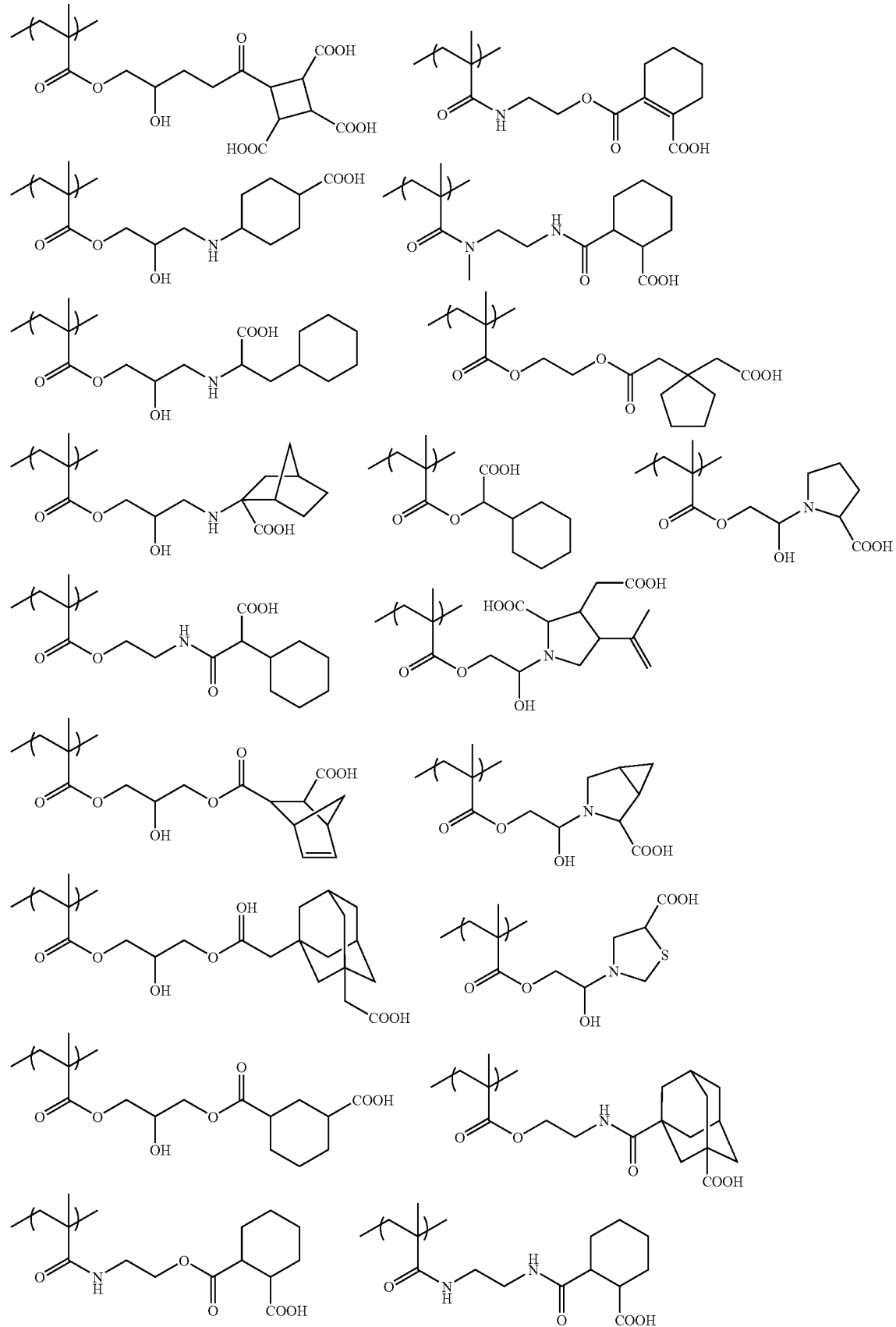

-continued
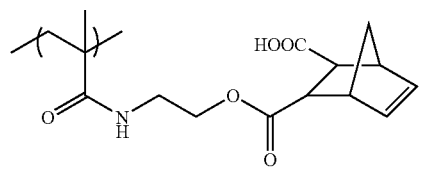
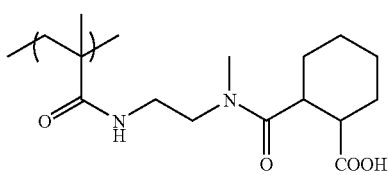
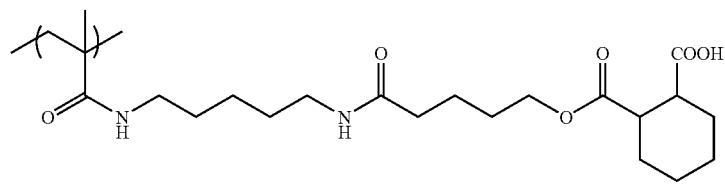
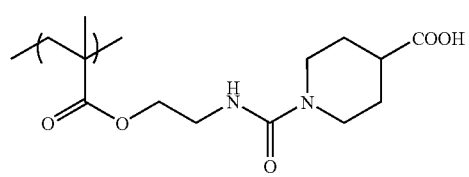
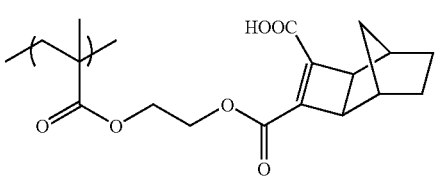
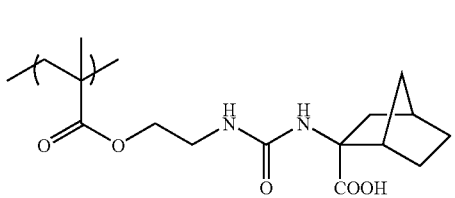
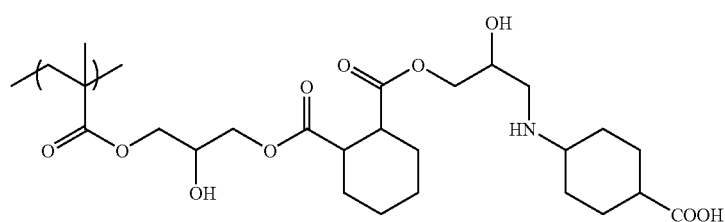
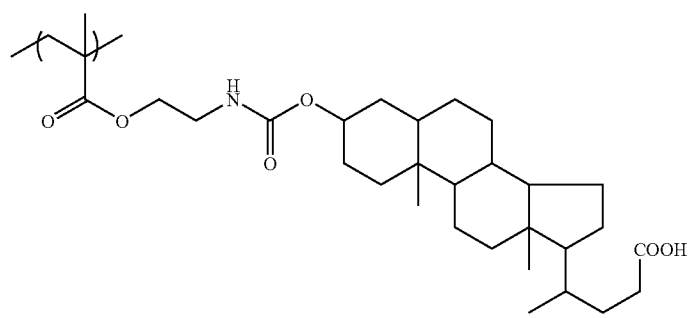
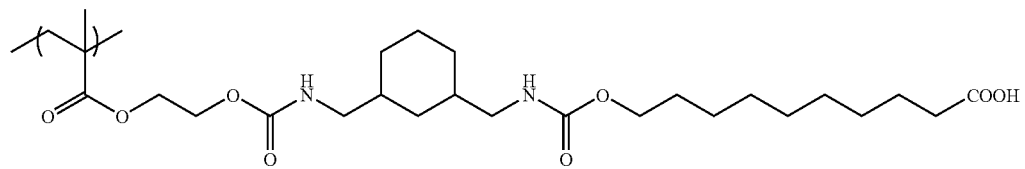
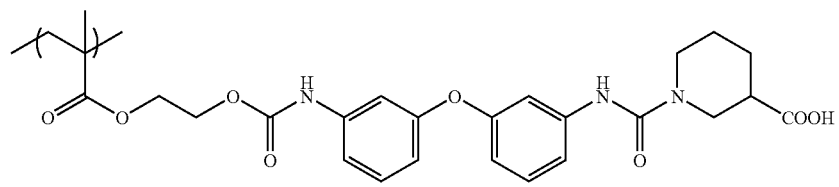

-continued

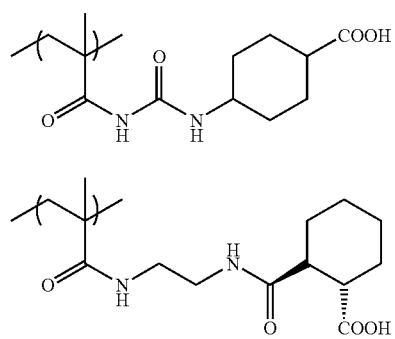
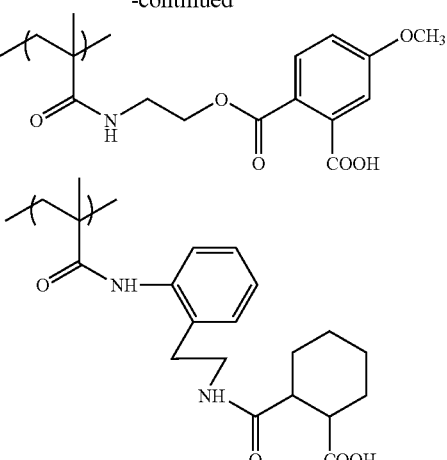
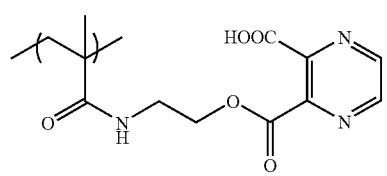
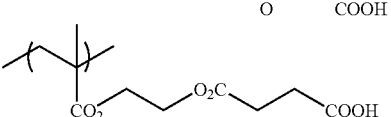
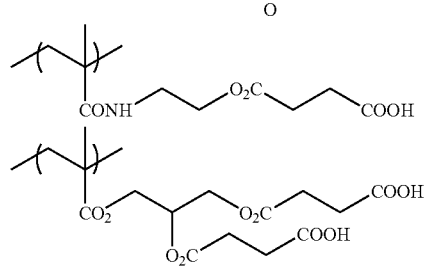
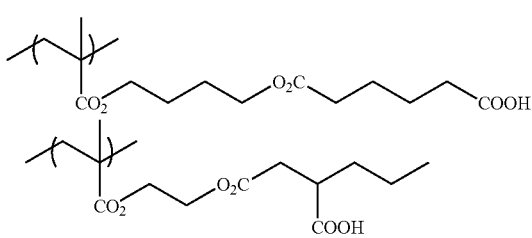
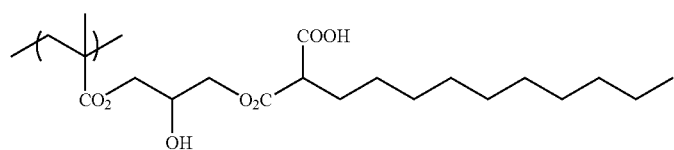

The binder polymer may have only one kind of the repeating unit represented by formula (I) or may have two or more different kinds of the repeating units. That is, the binder polymer may be a polymer composed of only the repeating unit represented by formula (I), but is ordinarily a copolymer with other copolymerizable component. The total content of the repeating unit represented by formula (I) in the copolymer is properly decided depending upon its structure or design of the polymerizable composition, and is preferably from 1 to 99 mol %, more preferably from 5 to 40 mol %, still more preferably from 5 to 20 mol %, based on the total mol amount of the polymer constituents.

As the copolymerizable component for the copolymer, conventionally known radical polymerizable monomers may be used with no limitations. Specific examples thereof include monomers described in "Kobunshi Data Handbook-Kisohen-(compiled by Kobunshi Gakkai and published by Baifukan, 1986). Such copolymerizable components may be used independently or in combination of two or more thereof.

Of the binder polymers, [allyl (meth)acrylate/(meth) acrylic acid/if necessary, other addition polymerizable vinyl monomer] copolymer and polymers containing acrylic group, methacrylic group and allyl group, as described in JP-A-2000-131837, JP-A-2002-62648, JP-A-2000-187322 and Japanese Patent Application No. 2002-287920 are excellent in balance between film strength, sensitivity and developability, thus being preferred.

Of these, polymers having the repeating unit represented by formula (I) and a radical polymerizable group (carbon-to-carbon double bond) of the structure represented by any one of the following formulae (II) to (IV) are most preferred.

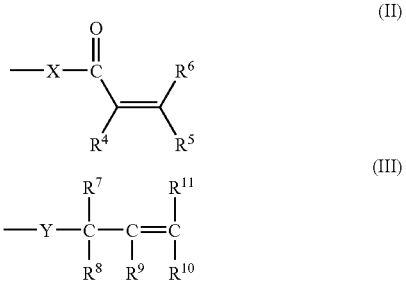

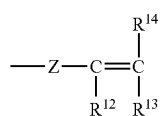

(IV)

In formulae (II) to (IV), $R^4$ to $R^{14}$ each independently represents a hydrogen atom or a monovalent substituent. X and Y each independently represents an oxygen atom, a sulfur atom or $N-R^{15}$, Z represents an oxygen atom, a sulfur atom, $-N-R^{15}$ or a phenylene group, and $R^{15}$ represents a hydrogen atom or a monovalent organic group.

In formula (II), $R^4$ to $R^6$ each independently represents a hydrogen atom or a monovalent group. Examples of $R^4$ include a hydrogen atom or an organic group such as an alkyl group which may have a substituent, and preferred specific examples thereof include a hydrogen atom, a methyl group, a methylalkoxy group and a methyl ester group. $R^5$ and $R^6$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Of these, a hydrogen atom, a carboxyl group, an alkoxycarbonyl group, an alkyl group which may have a substituent and an aryl group which may have a substituent are preferred.

Here, examples of the substituent which can be introduced into these groups include a methoxycarbonyl group, an ethoxycarbonyl group, an isopropoxycarbonyl group, a methyl group, an ethyl group and a phenyl group.

X represents an oxygen atom, a sulfur atom or $-N-R^{15}$ wherein examples of $R^{15}$ include an alkyl group which may have a substituent.

In formula (III), $R^7$ to $R^{11}$ each independently represents a hydrogen atom or a monovalent substituent. Examples of $R^7$ to $R^{11}$ each independently represents a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent and an arylsulofonyl group which may have a substituent. Of these, a hydrogen atom, a carboxyl group, an alkoxycarbonyl group, an alkyl group which may have a substituent and an aryl group which may have a substituent are preferred.

Here, as the substituent which can be introduced into these groups, those which have been illustrated as substituents which can be introduced with respect to formula (II) are illustrated.

Y represents an oxygen atom, a sulfur atom or $-N-R^{15}$. Examples of $R^{15}$ are the same as in formula (II).

In formula (IV), $R^{12}$ to $R^{14}$ each independently represents a hydrogen atom or a monovalent substituent, and specific examples thereof include a hydrogen atom, a halogen atom, an amino group, a dialkylamino group, a carboxyl group, an alkoxycarbonyl group, a sulfo group, a nitro group, a cyano group, an alkyl group which may have a substituent, an aryl group which may have a substituent, an alkoxy group which may have a substituent, an aryloxy group which may have a substituent, an alkylamino group which may have a substituent, an arylamino group which may have a substituent, an alkylsulfonyl group which may have a substituent, and an arylsulfonyl group which may have a substituent. Of these, a hydrogen atom, a carboxyl group, an alkoxycarbonyl group, an alkyl group which may have a substituent and an aryl group which may have a substituent are preferred.

Here, as the substituent which can be introduced into these groups, those which have been illustrated as substituents which can be introduced with respect to formula (II) are illustrated.

Z represents an oxygen atom, a sulfur atom, $-N-R^{15}$ or a phenylene group. Examples of $R^{15}$ are the same as in formula (II).

Of these radical polymerizable groups, radical polymerizable groups having the structure represented by formula (II) or (III) are preferred.

As other binder polymer, urethane-based binder polymers having an acid group, described in JP-B-7-12004, JP-B-7-120041, JP-B-7-120042, JP-B-8-12424, JP-A-63-287944, JP-A-63-287947, JP-A-1-271741 and JP-A-10-116232, are advantageous in the point of printing durability and low exposure aptitude due to their extremely excellent strength.

Also, the amido group-having binder polymer described in JP-A-11-171907 has both excellent developability and excellent film strength, and this binder polymer can be used in the invention as well.

Further, as other water-soluble linear organic high molecular polymers, polyvinylpyrrolidone and polyethylene oxide are useful. In order to raise strength of cured film, alcohol-soluble nylon and polyether between 2,2-bis-(4-hydroxyphenyl)-propane and epichlorohydrin are also useful. These linear organic high molecular polymers may be compounded in any amount in the whole composition. However, when the amount exceeds 90% by weight, there result non-favorable results with respect to strength of a formed image. The amount is preferably from 30 to 85% by weight. The ratio of the aforementioned polymerizable compound (C) to the linear organic high molecular polymer is preferably in a range of 1/9 to 7/3 by weight.

These binder polymers may be used independently or as a mixture of two or more thereof.

The molecular weight of the binder polymer (D) in the invention is properly determined in view of image-forming properties and printing durability, and is preferably in a range of from 2,000 to 1,000,000, more preferably from 5,000 to 500,000, still more preferably from 10,000 to 200,000.

As the binder polymer (D) in the invention, those which are substantially insoluble in water and soluble in an alkaline aqueous solution are used. Thus, use of organic solvents which are not favorable from the environmental standpoint can be avoided, or the amount thereof can be reduced to an extremely small level. The acid value of the binder polymer (D) (acid content per g of the polymer in terms of chemical equivalent) and the molecular weight of the binder polymer (D) are properly selected in view of image strength and developability. The acid value is preferably from 0.4 to 3.0 meq/g, more preferably from 0.16 to 2.0, and the molecular weight is preferably from 2000 to 500,000, more preferably from 10,000 to 300,000.

(E) Other Components

To the polymerizable composition of the invention may further be added other components suited for the end use or the production process. In particular, additives favorable in the case where the polymerizable composition of the invention is used as a recording layer of an image-recording material are described below taking a lithographic printing plate precursor as an example of the image-forming material.

(E-1) Co-sensitizer

Sensitivity can be more improved by using a certain kind of additive in the polymerizable composition. Such compound is hereinafter referred to as a co-sensitizer. Mechanism of the action thereof is not clear but, in many cases, it may be presumably based on the following chemical process. That is, various active species (radical and cation) generated during photo reaction initiated by the initiator and subsequent addition polymerization reaction presumably react with the co-sensitizer to generate new active radical. The co-sensitizers may be roughly classified into (i) those which can be reduced to generate an active radical, (ii) those which can be oxidized to generate an active radical, and (iii) those which react with a less active radical to convert it to a more active radical or to function as a chain transfer agent. However, in many cases, it is not clear to what group an individual compound belongs.

(i) Compounds which can be Reduced to Generate an Active Radical:

Compounds having a carbon-to-halogen bond; The carbon-to-halogen bond in the compounds is presumably cleaved by reduction to generate an active radical. Preferred specific examples to use include trihalomethyl-s-triazines and trihalomethyloxadiazoles.

Compounds having a nitrogen-to-nitrogen bond; The nitrogen-to-nitrogen bond in the compounds is presumably cleaved by reduction to generate an active radical. Preferred specific examples to use include hexaarylbiimidazoles.

Compounds having an oxygen-to-oxygen bond; The oxygen-to-oxygen bond in the compounds is presumably cleaved by reduction to generate an active radical. Preferred specific examples to use include organic peroxides.

Onium compounds; The carbon-to-hetero atom bond or oxygen-to-nitrogen bond in the compounds is presumably cleaved by reduction to generate an active radical. Preferred specific examples to use include diaryliodonium salts, triarylsulfonium salts and N-alkoxypyridinium (azinium) salts.

Ferrocene, iron-arene complexes; These can be reduced to generate an active radical.

(ii) Compounds which can be Oxidized to Generate an Active Radical;

Alkylato complexes; The carbon-to-hetero atom bond in the complexes is presumably cleaved by oxidation to generate an active radical. Preferred specific example to use include triarylalkyl borates.

Alkylamine compounds; The C—X bond in the compounds adjacent to nitrogen is presumably cleaved by oxidation to generate an active radical. Preferred examples of X include a hydrogen atom, a carboxyl group, a trimethylsilyl group and a benzyl group. Specific examples of the compound include ethanolamines, N-phenylglycines and N-trimethylsilylmethylanilines.

Sulfur- or tin-containing compounds; Compounds formed by replacing the nitrogen atom in the above-described amines by sulfur atom or tin atom can generate an active radical through the same mechanism. Also, compounds having an S—S bond are known to sensitize through S—S bond cleavage. α-Substituted methylcarbonyl compounds; An active radical can be generated by cleavage of the carbonyl-α-carbon bond in the compounds. Compounds formed by replacing carbonyl by oxime ether also show the same behavior. Specific examples thereof include a 2-alkyl-1-[4-(alkylthio)phenyl]-2-morpholinopronone-1 and an oxime ether obtained by reacting this with a hydroxylamine, then etherifying N—OH.

Sulfinates; An active radical can be generated by reduction of the compounds. Specific examples thereof include sodium arylsulfinates.

(iii) Compounds capable of reacting with a radical to convert it to a more active radical or capable of functioning as a chain transfer agent: For example, compounds having SH, pH, SiH or GeH within the molecule are used. These compounds can impart hydrogen to a less active radical species to convert it to a more active radical or can be oxidized and deprotonated to generate a radical. Specific examples thereof include 2-mercpatobenzimidazoles.

Many of more specific examples of the co-sensitizers (E-1) are described in JP-A-9-236913 as additive for improving sensitivity, and they may be used in the invention as well.

These co-sensitizers (E-1) may be used independently or in combination of two or more thereof. The amount to be used is suitably in a range of from 0.05 to 100 parts by weight, preferably from 1 to 80 parts by weight, still more preferably from 3 to 50 parts by weight, per 100 parts by weight of the polymerizable compound (C).

(E-2) Polymerization Inhibitor

In the invention, it is preferred to add a small amount of a thermal polymerization inhibitor as polymerization inhibitor (E-2) in order to prevent unnecessarily thermal polymerization of the polymerizable compound (C) during production or storage of the polymerizable composition constituting the recording layer. Suitable examples of the thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and N-nitrosophenylhydroxyamine cerium (III) salt.

The addition amount of the thermal polymerization inhibitor is preferably from about 0.01% by weight to about 5% by weight based on the weight of the whole composition. Also, if desired, a higher fatty acid derivative such as behenic acid or benic acid amide may be added for preventing polymerization inhibition by oxygen and, in the case of producing a lithographic printing plate precursor, the derivative may be localized to the surface of the recording layer during the drying process after coating the composition on a substrate. The addition amount of the higher fatty acid derivative is preferably from about 0.5% by weight to about 10% by weight based on the weight of the whole composition.

(E-3) Coloring Agent and Other Additives

In the lithographic printing plate precursor of the invention, a dye or pigment may be added for the purpose of coloring the recording layer. By the addition of coloring agent, a printing plate can be improved in plate inspection properties, for example, visibility after the plate-making or suitability for image density measurement. The coloring agent used is preferably a pigment because many dyes cause reduction in the sensitivity of the photopolymerizable recording layer. Specific examples of the coloring agent include pigments, for example, a phthalocyanine pigment, an azo pigment, carbon black or titanium oxide, and dyes, for example, Ethyl Violet, Crystal Violet, an azo dye, an anthraquinone dye or a cyanine dye. The amount of dye or pigment added is preferably from about 0.5% by weight to about 5% by weight based on the whole composition.

(E-4) Other Additives

In the polymerizable composition of the invention, it is preferred to incorporate a compound having at least one carboxylic acid group and at least one amino group or thioether group within the molecule for the purpose of more improving sensitivity, stability and developability. It is more preferred to incorporate a compound represented by the following formula (III):

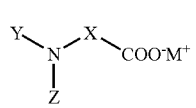
(III)

Compounds represented by formula (III) wherein X represents a divalent organic group can be used. Preferred examples of X include —CH$_2$—, —CH$_2$—CH$_2$—, —CH(CH$_3$)—, an aryl group and —CH=CH—.

Y and Z in formula (III) each independently represents a hydrogen atom or a monovalent organic group, preferably a straight, branched or cyclic alkyl group, a straight or cyclic alkenyl group, a straight or cyclic alkynyl group, an aryl group, a hetero atom-containing cyclic aromatic compound, and a hydrogen atom. Y and Z may be connected to each other to form a ring. The monovalent organic group represented by Y or Z may have a substituent. Preferred examples of the substituent include a halogen atom, a hydroxyl group, a cyano group, an ester group, a carbonyl group, a carboxyl group or the derivative thereof, an amino group, an aldehyde group, a thiol group, an ether group, an alkyl group, an alkenyl group, an alkynyl group, a urethane group, an amido group, an urea group, a thiether group, a sulfonyl group and a sulfoxide group.

M$^+$ represents a monovalent cation, preferably H$^+$, Na$^+$ or K$^+$.

Specific examples of the compound having one or more carboxylic acid and one or more amino or thioether group within the molecule, (X-1) to (X-16) and (Y-1) to (Y-4), are shown below which, however, are not to be construed as limitative.

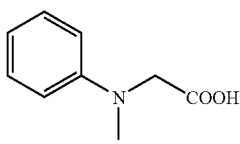
(X-1)

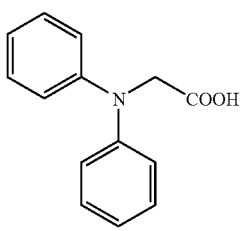
(X-2)

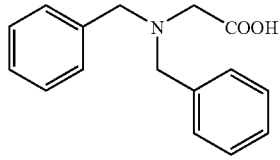
(X-3)

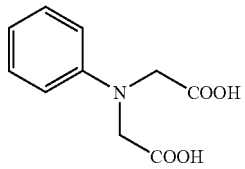
(X-4)

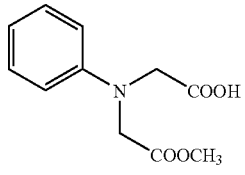
(X-5)

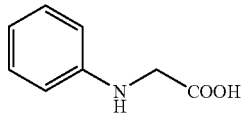
(X-6)

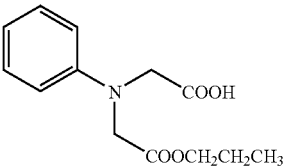
(X-7)

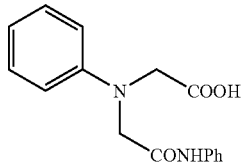
(X-8)

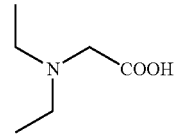
(X-9)

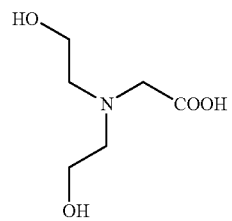
(X-10)

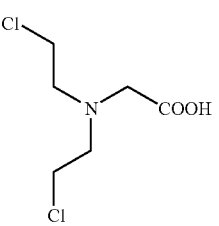
(X-11)

-continued

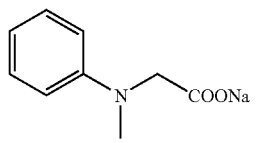 (X-12)

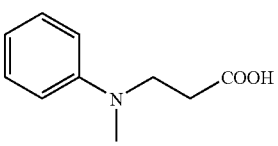 (X-13)

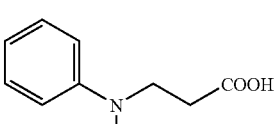 (X-14)

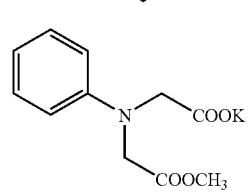 (X-15)

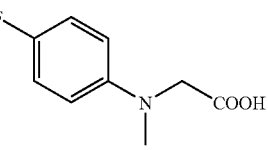 (X-16)

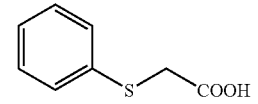 (Y-1)

 (Y-2)

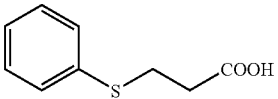 (Y-3)

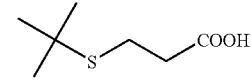 (Y-4)

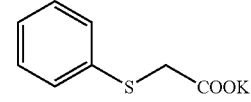

The addition amount of the compound having at least one carboxylic acid and at least one amino or thioether group within the molecule is preferably from 2% by weight to 10% by weight, more preferably from 1% by weight to 5% by weight, based on the whole composition.

Further, known other additives, for example, an inorganic filler for improving physical properties of the cured film, a plasticizer, or an oil sensitivity imparting agent capable of improving an ink-receptive property on the surface of recording layer of a lithographic printing plate precursor, may also be added to the polymerizable composition of the invention.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin. When a binder is used, the plasticizer may be added in an amount of not more than 10% by weight based on the total amount of the compound having an ethylenically unsaturated double bond and the binder.

Also, in order to improve the film strength (printing durability) to be described hereinafter, a UV initiator or a heat crosslinking agent capable of accelerating the effect of heating and/or exposure to light after the development may be added.

In addition, in order to improve adhesion between the recording layer and a support to be described hereinafter or to increase removability of the unexposed recording layer by development, an additive may be added. For example, by adding or undercoating a compound having a relatively strong interaction with the support, for example, a compound having a diazonium structure or a phosphone compound, the adhesion to the support can be improved, thereby increasing the printing durability. Also, by adding or undercoating a hydrophilic polymer such as polyacrylic acid or polysulfonic acid, the developability of the non-image area can be improved, whereby the occurrence of stain can be prevented.

The polymerizable composition of the invention can be applied to an image-recording material represented by the lithographic printing plate precursor to be described hereinafter, and to production of a highly sensitive photo-shaping material, a hologram material utilizing change in refractive index with the progress of polymerization, and an electronic material such as photoresist.

(Image-Recording Material)

Next, an image-recording material of the invention using the polymerizable composition is described below. The polymerizable composition of the invention can favorably be used as a negative-working recording layer of an image-recording material represented by a lithographic printing plate precursor. The image-recording material of the invention comprises a support having provided thereon a recording layer containing the polymerizable composition of the invention and, if desired, other layers.

(Recording Layer)

First, the recording layer having an image-forming function in the image-recording material of the invention is described below. The image-recording material of the invention contains (A) a dye which is soluble in an organic solvent and in an alkaline aqueous solution and has an absorption in 700 to 1200 nm, (B) a radical polymerization initiator, (C) a compound having an ethylenically unsaturated bond, and (D) a binder polymer. It is preferred to use, as the binder polymer (D), a polymer containing the structural unit with an alkali soluble group represented by formula (I) and described in detail with respect to the polymerizable composition.

A negative image is formed in this recording layer by irradiation with infrared laser light upon which the specific dye (A) generates heat, the radical polymerization initiator (B) is decomposed by the heat to generate a radical, and the radical accelerates curing reaction of the compound (C) having an ethylenically unsaturated bond to cure the exposed area thereby forming an image area.

In forming the recording layer of the image-recording material of the invention, the content of radical polymerization initiator (B) is preferably from 0.5 to 20% by weight based on the total solid components constituting the recording layer. This radical polymerization initiator (B) has the function that, when used in combination with the specific dye (A), the radical polymerization initiator (B) generates a radical upon receiving heat generated from the specific dye (A) by irradiation with the infrared laser light or light energy of the infrared laser light, and the radical in turn initiates and accelerates polymerization of the compound (C) having an ethylenically unsaturated bond.

[Production of Image-recording Material (Lithographic Printing Plate Precursor)]

The image-recording material of the invention is described by reference to a lithographic printing plate precursor which is a typical application example thereof.

In producing the lithographic printing plate precursor, it suffices to prepare a recording layer coating solution containing the polymerizable composition as a major component and coating solutions for other arbitrary layers such as a protective layer by dissolving components for respective layers in an appropriate solvent, and coating them on an appropriate support.

Examples of the solvent which can be used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate and ethyl lactate. The solvents may be used individually or in combination of two or more thereof. The solid concentration in the coating solution is suitably from 2 to 50% by weight.

Since the amount of coverage of recording layer on a support has an influence upon the sensitivity of recording layer, the developability, the strength of the exposed film and the printing durability, it is desirable to appropriately determine the amount of coverage depending upon the use. When the amount of coverage is too small, the printing durability may not be sufficient, whereas an excessively large amount of coverage is disadvantageous, because the sensitivity decreases, the exposure takes a time, and the development processing also requires a longer period of time. In the case of the lithographic printing plate precursor of the invention, the amount of coverage is preferably from about 0.1 to about 10 g/m$^2$, more preferably from 0.5 to 5 g/m$^2$, in terms of the dry weight.

(Protective Layer)

It is preferred to provide a protective layer on the recording layer of the lithographic printing plate precursor of the invention for conducting exposure in the atmosphere. The protective layer functions to prevent low molecular compounds such as oxygen or basic substances existing in the atmosphere which inhibit the image-forming reaction caused in the recording layer by the exposure from contaminating the recording layer, thus permitting exposure in the atmosphere. Therefore, properties desired for such protective layer are that it has a low permeability for low molecular compounds such as oxygen and, further, that it has a good transmittance for light to be used for exposure, that it has an excellent adhesion to the recording layer and that it can easily be removed in the developing process after exposure.

Technical improvements on such protective layer have been conducted from old and are described in detail in U.S. Pat. No. 3,458,311 and JP-B-55-49729. As materials to be used for the protective layer, water-soluble high molecular compounds comparatively excellent in cristalinity are preferred, and specific known examples thereof include water-soluble polymers such as polyvinyl alcohol, polyvinylpyrrolidone, acidic celluloses, gelatin, gum arabic and polyacrylic acid. Of these, polyvinyl alcohol provides the best results with respect to fundamental properties such as oxygen-barrier property and removability upon development, when used as a major component. Polyvinyl alcohol to be used for the protective layer may be partly substituted by ester, ether or acetal so long as it has enough unsubstituted vinyl alcohol unit to possess necessary oxygen-barrier properties and solubility in water. Also, it may partly have other copolymerizable component. In particular, a mixture of polyvinylpyrrolidone and 15 to 50% by weight, based on polyvinyl alcohol, of polyvinylpyrrolidone is preferred in view of storage stability.

Specific examples of polyvinyl alcohol include those which are hydrolyzed to a degree of 71 to 100% and have a molecular weight of from 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-2-4, PVA-205, PVA-210, PVA-217, PVA-220, PVA-224, PVA-217EE, PVA-217E, PVA-220E, PVA-224E, PVA-405, PVA-420, PVA-613 and L-8.

Kinds and coating amounts of components of the protective layer (selection of PVA, use of additives) are determined in consideration of oxygen-barrier properties, removability upon development, fogging properties, adhesion properties and scratch resistance.

In general, oxygen-barrier properties are enhanced as the hydrolysis ratio of PVA increases (as the content of unsubstituted vinyl alcohol unit in the protective layer increases) or the thickness increases, which is advantageous from the standpoint of sensitivity. However, when the oxygen-barrier properties are extremely enhanced, there arise such problems as that unnecessary polymerization occurs during production or storage before use and that unnecessary fog or thickening of image lines take place upon imagewise exposure. Also, adhesion to image area and scratch resistance are important factors in handling the plate. That is, when a hydrophilic layer comprising a water-soluble polymer is laminated on an oleophilic polymer layer, there tends to arise film delamination due to insufficient adhesion, and the delaminated portion can cause the defect of insufficient film curing due to inhibition of polymerization with oxygen.

As countermeasures for this problem, various proposals have been made. For example, it is described in JP-A-49-70702 and British Patent Laid-Open No. 1,303,578A that sufficient adhesion can be obtained by laminating, on the polymer layer, a mixture obtained by mixing a hydrophilic polymer mainly comprising polyvinyl alcohol with 20 to 60% by weight of acrylic emulsion or water-insoluble vinylpyrrolidone/vinyl acetate copolymer. Any of these known techniques may be applied to the protective layer in the invention. Method for coating such protective layer is described in detail, for example, in U.S. Pat. No. 3,458,311 and JP-B-55-49729.

Further, other functions may be imparted to the protective layer. For example, addition of a coloring agent (e.g., water-soluble dye) having excellent transmitting properties for light of wavelength to be used for exposure and effectively absorbing light of wavelength not contributing to image formation serves to more enhance safelight adaptability without causing reduction in sensitivity.

Also, as the protective layer for the lithographic printing plate precursor of the invention, a protective layer of $1 \times 10^{-15}$ {$cm^3$(STP)·cm/$^2$·sec·cmHg} in oxygen permeability described in JP-A-2000-34739 can preferably be used.

(Resin Interlayer)

In the lithographic printing plate precursor of the invention, a resin interlayer comprising an alkali-soluble high molecular polymer can be provided between the recording layer and the support as needed.

When the recording layer, which is a infrared ray-responsive layer undergoing reduction in solubility for an alkali developing solution upon exposure, is provided on the exposure side or in the vicinity thereof, sensitivity to infrared laser light is enhanced and, at the same time, this resin interlayer which exists between the support and the infrared-responsive recording layer functions as a heat insulating layer. Thus, heat generated upon exposure with infrared laser light does not diffuse into the support, but can be effectively used, which serves to enhance sensitivity.

Also, in the exposed area, the recording layer having been made non-permeable against the alkali developing solution functions as a protective layer for this resin interlayer, and hence a good developing stability is obtained and an image with excellent discrimination can be formed, with stability with time being also secured. On the other hand, in the unexposed area, non-cured binder component is rapidly dissolved into the developing solution and dispersed and, since this resin interlayer existing adjacent to the support comprises an alkali-soluble high molecular polymer, it shows a good solubility for the developing solution. Thus, even when a developing solution having a reduced activity is used, it can be rapidly dissolved without leaving the film, presumably showing good developability.

(Support)

As the support to be used in the lithographic printing plate precursor of the invention, any dimensionally stable plate-like material may be used without any limitation. Examples thereof include paper, paper laminated with plastics (e.g., polyethylene, polypropylene or polystyrene), a plate of metal (e.g., aluminum, zinc or copper), a film of plastics (e.g., cellulose diacetate, cellulose triacetate, cellulose propionate, cellulose butyrate, cellulose acetate butyrate, cellulose nitrate, polyethyolene terephthalate, polyethylene, polystyrene, polypropylene, polycarbonate or polyvinyl acetal). These may be sheets of a single component such as a resin film or a metal plate, or may be a laminate of two or more materials. Examples thereof include paper and a plastic film laminated with or having deposited thereon the above-described metal, and a laminate sheet of different kinds of plastics As the support, a polyester film or an aluminum plate is preferred. Of them, the aluminum plate is particularly preferred because it is dimensionally stable and relatively inexpensive. The aluminum plate suitably used includes a pure aluminum plate and an alloy plate mainly comprising aluminum and containing a trace amount of foreign elements. Also, a plastic film laminated with or having deposited thereon aluminum may be used. Examples of the foreign element contained in the aluminum alloy include silicon, iron, manganese, copper, magnesium, chromium, zinc, bismuth, nickel and titanium. The content of foreign elements in the alloy is at most 10% by weight. In the invention, although pure aluminum is particularly suitably used, it is difficult to completely pure aluminum in view of the refining technology. Thus, an aluminum containing a trace amount of foreign elements can be used. The composition of the aluminum plate for use in the invention is not particularly limited and an aluminum plate conventionally known and used in the field of the art can be appropriately utilized.

The aluminum plate has a thickness of approximately from 0.1 to 0.6 mm, more preferably from 0.15 to 0.4 mm, particularly preferably from 0.2 to 0.3 mm.

Prior to surface-roughening the aluminum plate, degreasing treatment with, for example, a surfactant, an organic solvent or an alkaline aqueous solution for removing rolling oil remaining on the surface is conducted, if desired.

The surface roughening treatment of aluminum plate is performed by various methods, for example, by a method of mechanically roughening the surface, a method of electrochemically dissolving and roughening the surface or a method of chemically dissolving selectively the surface. In the mechanical surface roughening, a known method, for example, ball graining, brush graining, blast graining or buff graining may be used. The electrochemical surface roughening includes a method of transporting an aluminum plate in an electrolytic solution, e.g., hydrochloric acid or nitric acid while applying an alternating current or direct current. Also, a method wherein these two surface roughening treatments are conducted in combination as described in JP-A-54-63902 may be utilized.

The thus surface-roughened aluminum plate may be subjected to anodic oxidation treatment after, if desired, alkali etching treatment and neutralizing treatment for enhancing water retention characteristics and abrasion resistance. As an electrolyte to be used for the anodic oxidation treatment of the aluminum plate, various electrolytes capable of forming a porous oxide film can be used. In general, sulfuric acid, phosphoric acid, oxalic acid, chromic acid or a mixed acid thereof is used. The concentration of the electrolyte can properly be determined depending upon kind of the electrolyte.

Conditions for anodic oxidation treatment can not be described in a general manner because they vary depending upon kind of the used electrolyte. In general, however, concentration of the electrolyte in the electrolytic solution is suitably in a range of from 1 to 80% by weight, liquid temperature is suitably in a range of from 5 to 70° C., electric current is suitably in a range of from 5 to 60 A/$dm^2$, voltage is suitably in a range of from 1 to 100 V, and electrolytic time is suitably in a range of from 10 seconds to 5 minutes.

The amount of anodic oxidation film is preferably 1.0 g/$m^2$ or more, more preferably from 2.0 to 6.0 g/$m^2$. In case where the amount of anodic oxidation film is less than 1.0 g/$m^2$, there results an insufficient printing durability or scratches are liable to be formed in non-image area of the lithographic printing plate. Thus, upon printing, ink deposition onto the scratches, so-called scratch stain, is liable to be formed.

Additionally, such anodic oxidation treatment is conducted on the printing surface of the support of the lithographic printing plate. In general, however, an anodic oxidation film of 0.01 to 3 g/$m^2$ is formed on the back side because the electric flux line goes round backside.

A hydrophilicity-imparting treatment of the support surface is to be conducted after the anodic oxidation treatment. Examples of such hydrophilicity-imparting treatment include a method of using an alkali metal silicate (e.g., sodium silicate aqueous solution) as disclosed in U.S. Pat. Nos. 2,714,066, 3,181,461, 3,280,734 and 3,902,734. In this method, the support is immersed or electrolytically treated in a sodium silicate aqueous solution. In addition, a method of treating with potassium fluorozirconate as disclosed in JP-B-36-22063 and a method of treating with polyvinylphosphonic acid as disclosed in U.S. Pat. Nos. 3,276,868, 4,153,461 and 4,689,272 may be used.

Of these, silicate treatment is a particularly preferred hydrophilicity-imparting treatment in the invention. The silicate treatment is described below.

The anodic oxidation film of the aluminum plate having been subjected to the above-mentioned treatment is immersed in an aqueous solution containing 0.1 to 30% by weight, preferably 0.5 to 10% by weight, of an alkali metal silicate aqueous solution of 10 to 13 in pH at 25° C., for example, at 15 to 80° C. for 5 to 120 seconds. In case where pH of the alkali metal silicate aqueous solution is less than 10, the solution is gelled. On the other hand, in case where pH is more than 13.0, the oxide film is dissolved. Examples of the alkali metal silicate to be used in the invention include sodium silicate, potassium silicate and lithium silicate. Examples of hydroxide to be used for increasing pH of the alkali metal silicate aqueous solution include sodium hydroxide, potassium hydroxide and lithium hydroxide. Additionally, an alkaline earth metal salt or a group-IVB metal salt may be added to the treating solution. Examples of the alkaline earth metal salt include water-soluble salts, for example, nitrates such as calcium nitrate, strontium nitrate, magnesium nitrate and barium nitrate, sulfates, hydrochlorides, phosphates, acetates, oxalates and borates. Examples of the group-IVB metal salts include titanium tetrachloride, titanium trichloride, potassium fluorotitanate, titanium potassium oxalate, titanium sulfate, titanium tetraiodide, chlorozirconium oxide, zirconium dioxide, zirconium oxychloride and zirconium tetrachloride. The alkaline earth metal salts or the group-IVB metal salts may be used individually or in combination of two or more thereof. These metal salts are used in an amount of preferably from 0.01 to 10% by weight, more preferably from 0.05 to 5.0% by weight.

The silicate treatment serves to more improve hydrophilicity of the surface of aluminum plate, and hence, upon printing, an ink difficultly deposits onto non-image area, thus stain resistance being improved.

(Backcoat Layer)

A backcoat layer is provided, if desired, on the back side of the support. Examples of such backcoat layer to be preferably used include a coating layer comprising an organic high molecular compound described in JP-A-5-45885 and a coating layer comprising a metal oxide obtained by hydrolyzing and polycondensing an organic or inorganic metal compound as described in JP-A-6-35174.

Of these coating layer, a coating layer of metal oxide obtained by an alkoxy compound such as $Si(OCH_3)_4$, $Si(OC_2H_5)_4$, $Si(OC_3H_7)_4$ or $Si(OC_4H_9)_4$ which is inexpensive and easily available is particularly preferred because it shows excellent development resistance.

The lithographic printing plate precursor of the invention can be prepared in the above-described manner.

[Plate Making]

The lithographic printing plate precursor of the invention is subjected to exposure to conduct image formation (recording) and, thereafter, subjected to the development processing to be described hereinafter to make a printing plate. Additionally, polymerization reaction in the polymerizable composition of the invention also takes place by exposure.

(Exposure)

The lithographic printing plate precursor and the polymerizable composition of the invention are imagewise exposed by means of a solid laser and a semiconductor laser irradiating infrared rays of from 760 nm to 1200 nm in wavelength.

The exposure mechanism may be any of the inner face drum system, the outer face drum system and the flat bed system.

In the invention, development processing may be conducted immediately after irradiation with laser light, but a heating treatment may be conducted between the laser-irradiating step and the developing step. The heating treatment is preferably conducted under the conditions of 80° C. to 150° C. for 10 seconds to 5 minutes. This heating treatment permits to reduce laser energy necessary for recording upon irradiation with laser light.

(Development)

The lithographic printing plate precursor of the invention is ordinarily developed preferably with water or an alkaline aqueous solution after imagewise exposure by means of an infrared laser.

As the developing solution, an alkaline aqueous solution is preferred. A preferred pH range is from 10.5 to 12.5. It is more preferred to conduct development processing with an alkaline aqueous solution having a pH of from 11.0 to 12.5. In case where an alkaline aqueous solution having a pH less than 10.5 is used, non-image areas are liable to be stained. On the other hand, in case where development processing is conducted using an aqueous solution having a pH exceeding 12.5, strength of image areas is possibly reduced.

In the case where an alkaline aqueous solution is used as a developing solution, conventionally known alkaline aqueous solutions may be used as a developing solution and a replenishing solution for the lithographic printing plate precursor of the invention. Examples of the alkali agent include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydjrogencarbonate, ammonium hydrogencarbonate, sodium borate, potassium borate, ammonium borate, sodium hydroxide, ammonium hydroxide, potassium hydroxide and lithium hydroxide. Also, organic alkali agents such as monomethyamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine may be used as well.

These alkali agents may be used individually or in combination of two or more thereof.

Further, in the case of conducting development using an automatic developing machine, it is known that a large number of lithographic printing plate precursors can be treated without exchanging the developing solution retained in a developing tank for a long time by adding an aqueous solution (replenishing solution) having a higher alkalinity than that of the developing solution. This replenishing system is preferably applied to the invention.

Various surfactants may be added to the developing solution and the replenishing solution for the purpose of accelerating or depressing development, dispersing development scum and enhancing affinity of the image area of printing plate for an ink.

The surfactant is added to a developing solution in an amount of preferably from 1 to 20% by weight, more preferably from 3 to 10% by weight. In case where the addition amount of the surfactant is less than 1% by weight, there results insufficient effect of improving developability whereas, in case where it is added in an amount of more than 20% by weight, there tends to result troubles such as reduction in strength, for example, abrasion resistance of image.

Preferred examples of the surfactant include anionic, cationic, nonionic and amphoteric surfactants. Specific examples thereof include sodium lauryl alcohol sulfate, ammonium lauryl alcohol sulfate, sodium octyl alcohol sulfate, alkylarylsulfonates such as sodium isopropylnaphthalenesulfonate, sodium isobutylnaphthalenesulfonate, sodium salt of polyoxyethylene glycol mononaphthylsulfate and sodium dodecylbenzenesulfonate, higher alcohol (having from 8 to 22 carbon atoms) esters of sulfuric acid such as secondary sodium alkylsulfates, aliphatic alcohol esters of phosphoric acid such as sodium salt of cetyl phosphate, sulfonic acid salts of alkylamides such as $C_{17}H_{33}CON(CH_3)CH_2CH_2SO_3Na$, sulfonates of dibasic aliphatic esters such as sodium dioctyl sulfosuccinate and sodium dihexyl sulfosuccinate, ammonium salts such as lauryltrimethylammonium chloride and lauryltrimethylammonium metosulfate, amine salts such as stearamidoethyldiethylamine acetate, polyhydric alcohols such as fatty acid monoester of glycerol and fatty acid monoester of pentaerythritol, and polyethylene glycol ethyl compounds such as polyethylene glycol mono (nonylphenol) ethyl.

Preferred organic solvents are selected from those which have a solubility for water of about 10% by weight or less, more preferably 5% by weight or less. Examples thereof include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methyl cyclohexanol and 3-methylcyclohexanol. The content of organic solvent is suitably from 1 to 5% by weight based on the whole weight of the developing solution upon use. The amount of organic solvent is closely related to the amount of used surfactant. It is preferred to increase the amount of surfactant as the amount of organic solvent increases. Because, when the organic solvent is used in a large amount in the presence of only a small amount of the surfactant, the organic solvent fails to be dissolved, thus good developability not being secured.

Further, additives such as a defoaming agent and a water softener may be added, if desired, to the developing solution and the replenishing solution. Examples of the water softener include polyphosphates such as Na2P2O7, Na5P3O3, Na3P3O3, Na2O4P(NaO3P)PO3Na2 and Calgon (sodium polymetaphosphate); aminopolycarboxylates (e.g., ethylenediaminetetraacetic acid, potassium salt thereof, sodium salt thereof, diethylenetriaminepentaacetic acid, potassium salt thereof, sodium salt thereof, triethylenetetramine hexaacetic acid, potassium salt thereof, sodium salt thereof, hydroxyethylethylenediaminetriacetic acid, potassium salt thereof, sodium salt thereof, nitrilotriacetic acid, potassium salt thereof, sodium salt thereof, 1,2-diaminocyclohexanetetraacetic acid, potassium salt thereof, sodium salt thereof, 1,3-diamino-2-propanoltetraacetic acid, potassium salt thereof and sodium salt thereof); and other polycarboxylic acids (e.g., 2-phosphonobutanetricarboxylic acid-1,2,4, potassium salt thereof, sodium salt thereof, 2-phosphonobutanonetricarboxylic acid-2,3,4, potassium salt thereof and sodium salt thereof); and organophosphonic acids (e.g., 1-phosphonoethanetricarboxylic acid-1,2,2, potassium salt thereof, sodium salt thereof, 1-hydroxyethane-1,1-diphosphonic acid, potassium salt thereof, sodium salt thereof, aminotri(methylenephosphonic acid), potassium salt thereof, sodium salt thereof). The optimal amount of the water softener varies depending upon hardness and used amount of hard water but, as a general guide, it can be incorporated in the developing solution upon use in a range of from 0.01 to 5% by weight, more preferably from 0.01 to 0.5% by weight.

Further, in the case of developing the lithographic printing plate using an automatic developing machine, the developing solution becomes deteriorated as the amount of processed plates increases. Therefore, the processing ability of developing solution may be restored by using a replenishing solution or a fresh developing solution. In this case, it is preferred to replenish according to the manner described in U.S. Pat. No. 4,882,246.

Examples of the developing solution containing the surfactant, organic solvent and reducing agent include a developing solution composition comprising benzyl alcohol, an anionic surfactant, an alkali agent and water as described in JP-A-51-77401, a developing solution composition comprising an aqueous solution containing benzyl alcohol, an anionic surfactant and a water-soluble sulfite as described in JP-A-53-44202, and a developing solution composition containing an organic solvent having a solubility for water of 10% by weight or less at ordinary temperature, an alkali agent and water as described in JP-A-55-155355. These can favorably be used in the invention.

The lithographic printing plate having been development processed using the developing solution and the replenishing solution described hereinbefore is then after-treated with washing water, a rinsing solution containing a surfactant, and a desensitizing solution containing gum arabic or a starch derivative. In the after-treatment of the lithographic printing plate of the invention, these treatments may be variously combined to use.

In recent years, an automatic developing machine for printing plate materials has been widely used in the plate-making and printing field for the purpose of rationalization and standardization of plate-making work. This automatic developing machine generally comprises a developing section and an after-treatment section and is constituted by an apparatus for conveying printing plate precursors, tanks for respective treatments and a spraying apparatus. In the machine, an exposed printing plate precursor is conveyed horizontally, during which each treating solution pumped up by a pump is sprayed to the printing plate precursor through a spray nozzle to conduct development processing. Recently, there is known a method of processing the printing plate precursor by immersing and conveying a printing plate precursor in a tank filled with a processing solution by means of guide rollers provided in the solution. In such automatic processing, the processing can be conducted with replenishing each processing solution with its replenishing solution depending upon the amount of processed precursors and operation period. It is also possible to automatically replenish by monitoring the electric conductivity by means of a sensor.

Also, a so-called disposable processing system of using a substantially fresh solution can be applied.

The thus obtained lithographic printing plate can be subjected to the printing process after coating, if desired, desensitizing gum and, in the case of obtaining a lithographic printing plate with a higher printing durability, it is subjected to a burning treatment.

In the case of burning the lithographic printing plate, it is preferred to treat with a surface arranging solution as described in JP-B-61-2518, JP-B-55-28062, JP-A-62-31859 and JP-A-61-159655 before the burning treatment.

As a method for the treatment, a method of applying the surface arranging solution to the lithographic printing plate using sponge or degreased cotton soaked with the surface arranging solution, a method of immersing the printing plate in a tray filled with the surface arranging solution to coat or a method of coating by means of an automatic coater is employed. Also, it provides better results to make the amount of coated solution uniform by using a squeegee or a squeegee roller after the coating.

The burning-treated lithographic printing plate can be subjected, if desired, to conventionally conducted treatments such as washing with water and gumming. However, in the case of using a surface arranging solution containing a water-soluble high molecular compound, so-called desensitizing treatment such as gumming may be omitted.

The lithographic printing plate obtained by such treatment can be mounted on an offset printing machine to use for producing many printed products.

The image-recording material of the invention is particularly suited as a recording layer for scanning exposure type lithographic printing plate precursor. However, it is also suited as a highly sensitive photo-shaping material, and can find application as hologram material utilizing change in refractive index with the progress of polymerization or as an electronic material such as photoresist.

EXAMPLES

Examples of the invention are described below which, however, should not be construed as limiting the invention.

Examples 1 to 10, Comparative Examples 1 and 2

[Preparation of substrate]

A 0.3 mm-thick aluminum plate (quality: 1050) was washed with trichloroethylene to degrease, then the surface was grained using a nylon brush and a 400-mesh pumice suspension in water to conduct etching of the surface and, after washing with water, the plate was immersed in a 20% nitric acid for 20 seconds, followed by washing with water. The etching amount of the thus grained surface was about 3 g/m$^2$.

Then, this plate was subjected to an anodic oxidation in an electrolytic solution of 7% sulfuric acid by applying a direct current of 15 A/dm$^2$ in current density to form a 3 g/m$^2$ oxide film, then washed with water, and dried to prepare substrate (A).

The substrate (A) was treated in a 2% by weight of sodium silicate aqueous solution at 25° C. for 15 seconds, then washed with water to prepare substrate (B).

[Formation of Interlayer]

Subsequently, a liquid composition (sol solution) of an SG method was prepared in the following procedure.

<Sol Solution Composition>

| | |
|---|---|
| Methanol | 130 g |
| Water | 20 g |
| 85% by weight phosphoric acid | 16 g |
| Tetraethoxysilane | 50 g |
| 3-Methacryloxypropyltrimethoxysilane | 60 g |

The above-described compounds were mixed with each other, and stirred. Heat generation was observed in about 5 minutes. After reacting for 60 minutes, the contents were transferred to another vessel, followed by adding 3000 g of methanol to prepare a sol solution.

This sol solution was diluted with methano/ethylene glycol=9/1 (by weight), and coated onto the above-prepared substrate (A) in an amount of 3 mg/m$^2$ in terms of Si, followed by drying at 100° C. for 1 minute to obtain substrate (C).

[Formation of Lithographic Printing Plate Precursor]

One of the thus-prepared substrates (A) to (C) was used as a support, and a coating solution of the following formulation for forming a photosensitive layer was applied to the surface of the substrate, then dried at 115° C. for 1 minute to form a 1.4 g/m$^2$ photosensitive layer. Thus, lithographic printing plate precursors of Examples 1 to 10 were obtained. Used substrates, radical generators (B) (described as "initiator" in Table 1), polymerizable compounds (C) having an unsaturated group (described as "polymerizable compound" in Table 1), and binder (D) are as shown in Table 1.

(Coating Solution for Forming Photosensitive Layer)

| | |
|---|---|
| Dye [compound (A) described in Table 1 such as specific dye] | 0.081 g |
| Radical polymerization initiator (B) [Compound described in Table 1] | 0.210 g |
| Binder polymer (D) [Compound described in Table 1] | 1.05 g |
| Polymerizable compound (C) [Compound described in Table 1] | 1.00 g |
| Fluorine-containing nonionic surfactant (F-177P; made by Dai-Nippon Ink & Chemicals, Inc.) | 0.025 g |
| Ethyl Violet Chloro Anion (made by Aldrich Co.) | 0.035 g |
| Methyl ethyl ketone | 10 g |
| 1-Methoxy-2-propanol | 10 g |
| Methanol | 10 g |

TABLE 1 (A)

| Example | Substrate | Dye (A) | Counter Anion (T$^-$) | Initiator (B) | Polymerizable Compound (C) | Binder (D) | *1 | *2 |
|---|---|---|---|---|---|---|---|---|
| 1 | A | A-44 | — | K-1 | M-2 | B-1 | ≦2% | 5 |
| 2 | A | A-73 | PF$_6^-$ | K-2 | M-2 | B-2 | ≦2% | 6 |

TABLE 1 (A)-continued

| Example | Substrate | Dye (A) | Counter Anion (T⁻) | Initiator (B) | Polymerizable Compound (C) | Binder (D) | *1 | *2 |
|---|---|---|---|---|---|---|---|---|
| 3 | A | A-61 | — | K-1 | M-1 | B-1 | ≦2% | 4 |
| 4 | A | A-51 | — | K-3 | M-1 | B-2 | 4% | 9 |
| 5 | B | A-22 | — | K-1 | M-1 | B-1 | ≦2% | 6 |
| 6 | C | A-27 | CF₃SO₃⁻ | K-2 | M-2 | B-2 | ≦2% | 6 |
| 7 | A | A-65 | BF₄⁻ | K-2 | M-2 | B-1 | ≦2% | 5 |
| 8 | A | A-71 | — | K-3 | M-2 | B-2 | 4% | 9 |
| 9 | A | A-53 | ClO₄⁻ | K-1 | M-1 | B-1 | ≦2% | 5 |
| 10 | A | A-42 | — | K-2 | M-1 | B-1 | ≦2% | 6 |

*1: Developability
*2: Number of insufficient sheets upon initiation of printing

TABLE 1 (B)

| Example | Substrate | Dye (A) | Counter Anion (T⁻) | Initiator (B) | Polymerizable Compound (C) | Binder (D) | *1 | *2 |
|---|---|---|---|---|---|---|---|---|
| 11 | A | A-51 | — | K-3 | M-1 | B-2 | 3% | 7 |
| 12 | A | A-61 | — | K-1 | M-1 | B-1 | ≦2% | 3 |
| 13 | A | A-77 | BF₄⁻ | K-1 | M-1 | B-1 | ≦2% | 3 |
| 14 | A | A-76 | BF₄⁻ | K-2 | M-1 | B-1 | ≦2% | 3 |
| 15 | A | A-78 | 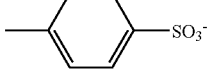 | K-2 | M-2 | B-2 | ≦2% | 4 |
| 16 | A | A-92 | — | K-3 | M-2 | B-2 | 4% | 8 |
| Comparative Example 1 | A | H-1 | — | K-2 | M-1 | B-1 | 5% | 15 |
| Comparative Example 2 | A | H-2 | — | K-3 | M-2 | B-2 | 6% | 18 |

*1: Developability
*2: Number of insufficient sheets upon initiation of printing The specific dyes (A) of the invention shown in Table 1 are given by reference to the symbols for the formerly illustrated compounds. Also, structures of dyes (H-1) and (H-2) used in Comparative Examples are as follows.

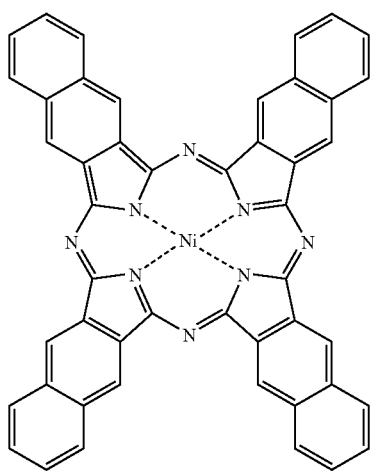

H-1

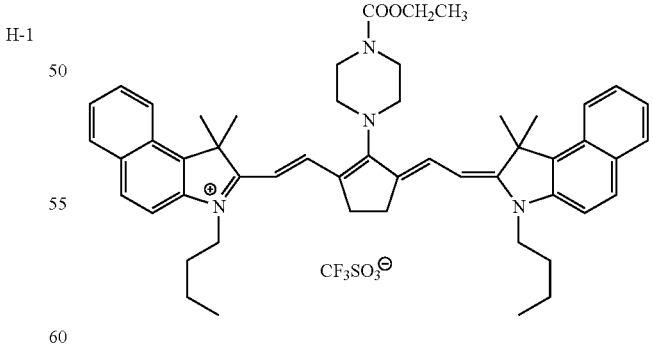

H-2

[Radical Polymerizable Compound (B)]

Structures of the radical polymerization initiators (K-1) to (K-3) shown in Table 1 are shown below.

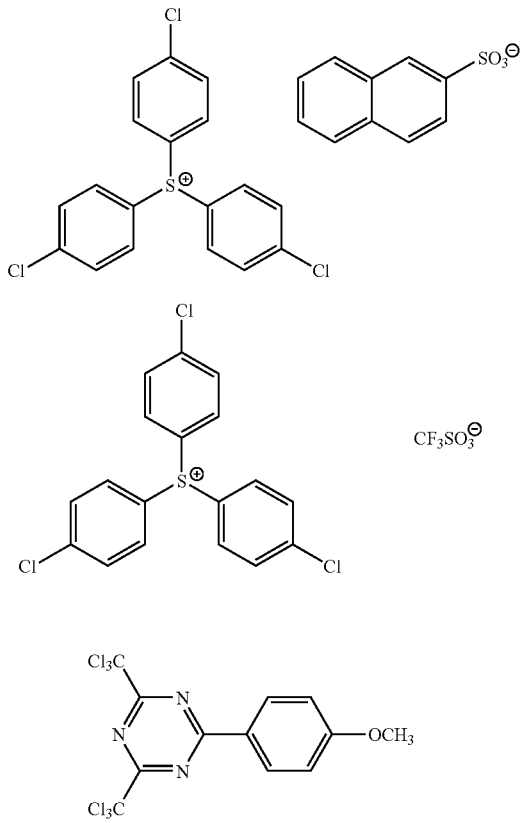

[Polymerizable Compound (C)]
(M-1): NK Ester A-BPE-4 (manufactured by Shin Nakamura Kagaku Kogyo K. K.
(M-2): KAYARAD D-310 (propionic acid-modified dipenta-erythritol pentaacrylate; manufactured by Nihon Kayaku K. K.)

[Binder Polymer in Table 1]
(B-1): High molecular compound of the following structure
(B-2): Allyl methacrylate/methacrylamide/2-methacryloyloxyethylhexahydrophthalic acid (copolymerization molar ratio: 62/22/16; Mw 100,000)

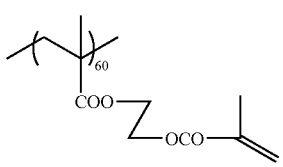

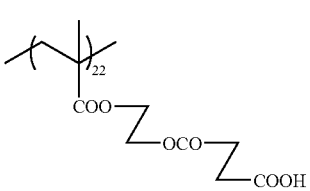

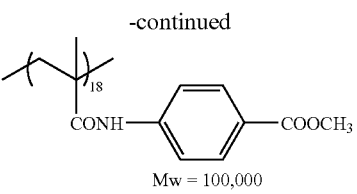

Mw = 100,000

[Formation of Protective Layer]

A 3% by weight aqueous solution of polyvinyl alcohol (saponification degree: 98 mol %; polymerization degree: 550) was coated on the thus formed recording layer in a dry amount of 2 g/m², and dried at 100° C. for 1 minute to provide a protective layer.

Thus, there were obtained lithographic printing plate precursors of Examples 1 to 10 and Comparative Examples 1 and 2.

Example 11

A lithographic printing plate precursor of Example 11 was obtained in the same manner as in Example 4 except for using a coating solution for forming photosensitive layer obtained by adding 0.1 g of a compound (foregoing illustrative compound X-4) having at least one carboxylic acid group and at least one amino or thioether group within the molecule to the photosensitive layer-forming coating solution used in Example 4 for the purpose of improving sensitivity, in place of the photosensitive layer-forming coating solution used in Example 4.

Example 12

A lithographic printing plate precursor of Example 12 was obtained in the same manner as in Example 4 except for using a coating solution for forming photosensitive layer obtained by adding 0.1 g of a compound (foregoing illustrative compound X-5) having at least one carboxylic acid group and at least one amino or thioether group within the molecule to the photosensitive layer-forming coating solution used in Example 3, in place of the photosensitive layer-forming coating solution used in Example 3.

Examples 13 and 14

Lithographic printing plate precursors of Examples 13 and 14 were obtained in the same manner as in Example 12 except for changing the dye and the radical polymerization initiator contained in the photosensitive layer-forming coating solution used in Example 12 to those shown in Table 1.

Examples 15 and 16

Lithographic printing plate precursors of Examples 15 and 16 were obtained in the same manner as in Example 2 except for changing the dye and the radical polymerization initiator contained in the photosensitive layer-forming coating solution used in Example 2 to those shown in Table 1.

(Exposure and Development Processing)

After leaving for 70 hours at a humidity of 75% and a temperature of 40° C., each of the obtained lithographic printing plate precursors of Examples 1 to 16 and Comparative Examples 1 and 2 was exposed by Trensetter 3244 VX (manufactured by Creo Co.) loading a water-cooled 40 W infrared semiconductor laser under the conditions of output of 4 W and outer surface drum rotation speed of 120 rpm. Subsequently, the plate precursor was immersed for 30 seconds in a 30° C. developing solution (DV-2 developing solution made by Fuji Photo Film Co., Ltd./water=¼) to obtain a lithographic printing plate.

(Evaluation on Change with Time)

Degree of color remaining of aluminum substrates in unexposed area of plates not having been subjected to the forced incubation (75% in humidity and 40° C. in temperature; 70 hours) and having been exposed and development processed under the same conditions as mentioned above and degrees of color remaining of aluminum substrate in unexposed plates having been subjected to the forced incubation were measured by means of Spectrodensitometer manufactured by X-Rite Co. in terms of cyan density to determine color-remaining ratio. The difference between before and after the incubation was taken as a base for reduction of developability. A smaller value means that developability is not reduced so much, that change in developability upon incubation is smaller, and that the tested sample has a higher stability.

[Evaluation on the Number of Sheets Printed Before Normal Prints are Obtained]

The obtained (after plate-making) lithographic printing plate was mounted on a spectrum printing machine made by Tokyo Kikai Seisakusho K. K., and printing was conducted using Super Leo Echo Sumi L mate by Toyo Inki Seizo K. K. as an ink, IF-W03 (2.5% solution) made by Fuji Photo Film Co., Ltd. as a dampening water, and Henry Coat O made by Daishowa Seishi K. K. as printing paper. Printing speed was 200 rpm. Printing was initiated so that both a dampening roller and an ink roller came into contact with the plate at the same time, and the number of prints before normal prints were obtained was counted. This number was taken as a base for evaluating initial printing waste before normal printing. A smaller number means that normal prints are obtained more rapidly with less waste images. Thus, samples with smaller number are evaluated to be excellent in the initial printing waste before normal printing.

Results of each evaluation are also shown in Table 1.

It is seen from the results in Table 1 that the lithographic printing plate precursors of the invention (Examples 1 to 16) have better stability of developability with time, suffer less deposition of a dye onto non-image area, and provide normal prints more rapidly in comparison with the lithographic printing plate precursors of Comparative Examples 1 and 2. On the other hand, the lithographic printing plate precursors of Comparative Examples 1 and 2 using dyes not having any acid group and having only insufficient solubility in an alkaline aqueous solution suffered reduction in developability with time and required many sheets of prints before printing normal prints.

Also, it is seen from comparing the results of Example 4 with that of Example 11 or comparing the results of Example 3 with that of Example 12 that addition of a compound having at least one carboxylic acid group and at least one amino or thioether group serves to more improve developability and more reduce the number of waste prints before normal printing.

The present invention is not limited to the specific above-described embodiments. It is contemplated that numerous modifications may be made to the present invention without departing from the spirit and scope of the invention as defined in the following claims.

This application is based on Japanese Patent applications JP 2003-202961, filed Jul. 29, 2003, and JP 2003-375262, filed Nov. 5, 2003, the entire content of which are hereby incorporated by reference.

What is claimed is:

1. A negative-working polymerizable composition comprising:
    a dye which is soluble in an organic solvent and in an alkaline aqueous solution and has an absorption at a range of 700 to 1200 nm, the dye having a methyl ester group, which is a carboxylate ester;
    a radical polymerization initiator;
    a compound having an ethylenically unsaturated bond; and
    a binder polymer which is substantially soluble in the alkaline aqueous solution and insoluble in water,
    wherein the radical polymerization initiator is an onium salt represented by the following formulae (RI-III):

(RI-III)

wherein $R^{31}$, $R^{32}$ and $R^{33}$ each independently represents an aryl group substituted by a halogen atom; and $Z^{31}$ represents a monovalent anion and is a halide ion, a perchlorate ion, a hexafluorophosphate ion, a tetrafluoroborate ion, a sulfonate ion, a sulfinate ion, a thiosulfonate ion or a sulfate ion.

2. The polymerizable composition according to claim 1, wherein the dye has at least one functional group selected from the group consisting of an alkali water-dissociative group and a functional group capable of being decomposed with an alkali water.

3. The polymerizable composition according to claim 1, which comprises the dye in an amount of from 0.01 to 40% by weight based on the total solid components constituting the polymerizable composition.

4. The polymerizable composition according to claim 1, which comprises the radical polymerization initiator in amount of from 0.1 to 50% by weight based on the total solid components constituting the polymerizable composition.

5. The polymerizable composition according to claim 1, which comprises the compound having an ethylenically unsaturated bond in an amount of from 20 to 70% by weight based on the total solid components constituting the polymerizable composition.

6. The polymerizable composition according to claim 1, wherein the binder polymer contains a structural unit having an alkali-soluble group, the structural unit being represented by the following formula (I):

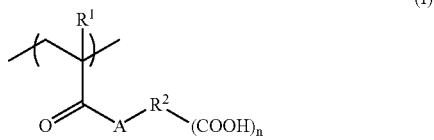

(I)

wherein $R_1$ represents a hydrogen atom or a methyl group, $R_2$ represents a linking group constituted by two or more kinds of atoms selected from the group consisting of a carbon atom, a hydrogen atom, an oxygen atom, a nitrogen atom, a sulfur atom and a halogen atom, with the number of the atoms being from 2 to 82, A represents an oxygen atom or —$NR^3$—, $R^3$ represents a hydrogen atom or a monovalent hydrocarbon group having from 1 to 10 carbon atoms, and n represents an integer of from 1 to 5.

7. The polymerizable composition according to claim 1, wherein the dye is a cyanine dye.

8. An image-forming material comprising a support and a recording layer containing the polymerizable composition according to claim 1.

9. A lithographic printing plate making method comprising:
image-wise exposing a layer comprising the polymerizable composition according to claim 1 on a support with light having a wavelength of 700 to 1200 nm, and removing the unexposed areas of the layer using an alkaline aqueous solution.

10. The polymerizable composition according to claim 1, wherein the dye has a diarylamino group as a substituent.

11. A lithographic printing plate making method comprising:
image-wise exposing a layer comprising a negative-working polymerizable composition on a support with light having a wavelength of 700 to 1200 nm and removing the unexposed areas of the layer using an alkaline aqueous solution,
wherein the polymerizable composition comprises:
a dye having a methyl ester group, which is a carboxylate ester, wherein the dye is soluble in an organic solvent and in an alkaline aqueous solution and has an absorption at a range of 700 to 1200 nm;
a radical polymerization initiator;
a compound having an ethylenically unsaturated bond; and
a binder polymer,
wherein the radical polymerization initiator is an onium salt represented by the following formulae (RI-III):

wherein $R^{31}$, $R^{32}$ and $R_{33}$ each independently represents an aryl group substituted by a halogen atom; and $Z_{31}$ represents a monovalent anion and is a halide ion, a perchlorate ion, a hexafluorophosphate ion, a tetrafluoroborate ion, a sulfonate ion, a sulfinate ion, a thiosulfonate ion or a sulfate ion.

12. A polymerizable composition comprising:
a cyanine dye having a diarylamino group as a substituent and which is soluble in an organic solvent and in an alkaline aqueous solution, and which has an absorption at a range of 700 to 1200 nm;
a radical polymerization initiator;
a compound having an ethylenically unsaturated bond; and
a binder polymer which is substantially soluble in the alkaline aqueous solution and insoluble in water,
wherein the cyanine dye has at least one functional group selected from the group consisting of an alkali water-dissociative group and a functional group capable of being decomposed with an alkali water;

the binder polymer contains a structural unit having an alkali-soluble group, the structural unit being represented by the following formula (I):

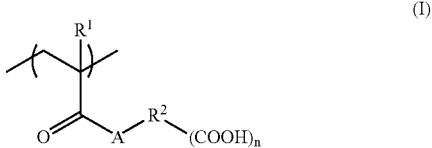

wherein $R_1$ represents a hydrogen atom or a methyl group, $R_2$ represents a linking group constituted by two or more kinds of atoms selected from the group consisting of a carbon atom, a hydrogen atom, an oxygen atom, a nitrogen atom, a sulfur atom and a halogen atom, with the number of the atoms being from 2 to 82, A represents an oxygen atom or —$NR^3$—, $R^3$ represents a hydrogen atom or a monovalent hydrocarbon group having from 1 to 10 carbon atoms, and n represents an integer of from 1 to 5:
and wherein the radical polymerization initiator is an onium salt represented by the following formulae (RI-III):

wherein $R^{31}$, $R^{32}$ and $R_{33}$ each independently represents an aryl group substituted by a halogen atom; and $Z_{31}$ represents a monovalent anion and is a halide ion, a perchlorate ion, a hexafluorophosphate ion, a tetrafluoroborate ion, a sulfonate ion, a sulfinate ion, a thiosulfonate ion or a sulfate ion.

13. The polymerizable composition according to claim 12, which comprises the dye in an amount of from 0.01 to 40% by weight based on the total solid components constituting the polymerizable composition.

14. The polymerizable composition according to claim 12, which comprises the radical polymerization initiator in amount of from 0.1 to 50% by weight based on the total solid components constituting the polymerizable composition.

15. The polymerizable composition according to claim 12, which comprises the compound having an ethylenically unsaturated bond in an amount of from 20 to 70% by weight based on the total solid components constituting the polymerizable composition.

16. An image-forming material comprising a support and a recording layer containing the polymerizable composition according to claim 12.

17. A lithographic printing plate making method comprising:
image-wise exposing a layer comprising the polymerizable composition according to claim 12 on a support with light having a wavelength of 700 to 1200 nm, and removing the unexposed areas of the layer using an alkaline aqueous solution.

18. The polymerizable composition according to claim 12, wherein the anion of the radical polymerization initiator onium salt is a perchlorate ion, a hexafluorophosphate ion, a tetrafluoroborate ion, a sulfonate ion or a sulfinate ion.

* * * * *